(12) United States Patent
Okita et al.

(10) Patent No.: US 8,673,166 B2
(45) Date of Patent: Mar. 18, 2014

(54) PLASMA PROCESSING APPARATUS AND PLASMA PROCESSING METHOD

(75) Inventors: Shogo Okita, Hyogo (JP); Hiromi Asakura, Hyogo (JP); Syouzou Watanabe, Osaka (JP); Toshihiro Wada, Osaka (JP); Mitsuhiro Okune, Osaka (JP); Mitsuru Hiroshima, Osaka (JP)

(73) Assignee: Panasonic Corporation, Osaka (JP)

( * ) Notice: Subject to any disclaimer, the term of this patent is extended or adjusted under 35 U.S.C. 154(b) by 477 days.

(21) Appl. No.: 12/994,940

(22) PCT Filed: May 28, 2009

(86) PCT No.: PCT/JP2009/002353
§ 371 (c)(1),
(2), (4) Date: Nov. 29, 2010

(87) PCT Pub. No.: WO2009/144938
PCT Pub. Date: Dec. 3, 2009

(65) Prior Publication Data
US 2011/0111601 A1   May 12, 2011

(30) Foreign Application Priority Data

May 30, 2008   (JP) .................... 2008-142338
May 30, 2008   (JP) .................... 2008-142341
Aug. 12, 2008  (JP) .................... 2008-207694
Mar. 11, 2009  (JP) .................... 2009-058375

(51) Int. Cl.
*H01L 21/683* (2006.01)

(52) U.S. Cl.
CPC ......... *H01L 21/6831* (2013.01); *H01L 21/6833* (2013.01); *Y10S 414/137* (2013.01)
USPC ............... 216/67; 216/58; 438/706; 438/710; 438/716; 361/234; 118/723 R; 118/728; 156/345.1; 156/345.51; 279/128; 414/937

(58) Field of Classification Search
CPC ............. H01L 21/6831; H01I 21/6833; Y10S 414/137
USPC ...... 216/67, 58; 438/706, 710, 716; 361/234; 118/723 R, 728; 156/345.1, 156/345.51; 279/128
See application file for complete search history.

(56) References Cited

U.S. PATENT DOCUMENTS 5,677,824 A * 10/1997 Harashima et al. ........... 361/234
6,255,223 B1   7/2001 Matsuda et al.
(Continued)

FOREIGN PATENT DOCUMENTS

JP   2-122741   10/1990
JP   5-45641    6/1993
(Continued)

OTHER PUBLICATIONS

International Search Report issued Sep. 1, 2009 in International (PCT) Application No. PCT/JP2009/002353.
(Continued)

*Primary Examiner* — Lan Vinh
*Assistant Examiner* — David Kaufman
(74) *Attorney, Agent, or Firm* — Wenderoth, Lind & Ponack, L.L.P.

(57) ABSTRACT

In a plasma processing apparatus, thrust-up pins are elevated and a thrust-up force is detected when electrostatic attraction for a substrate by a substrate holding device is ceased after completion of plasma processing, the elevation of the thrust-up pins is ceased upon detection of a detection threshold, and a stepped elevating operation in which the elevation and stoppage of the thrust-up pins are repeated a plurality of times are thereafter commenced on condition that the detected thrust-up force falls to or below the detection threshold and that release of the substrate from a placement surface has not been completed. In the stepped elevating operation, operation timing of the thrust-up device is controlled so that the completion of the release of the substrate from the placement surface is detected when the thrust-up pins are stopped after being elevated and so that the stepped elevating operation is continued on condition that the release has not been completed.

16 Claims, 32 Drawing Sheets

(56) References Cited

U.S. PATENT DOCUMENTS

| | | | |
|---|---|---|---|
| 6,305,677 B1 * | 10/2001 | Lenz | 269/13 |
| 6,389,677 B1 * | 5/2002 | Lenz | 29/559 |
| 6,790,375 B1 | 9/2004 | Howald et al. | |
| 6,898,064 B1 * | 5/2005 | Berman et al. | 361/234 |
| 6,938,505 B2 * | 9/2005 | Chen et al. | 73/865.9 |
| 7,292,428 B2 * | 11/2007 | Hanawa et al. | 361/234 |
| 7,751,172 B2 * | 7/2010 | Purohit et al. | 361/234 |
| 8,270,142 B2 * | 9/2012 | Lee et al. | 361/235 |
| 8,363,378 B2 * | 1/2013 | Bluck et al. | 361/234 |
| 2002/0043750 A1 * | 4/2002 | Lenz | 269/13 |
| 2002/0141133 A1 | 10/2002 | Anderson et al. | |
| 2002/0170882 A1 * | 11/2002 | Akiba | 216/67 |
| 2004/0089239 A1 * | 5/2004 | Shang et al. | 118/729 |
| 2006/0238953 A1 * | 10/2006 | Hanawa et al. | 361/234 |
| 2008/0100983 A1 * | 5/2008 | Purohit et al. | 361/234 |
| 2009/0255901 A1 | 10/2009 | Okita et al. | |
| 2010/0142113 A1 * | 6/2010 | Lee et al. | 361/234 |
| 2010/0208409 A1 * | 8/2010 | Bluck et al. | 361/234 |

FOREIGN PATENT DOCUMENTS

| | | |
|---|---|---|
| JP | 7-169825 | 7/1995 |
| JP | 2574066 | 1/1997 |
| JP | 10-209258 | 8/1998 |
| JP | 11-260897 | 9/1999 |
| JP | 2002-526935 | 8/2002 |
| JP | 2002-280438 | 9/2002 |
| JP | 3527823 | 5/2004 |
| JP | 2004/531883 | 10/2004 |
| JP | 2005-217356 | 8/2005 |
| JP | 2006-049391 | 2/2006 |
| JP | 2007-109770 | 4/2007 |
| JP | 2007-109771 | 4/2007 |
| JP | 2009-032790 | 2/2009 |
| WO | 00/19592 | 4/2000 |
| WO | 02/080231 | 10/2002 |

OTHER PUBLICATIONS

English translation of International Preliminary Report on Patentability, issued Jan. 20, 2011, in PCT/JP2009/002353.

Partial English translation of JP 2-122741, Oct. 1990.

Partial English translation of JP5-45641, Jun. 1993.

* cited by examiner

Fig.14
(A)
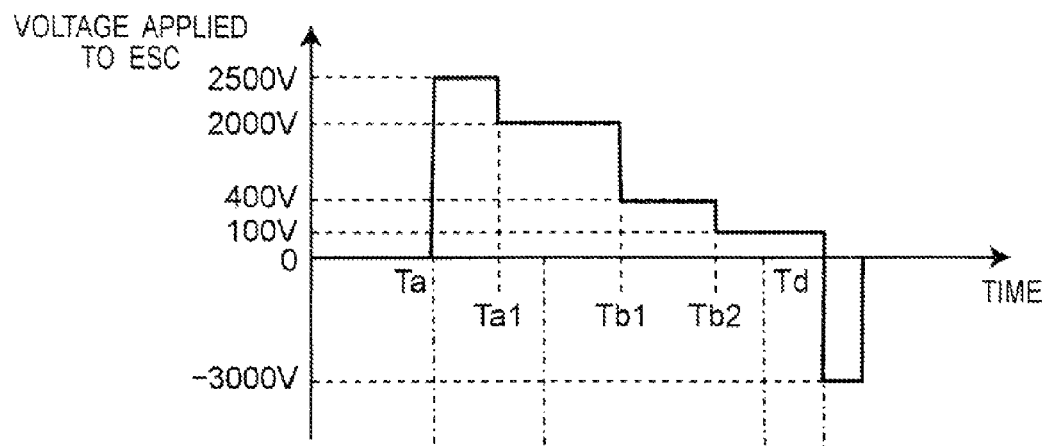
(B)
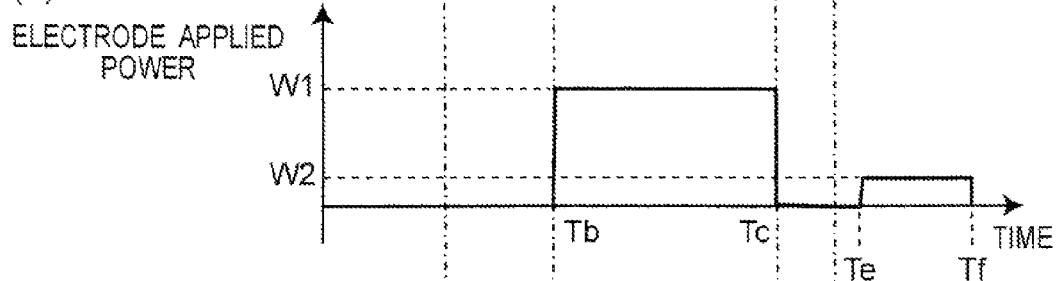
(C)
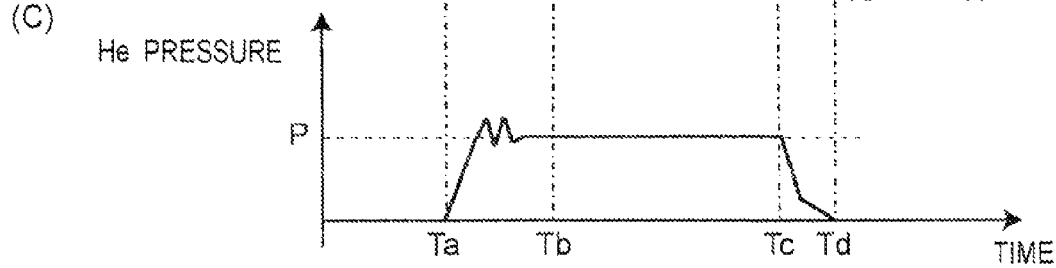

PLASMA PROCESSING APPARATUS AND PLASMA PROCESSING METHOD

TECHNICAL FIELD

The present invention relates to a plasma processing apparatus and a plasma processing method for performing plasma processing for substrates.

BACKGROUND ART

In a plasma processing apparatus for performing plasma processing for wafers such as semiconductor wafers (formed of Si, compounds or the like), the plasma processing such as etching on wafers is conducted with the wafers placed and held on a placement surface of a wafer holding device provided in a processing vessel. In such a wafer holding device, an electrostatic chuck, which is commonly referred to as "ESC," is embedded in the placement surface, and the wafers are held with use of electrostatic attracting forces composed of Coulomb force and/or Johnson-Rahbeck force that are produced by the electrostatic chuck.

In such a conventional wafer holding device, electrostatic attracting forces that are effected by electric charge accumulated on the placement surface and the wafers remain (which forces will be referred to as "residual electrostatic attracting forces" below) even after the electrostatic attraction by the ESC is stopped, and thus various techniques have been proposed for releasing the wafers from the placement surface of the wafer holding device (see Patent Document 1, for instance).

Patent Document 1: JP 2005-217356 A
Patent Document 2: JP 2007-109770 A

DISCLOSURE OF INVENTION

Problems to be Solved by the Invention

In recent years, glass-stuck substrates having semiconductor wafers stuck on glass plates have been used for manufacture of devices typified by image sensors. The residual electrostatic attracting forces in use of substrates having such a glass plate stuck structure, however, are larger than those in use of only simple semiconductor wafers. In methods in which wafers are simply thrust up and released by thrust-up pins as disclosed in Patent Document 1, substrates having great residual electrostatic attracting forces may have damages such as fracture and/or positional deviation may be caused by flap of the substrates or the like when the substrates are released from the placement surface.

Such problems caused by the residual electrostatic attracting forces are not confined to glass-stuck substrates. For instance, the residual electrostatic attraction causes similar problems in techniques in which conveyance, plasma processing and the like of substrates are performed with the substrates held by a tray as disclosed in Patent Document 2.

Therefore, an object of the invention is to resolve the problems and to provide a plasma processing apparatus and a plasma processing method by which substrates can be released from a substrate holding device for holding the substrates by electrostatic attraction, without occurrence of damages, positional deviation and the like of the substrates.

Substrates for the invention are intended to include glass-stuck substrates having wafers stuck on glass plates, and wafers held by a tray, for instance.

Means to Solving the Problem

In order to achieve the object, the invention is configured as follows.

According to a first aspect of the present invention, there is provided a plasma processing apparatus comprising:

a plasma processing vessel in which plasma processing is performed for a substrate, a substrate holding device which is provided in the plasma processing vessel, which comprises a placement surface for the substrate, and which holds the substrate placed on a substrate placement region of the placement surface by electrostatic attraction, a thrust-up device for thrusting up the substrate by moving up and down a plurality of thrust-up pins so as to directly or indirectly lift up at least periphery part of the substrate placed on the placement surface upward from the placement surface, a thrust-up force detector for detecting a thrust-up force produced in thrust-up of the substrate by the plurality of thrust-up pins of the thrust-up device, and a control device for controlling operation timing of the thrust-up device so as to commence a stepped elevating operation in which the elevation and stoppage of the thrust-up pins are repeated a plurality of times and which includes elevating the thrust-up pins of the thrust-up device to lift up the periphery parts of the substrate upward from the substrate placement region of the placement surface, causing the thrust-up force detector to detect the thrust-up force when the electrostatic attraction for the substrate by the substrate holding device is ceased after completion of the plasma processing, ceasing elevation of the thrust-up pins upon detection of a detection threshold, thereafter elevating the thrust-up pins on condition that the thrust-up force detected by the thrust-up force detector falls below the detection threshold, and so as to detect completion of release of the substrate from the substrate placement region of the placement surface on occasion of the stoppage of the thrust-up pins after the elevation in the stepped elevating operation, and so as to continue the stepped elevating operation on condition that the release has not been completed.

According to a second aspect of the present invention, there is provided the plasma processing apparatus according to the first aspect, wherein wafers supported in a tray provided with substrate accommodating holes extending therethrough in a direction of thickness thereof and each having substrate support part for supporting the periphery part of lower surface of the substrate placed in the substrate accommodating hole are placed, together with the tray, on the placement surface of the substrate holding device so that the tray is placed on a tray placement region positioned around the placement surface, so that the wafers are directly held on the substrate placement regions which are formed so as to protrude from the tray placement region in the placement surface, and so that the plasma processing for the wafers as the substrates is performed in the plasma processing vessel, wherein the plurality of thrust-up pins of the thrust-up device are provided in the tray placement region on the placement surface so as to be capable of protruding from the placement surface, and wherein the control device performs the stepped elevating operation so as to thrust up the tray by the plurality of thrust-up pins and so as to lift up the periphery parts of the wafers from the substrate placement regions in the placement surface through medium of the substrate support parts of the tray.

According to a third aspect of the present invention, there is provided the plasma processing apparatus according to the first aspect, wherein a glass-stuck substrate having a wafer stuck on a glass plate is used as the substrate, and the plasma processing for the glass-stuck substrate is performed in the plasma processing vessel.

According to a fourth aspect of the present invention, there is provided the plasma processing apparatus according to the second or third aspect, further comprising an electricity removing plasma producing unit for producing electricity removing plasma for removing residual electrostatic attracting force between the substrate and the placement surface after the electrostatic attraction by the substrate holding device is released, wherein the control device performs an operation of releasing the substrate from at least outer region of the substrate placement region by controlling the elevating operation of the plurality of thrust-up pins in a state in which the electricity removing plasma is produced in the plasma processing vessel by the electricity removing plasma producing unit, and reduces the residual electrostatic attracting force by penetration of the electricity removing plasma between the periphery part of the substrate and periphery region in the substrate placement region.

According to a fifth aspect of the present invention, there is provided the plasma processing apparatus according to the third aspect, wherein the thrust-up device comprises:

a first thrust-up device for integrally moving up and down a plurality of first thrust-up pins, the first thrust-up pins being provided in the outer region in the substrate placement region on the placement surface so as to be capable of protruding from the placement surface, and a second thrust-up device for integrally moving up and down a plurality of second thrust-up pins, the second thrust-up pins being provided in inner region in the substrate placement region on the placement surface so as to be capable of protruding from the placement surface, wherein the control device controls operation timing of the first and second thrust-up devices so as to release the substrate from the outer region in the substrate placement region on the placement surface by integral elevation of the plurality of first thrust-up pins when the electrostatic attraction for the substrate by the substrate holding device is ceased, and so as to thereafter commence the stepped elevating operation by integral elevation of the plurality of second thrust-up pins.

According to a sixth aspect of the present invention, there is provided the plasma processing apparatus according to the third aspect, wherein the substrate holding device comprises:

a placement member having the placement surface on which the substrate are placed, a first bipolar electrode which is placed inside the placement member and which is shaped annularly and like strips, a second bipolar electrode which is placed inside the placement member and the first bipolar electrode concentrically with the first bipolar electrode and which is shaped annularly and like strips, and a power supply for electrostatic attraction for applying voltages to the first and second bipolar electrodes, thereby producing electrostatic attracting forces from the first and second bipolar electrodes for the substrate placed on the placement surface, wherein the substrate is held on the placement surface in a state in which the electrostatic attracting force imparted to the substrate by the second bipolar electrode is at least relatively lower than the electrostatic attracting force imparted to the substrate by the first bipolar electrode in the plasma processing for the substrate.

According to a seventh aspect of the present invention, there is provided a plasma processing apparatus comprising:

a plasma processing vessel in which plasma processing is performed for a glass-stuck substrate having wafer stuck on a glass plate, a substrate holding device which is provided in the plasma processing vessel, which comprises a placement surface for the substrate, and which holds the substrate placed on the placement surface by electrostatic attraction, and a high-frequency voltage applying device for applying a high-frequency voltage to an electrode provided in the plasma processing vessel, the substrate holding device comprising:

an electrostatic chuck for producing electrostatic attracting force by application of the voltage and thereby holding the substrate placed on the placement surface, a power supply for electrostatic chuck for applying the voltage to the electrostatic chuck, and a voltage control device for controlling quantities of application of the voltage from the power supply for electrostatic chuck to the electrostatic chuck and controlling magnitude of the produced electrostatic attracting force, wherein the voltage control device controls the quantities of the application of the voltage from the power supply for electrostatic chuck to the electrostatic chuck so as to decrease the electrostatic attracting force produced by applying the voltage to the electrostatic chuck according to quantities of increase in residual electrostatic attracting force generated in the substrate by applying the high-frequency voltage to the electrode by the high-frequency voltage applying device in the plasma processing.

According to an eighth aspect of the present invention, there is provided the plasma processing apparatus according to the seventh aspect, wherein the voltage control device decreases the quantities of the applied voltage to the electrostatic chuck after the application of the high-frequency voltage to the electrode by the high-frequency voltage applying device is commenced.

According to a ninth aspect of the present invention, there is provided the plasma processing apparatus according to the seventh aspect, further comprising:

a thrust-up device for thrusting up the substrate by moving up and down a plurality of thrust-up pins so as to directly or indirectly lift up at least periphery part of the substrate placed on the placement surface upward from the placement surface, a thrust-up force detector for detecting a thrust-up force produced in thrust-up of the substrate by the plurality of thrust-up pins of the thrust-up device, and a control device for controlling operation timing of the thrust-up device so as to commence a stepped elevating operation in which the elevation and stoppage of the thrust-up pins are repeated a plurality of times and which includes elevating the thrust-up pins of the thrust-up device to lift up the periphery parts of the substrate upward from the substrate placement region of the placement surface, causing the thrust-up force detector to detect the thrust-up force when the electrostatic attraction for the substrate by the substrate holding device is ceased after completion of the plasma processing, ceasing elevation of the thrust-up pins upon detection of a detection threshold, thereafter elevating the thrust-up pins on condition that the thrust-up force detected by the thrust-up force detector falls below the detection threshold, and so as to detect completion of release of the substrate from the substrate placement region of the placement surface on occasion of the stoppage of the thrust-up pins after the elevation in the stepped elevating operation, and so as to continue the stepped elevating operation on condition that the release has not been completed.

According to a tenth aspect of the present invention, there is provided the plasma processing apparatus according to the ninth aspect, wherein the thrust-up device comprises:

a first thrust-up device for integrally moving up and down a plurality of first thrust-up, pins, the first thrust-up pins being provided in the outer region in the substrate placement region on the placement surface so as to be capable of protruding from the placement surface, and a second thrust-up device for integrally moving up and down a plurality of second thrust-up pins, the second thrust-up pins being provided in inner region in the substrate placement region on the placement surface so as to be capable of protruding from the placement surface, wherein the control device controls operation timing of the first and second thrust-up devices so as to release the substrate from the outer region in the substrate placement region on the placement surface by integral elevation of the plurality of first thrust-up pins when the electrostatic attraction for the substrate by the substrate holding device is ceased, and so as to thereafter commence the stepped elevating operation by integral elevation of the plurality of second thrust-up pins.

According to an eleventh aspect of the present invention, there is provided the plasma processing apparatus according to the ninth aspect, wherein the substrate holding device comprises, as the electrostatic chuck, a first bipolar electrode which is shaped annularly and like strips and a second bipolar electrode which is placed inside the first bipolar electrode concentrically with the first bipolar electrode and which is shaped annularly and like strips, wherein the voltage control device controls the quantities of the application of the voltage from the power supply for electrostatic chuck to the first and second bipolar electrodes so that the substrate is held on the placement surface in a state in which the electrostatic attracting force imparted to the substrate by the second bipolar electrode are at least relatively lower than the electrostatic attracting force imparted to the substrate by the first bipolar electrode in the plasma processing for the substrate.

According to a twelfth aspect of the present invention, there is provided a plasma processing method for performing plasma processing for a substrate, the method comprising:

placing the substrate on a placement surface of a substrate holding device and holding the substrate on the placement surface by electrostatic attraction, performing the plasma processing for the substrate held by the electrostatic attraction, ceasing the electrostatic attraction after completion of the plasma processing, thereafter elevating a plurality of thrust-up pins from the placement surface of the substrate holding device to lift up periphery part of the substrate upward from substrate placement region of the placement surface, detecting a thrust-up force, ceasing an elevating operation of the thrust-up pins upon detection of a detection threshold, thereafter commencing a stepped elevating operation in which elevation and stoppage of the thrust-up pins are repeated a plurality of times and in which the elevating operation of the thrust-up pins is resumed on condition that the detected thrust-up force falls below the detection threshold, detecting completion of release of the substrate from the substrate placement regions of the placement surface when the elevating operation of the thrust-up pins is ceased in the stepped elevating operation, continuing the stepped elevating operation on condition that the release has not been completed, and thereby releasing the substrate from the substrate placement region of the placement surface.

According to a 13th aspect of the present invention, there is provided a plasma processing method for a glass-stuck substrate having a wafer stuck on a glass plate, the method comprising:

placing the substrate on a placement surface of a substrate holding device, holding the substrate by an electrostatic attracting force produced by application of voltage to an electrostatic chuck embedded in the placement surface, and thereafter performing plasma processing for the held substrate by commencing application of high-frequency voltage to an electrode, and continuing holding of the substrate by decreasing quantities of application of the voltage to the electrostatic chuck so as to decrease the electrostatic attracting force produced by the voltage application to the electrostatic chuck according to quantities of increase in residual electrostatic attracting force generated for the substrate by the application of the high-frequency voltage.

Effect of the Invention

According to one aspect of the invention, the configuration is employed in which the control device provided in the plasma processing apparatus moves up the thrust-up pins of the thrust-up device and causes the thrust-up force detectors to detect the thrust-up forces when the electrostatic attraction for the substrates by the substrate holding device is ceased after the completion of the plasma processing, ceases the elevation of the thrust-up pins upon detection of the detection threshold, and commences a stepped elevating operation in which the elevation and stoppage of the thrust-up pins are repeated a plurality of times, on condition that the thrust-up forces detected by the thrust-up force detectors thereafter fall to or below the detection threshold and that the release of the substrates from the placement surface has not been completed. The further configuration is also employed in which operation timing of the thrust-up device is controlled so that the control device detects the completion of the release of the substrates from the placement surface, when the thrust-up pins are stopped after being elevated in the stepped elevating operation, and continues the stepped elevating operation on condition that the release has not been completed. The release of the substrates from the placement surface can gradually be promoted without occurrence of damages and the like in the substrates and the smooth operation of releasing the substrates can be attained, by the stepped elevating operation in which the elevation and stoppage of the thrust-up pins are repeated a plurality of times on condition that the release of the substrates from the placement surface has not been completed after performance of the first thrust-up operation by the thrust-up pins. Such an operation of thrusting up the substrates by the plurality of thrust-up ping is not confined to direct performance for the substrates but may indirectly be for the substrates.

According to another aspect of the invention, the plurality of first thrust-up pins provided in the outer regions in the substrate placement regions on the placement surface and the plurality of second thrust-up pins provided in the inner regions therein are used, the plurality of first thrust-up pins can initially be elevated to release the substrates from the outer regions in the substrate placement regions on the placement surface when the electrostatic attraction for the substrates by the substrate holding device is ceased, and the plurality of second thrust-up pins can thereafter be elevated to release the substrates from the inner regions in the substrate placement regions. That is, the timing of the thrust-up operation for the outer regions of the substrates by the plurality of first thrust-up pins can be made different from the timing of the thrust-up operation for the inner regions of the substrates by the plurality of second thrust-up pins, and thus the operation of releasing the substrates can be performed gradually and stepwise from the outside toward the inside, e.g., as the initial release of the outer regions of the substrates from the placement surface and the subsequent release of the inner regions. Accordingly, the substrates with the glass-stuck structure that tend to have the residual electrostatic attracting forces higher than those of simple wafers can be released from the placement surface without occurrence of damages, positional deviation and the like therein.

According to another aspect of the invention, the holding of the substrates is continued and the plasma processing for the substrates is performed while the electrostatic attracting forces produced by the voltage application to the electrostatic chuck are decreased according to the quantities of increase in the residual electrostatic attracting forces produced in the substrates in the plasma processing, so that the magnitude of the residual electrostatic attracting forces that remain in the substrates, after the completion of the plasma processing can be decreased. When the substrates are thereafter released from the placement surface, accordingly, the releasing operation can smoothly be performed without causing damages or the like in the substrates.

According to another aspect of the invention, the configuration including the first bipolar electrodes shaped annularly and like strips and the second bipolar electrodes that are provided concentrically with the first bipolar electrodes inside the first bipolar electrodes and that are shaped annularly and like strips is employed in the substrate holding device of the plasma processing apparatus. In the plasma processing for the substrates in the plasma processing apparatus, the substrates are held on the placement surface under a condition in which the electrostatic attracting forces imparted to the substrates by the second bipolar electrodes are set to be at least relatively lower than the electrostatic attracting forces imparted to the substrates by the first bipolar electrodes. Therefore, the residual electrostatic attracting forces in the center vicinity regions that are inside the outer side of the substrates are reduced in comparison with those in the outer side (the periphery vicinity regions) of the substrates. On condition that the release of the substrates is performed by the integral elevation of the plurality of thrust-up pins from the substrate placement surface against the edge parts of the substrates and/or vicinity thereof, consequently, releasability of the center vicinity regions of the substrates from the placement surface is improved, and the holding of the substrates by electrostatic attraction and the plasma processing can be performed without damages, positional deviation and the like due to the release on occasion of the release of the substrates from the placement surface.

BRIEF DESCRIPTION OF DRAWINGS

These aspects and features of the present invention will become clear from the following description taken in conjunction with the preferred embodiments thereof with reference to the accompanying drawings, in which:

FIG. 12(A) is a graph illustrating voltages applied to an ESC; FIG. 12(B) is a graph illustrating electrostatic attracting forces obtained from applied voltages in the ESC, FIG. 12(C) is a graph illustrating electrostatic attracting forces (residual electrostatic attracting forces) produced by electrical charge in a substrate; FIG. 12(D) is a graph illustrating total attracting forces ((B)+(C));

FIG. 14(A) is a graph illustrating change in the voltage applied to the ESC in plasma processing in accordance with the second embodiment; FIG. 14(B) is a graph illustrating change in power applied to electrodes therein, FIG. 14(C) is a graph illustrating supply conditions of He gas therein;

FIG. 30(A) is a graph illustrating voltages applied to a first bipolar electrode; FIG. 30(B) is a graph illustrating voltages applied to a second bipolar electrode; FIG. 30(C) is a graph illustrating power applied to electrode(s) (an upper electrode and/or a lower electrode); FIG. 30(D) is a graph illustrating electrostatic attracting forces obtained from charge in a substrate caused by the voltages applied to the first bipolar electrode and the power applied to the electrode(s); FIG. 30(E) is a graph illustrating electrostatic attracting forces obtained from charge in the substrate caused by the voltages applied to the second bipolar electrode and the power applied to the electrode(s);

BEST MODE FOR CARRYING OUT THE INVENTION

Figure 1:
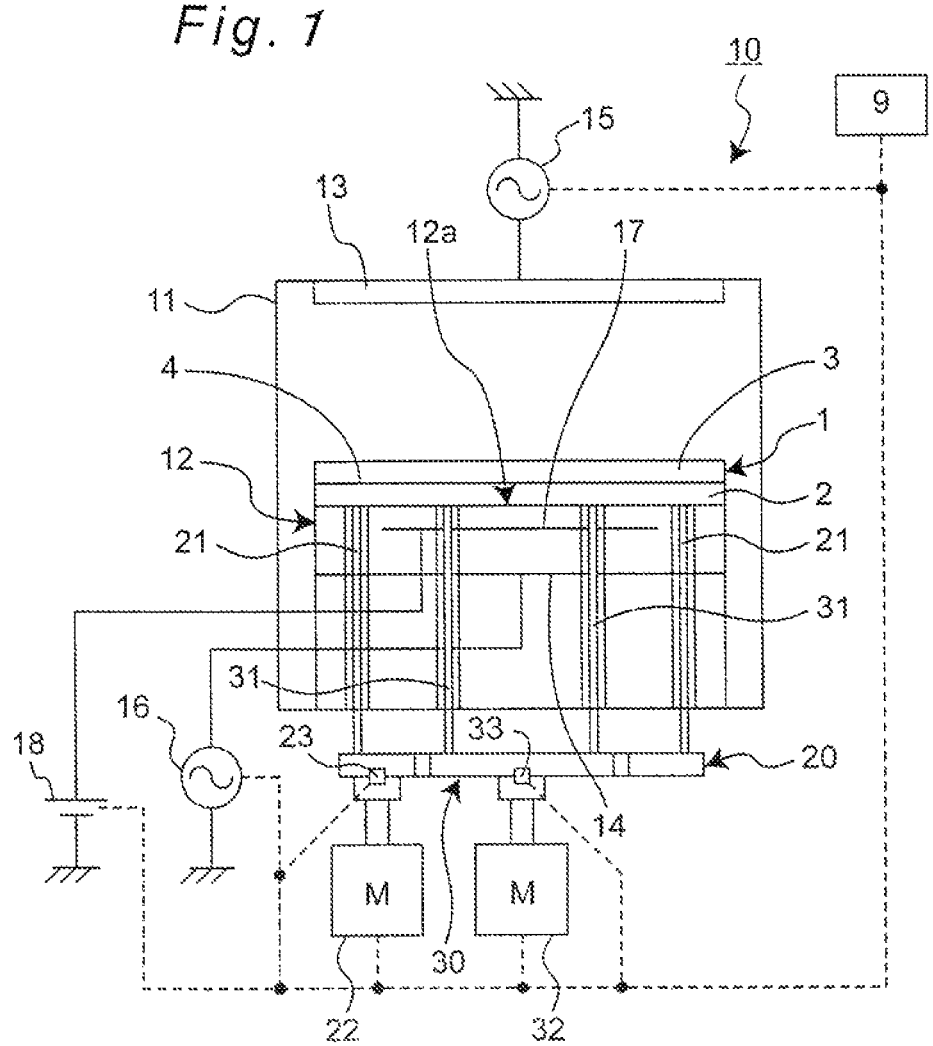
FIG. 1 is a schematic diagram of a plasma processing apparatus in accordance with a first embodiment of the invention.

Before the description of the present invention proceeds, it is to be noted that like parts are designated by like reference numerals throughout the accompanying drawings.

Hereinbelow, embodiments of the present invention will be described in detail with reference to the accompanying drawings.

First Embodiment

FIG. 1 shows a schematic diagram illustrating main components of a plasma processing apparatus 10 in accordance with a first embodiment of the invention. In the plasma processing apparatus 10 of the first embodiment, a glass-stuck substrate 1 (which will be referred to as "substrate 1") having a glass-stuck structure in which a wafer such as a silicon wafer 3 (semiconductor wafer formed of Si and compounds thereof), as an example of semiconductor wafer, is stuck on a glass plate 2 of insulating material through paste material 4 is handled as an object of plasma processing. Herein is used the silicon wafer 3 having a thickness, e.g., of 25 to 400 μm, especially of 50 to 200 μm. There is used the glass plate 2 having a thickness, e.g., of 300 to 500 μm, especially on the order, of 400 μm. As the paste material 4, resist, tackiness agent or the like is used, for instance. Devices such as image sensors are manufactured by performance of specified plasma processing for the silicon wafer 3 of such a substrate 1. The substrate 1 has a shape like a disc with a diameter of 200 mm, for instance.

As shown in FIG. 1, the plasma processing apparatus 10 has a plasma processing vessel 11 in which specified plasma processing is performed in an inner space (plasma processing space) therein, and a substrate holding device 12 that is provided in the plasma processing vessel 11, that has a placement surface 12a on which a side of the substrate 1 having the glass plate 2 is placed, and that holds the substrate 1, placed on the placement surface 12a, by electrostatic attraction. As shown in FIG. 1, furthermore, an upper electrode 13 is provided in upper part of inside of the plasma processing vessel 11 and a lower electrode 14 is provided in the substrate holding device 12. A high-frequency power supply 15 for upper electrode (as an example of high-frequency voltage applying device) is connected to the upper electrode 13 and a high-frequency power supply 16 for lower electrode is connected to the lower electrode 14. An ESC 17 as an example of electrostatic chuck for effecting electrostatic attraction is embedded in the placement surface 12a of the substrate holding device 12, and a power supply 18 for ESC (as an example of power supply for electrostatic chuck) is connected to the ESC 17.

In the plasma processing apparatus 10 having such a configuration, the substrate 1 is placed on the placement surface 12a of the substrate holding device 12 so as to be held by electrostatic attraction by the ESC 17 and, after that, the inside of the plasma processing vessel 11 is supplied and filled with specified plasma processing gas while a pressure therein is kept at a specified value. Subsequently, a voltage is applied to the upper electrode 13 by the high-frequency power supply 15 for upper electrode and a voltage is applied to the lower electrode 14 by the high-frequency power supply 16 for lower electrode, so that plasma is produced and so that the plasma processing is performed for the silicon wafer 3 of the substrate 1. Upon completion of the plasma processing, the application of the voltages by the high-frequency power supplies 15, 16 is stopped and gas is exhausted from inside of the plasma processing vessel 11, so that the plasma processing of the substrate 1 is completed. Upon completion of the plasma processing, the supply of the power to the ESC 17 by the power supply 18 for ESC is stopped.

Figure 2:
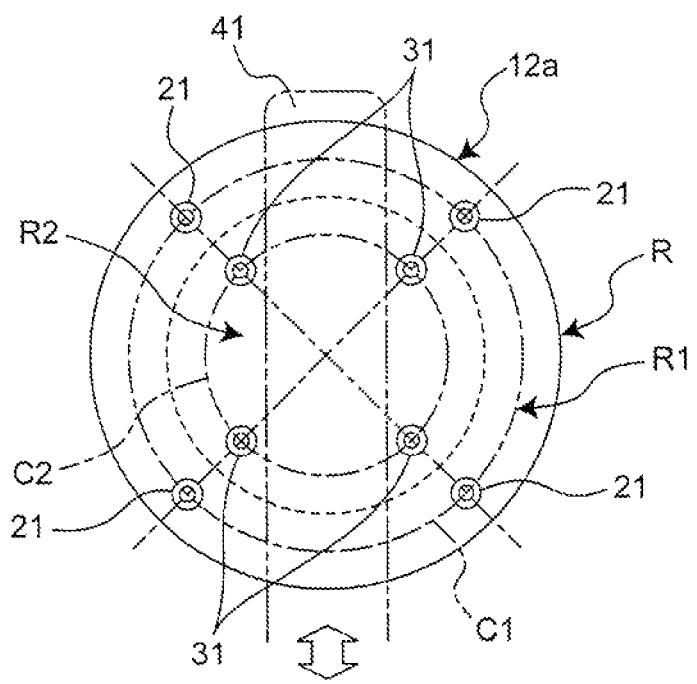
FIG. 2 is a schematic plan view of a placement surface of the plasma processing apparatus in accordance with the first embodiment.

Subsequently will be described a configuration in the plasma processing apparatus 10 that is provided for releasing the substrate 1, having undergone completion of the plasma processing, from the placement surface 12a against a residual electrostatic attracting force existing between the placement surface 12a and the substrate 1. FIG. 2 shows a schematic plan view of the placement surface 12a of the substrate holding device 12.

As shown in FIGS. 1 and 2, the substrate holding device 12 has a first thrust-up device 20 for integrally moving up and down a plurality of first thrust-up pins 21, provided in an outer region R1 in a substrate placement region R on the placement surface 12a, from the placement surface 12a so as to protrude or retract the pins from or into the placement surface 12a, and a second thrust-up device 30 for integrally moving up and down a plurality of second thrust-up pins 31, provided in an inner region R2 in the substrate placement region R on the placement surface 12a, from the placement surface 12a so as to protrude or retract the pins from or into the placement surface 12a. The first thrust-up device 20 has a first up-and-down device 22 for integrally moving up and down the first thrust-up pins 21, and the second thrust-up device 30 has a second up-and-down device 32 for integrally moving up and down the second thrust-up pins 31. The first up-and-down device 22 and the second up-and-down device 32 can be operated independently of each other.

Though the whole placement surface 12a forms the substrate placement region R for the substrate 1 in the plasma processing apparatus 10 of the first embodiment, as shown in FIG. 2, a part of the placement surface 12a may be formed as the substrate placement region R, alternatively, or the substrate placement region R may be formed so as to be larger than the placement surface 12a. The substrate placement region R smaller than the placement surface 12a improves uniformity of process characteristics (such as etching rate) in a periphery part of the substrate 1, and the electrode of the ESC 17 in the placement surface 12a which electrode is larger than the substrate placement region R may be exposed to plasma and thus may have a shortened life. By contrast, the substrate placement region R larger than the placement surface 12a makes the electrode of the ESC 17 smaller than the periphery of the substrate 1, resulting in prevention of the problem of the expose to plasma, and the electrode of the ESC 17 is preferably made slightly smaller than the periphery of the substrate 1 by about 0.5 to 1 mm in order to ensure the uniformity of the process characteristics. The electrode of the ESC 17 too smaller than the periphery of the substrate 1, however, may make the process characteristics heterogenous in the periphery part of the substrate 1. The outer region R1 in the substrate placement region R is a region that is in the substrate placement region R and that includes an edge part of the substrate 1 placed on the placement surface 12a and vicinity thereof, and/or a region that is positioned on the periphery side of a half of a radius of the substrate 1 placed on the placement surface 12a, and the inner region R2 in the substrate placement region R is a region that is relatively inside the region that includes the edge part of the outer region R1 in the substrate placement region R and vicinity thereof.

As shown in FIG. 2, for instance, four first thrust-up pins 21 are provided at uniform intervals on a first concentric circle C1 having a center on a center of the placement surface 12a, and four second thrust-up pins 31 are provided at uniform intervals on a second concentric circle C2 having a center on the center of the placement surface 12a. A diameter of the first concentric circle C1 is set so as to be larger than a diameter of the second concentric circle C2.

As shown in FIG. 1, the first thrust-up device 20 has a first load cell 23 as an example of thrust-up force detector for detecting a thrust-up force (or a thrust-up reaction force) exerted on the first thrust-up pins 21 by the first up-and-down device 22 in the thrust-up of the substrate 1. Similarly, the second thrust-up device 30 has a second load cell 33 as an example of thrust-up force detector for detecting a thrust-up force (or a thrust-up reaction force) exerted on the second thrust-up pins 31 by the second up-and-down device 32 in the thrust-up of the substrate 1.

As shown in FIG. 1, the plasma processing apparatus 10 has a control device 9 for controlling an operation of moving up and down the first thrust-up pins 21 by the first up-and-down device 22, an operation of moving up and down the second thrust-up pins 31 by the second up-and-down device 32, an operation of detecting the thrust-up force by the first load cell 23, an operation of detecting the thrust-up force by the second load cell 33, an operation of applying a voltage by the high-frequency power supply 15 for upper electrode, an operation of applying a voltage by the high-frequency power supply 16 for lower electrode, and an operation of supplying power by the power supply 18 for ESC, while associating the operations with one another. The control device 9 is further capable of detecting a quantity of thrust-up (stroke) of the first thrust-up pins 21 from the placement surface 12a and a quantity of thrust-up (stroke) of the second thrust-up pins 31 from the placement surface 12a, through the first up-and-down device 22 and the second up-and-down device 32.

Figure 3:
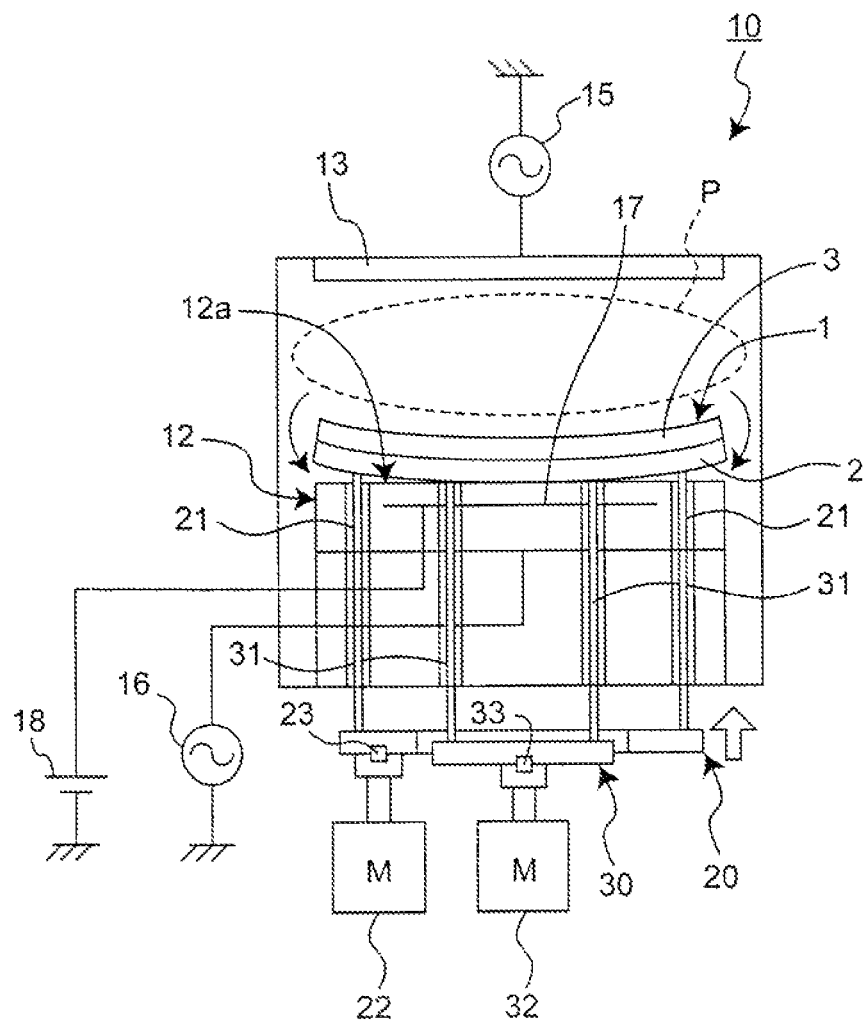
FIG. 3 is a schematic illustration of an operation of releasing a substrate (thrust-up operation by first thrust-up pins) in the plasma processing apparatus of the first embodiment.
Figure 4:
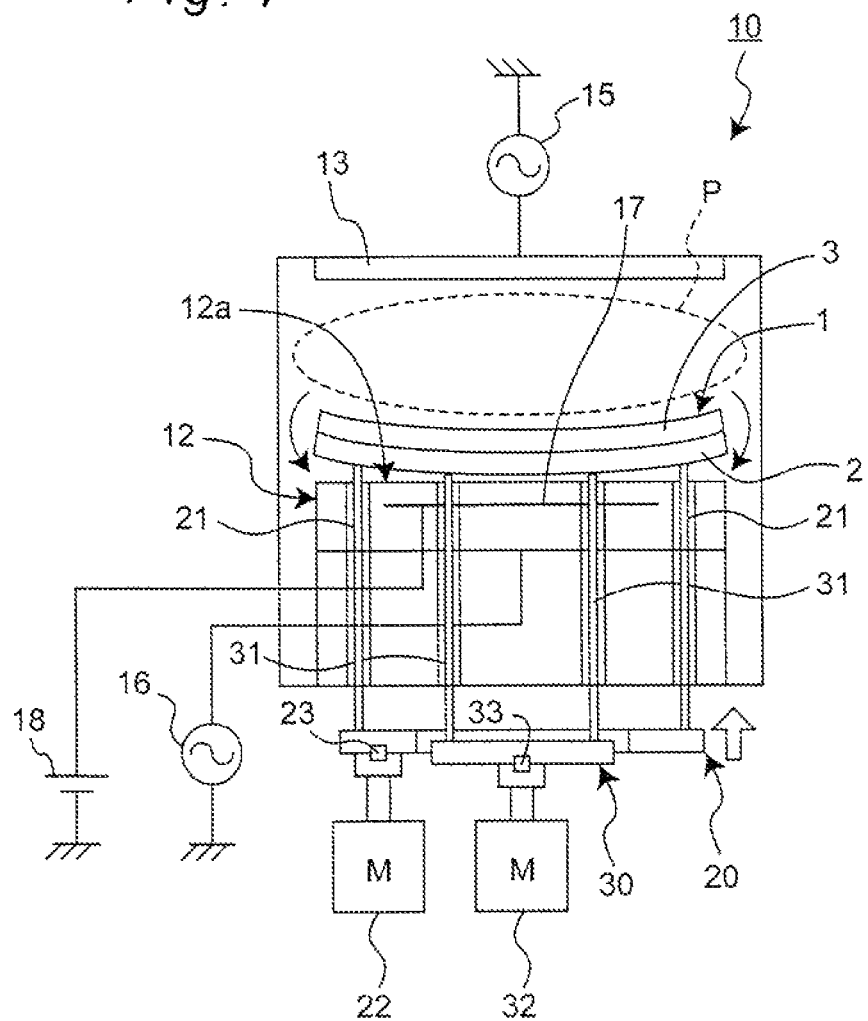
FIG. 4 is a schematic illustration of the operation of releasing the substrate (thrust-up operation by the first and second thrust-up pins) in the plasma processing apparatus of the first embodiment.
Figure 5:
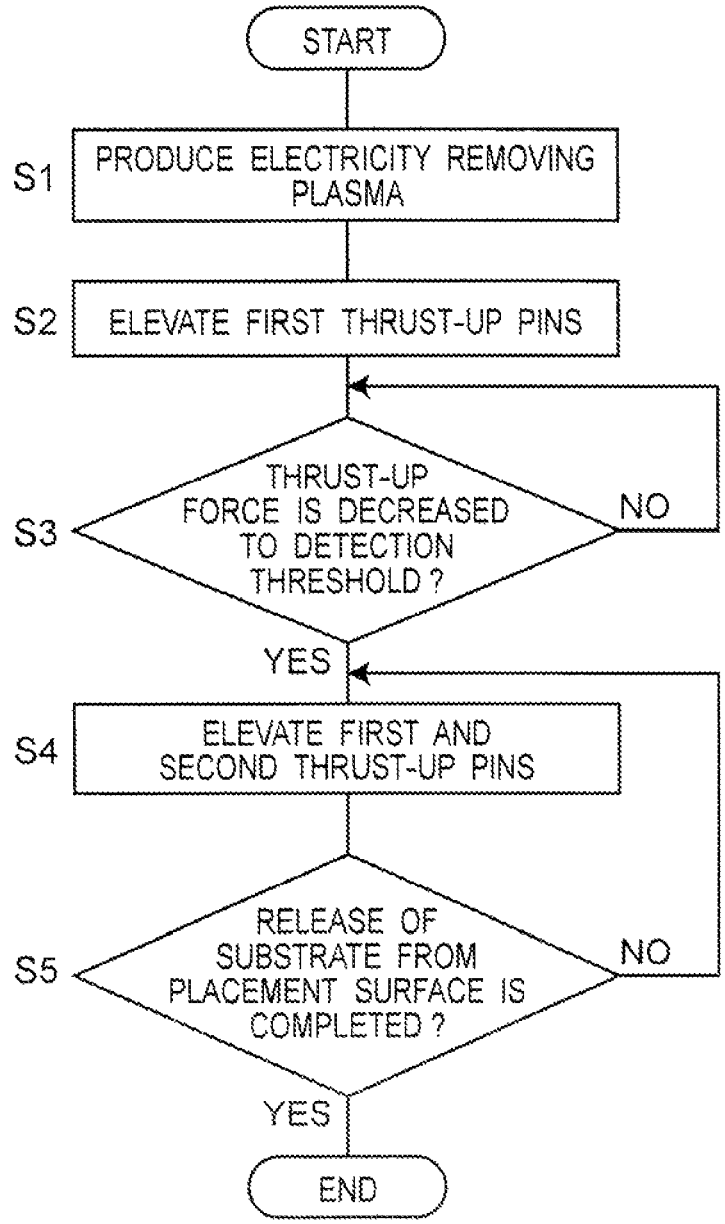
FIG. 5 is a flow chart of the operation of releasing the substrate in accordance with the first embodiment.
Figure 6:
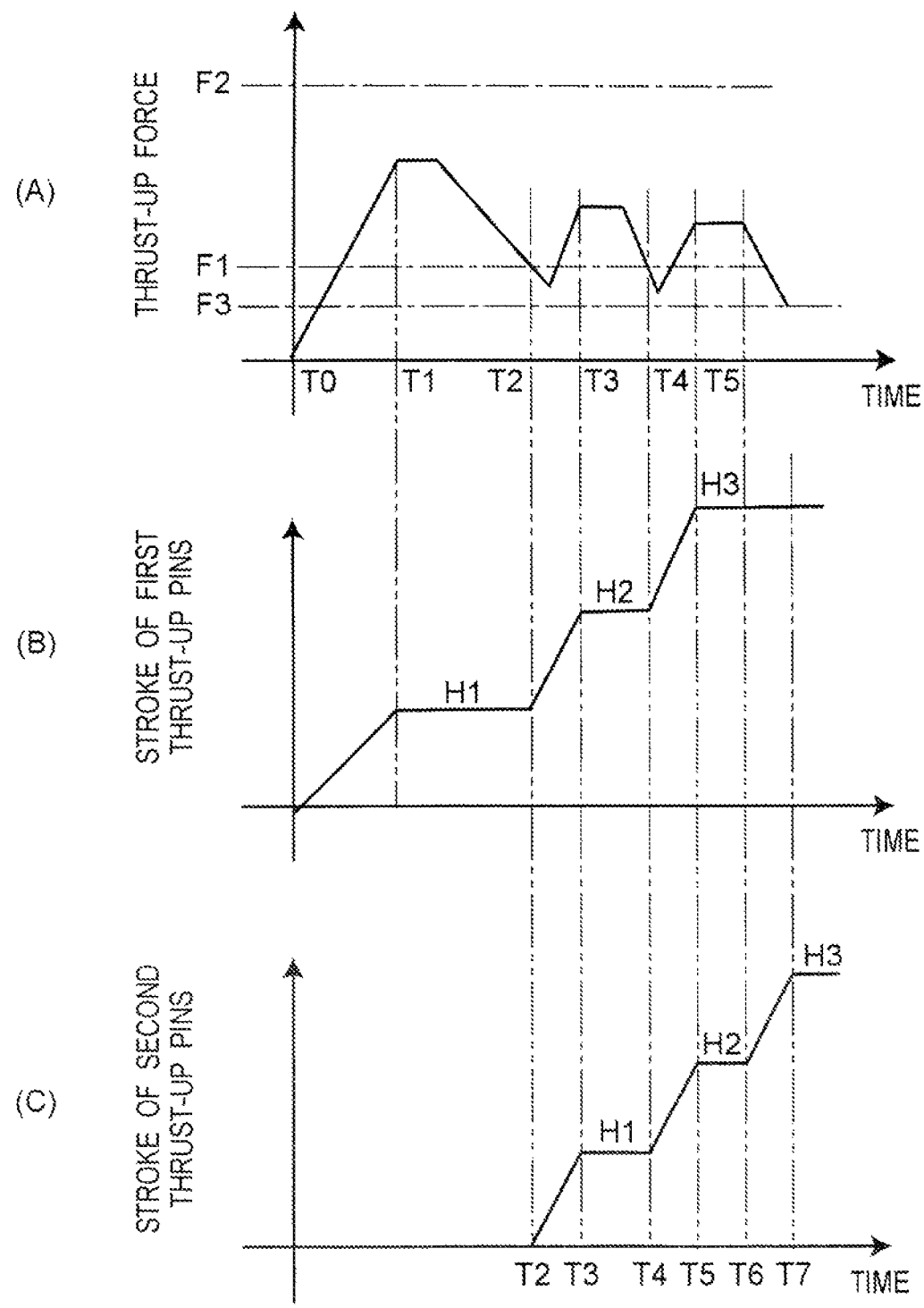
FIG. 6(A) is a graph illustrating change in thrust-up force in the substrate releasing operation of FIG. 5.
FIG. 6(B) is a graph illustrating change in stroke of the first thrust-up pins therein.
FIG. 6(C) is a graph illustrating change in stroke of the second thrust-up pins therein.
Figure 7A:
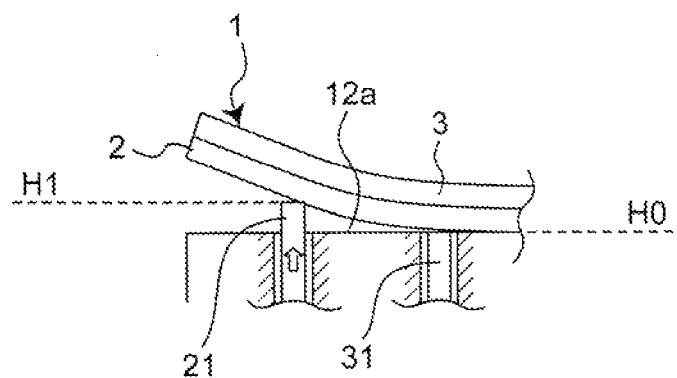
FIG. 7A is a schematic enlarged fragmentary view of a portion around thrust-up pins in the thrust-up operation of FIG. 3.
Figure 7B:
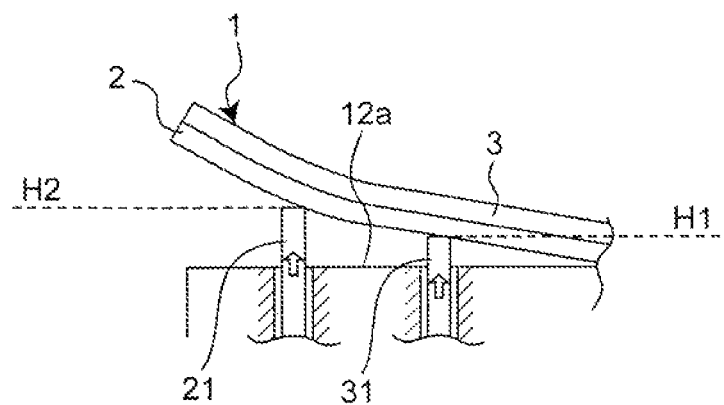
FIG. 7B is a schematic enlarged fragmentary view of the portion around the thrust-up pins in the thrust-up operation of FIG. 4.

Hereinbelow will be described an operation for releasing the substrate 1, having undergone the completion of the plasma processing, from the placement surface 12a in the plasma processing apparatus 10 having such a configuration. For description of that, FIGS. 3 and 4 show schematic illustrations for the operation of the plasma processing apparatus 10, FIG. 5 shows a flow chart of procedures of the release operation, and FIG. 6 show graphs illustrating temporal change in the thrust-up forces (reaction forces) and the thrust-up strokes of the first thrust-up pins 21 and the second thrust-up pins 31. FIGS. 7A and 7B show schematic enlarged fragmentary views of a portion in vicinity of the thrust-up pins in thrust-up condition.

In the inner space of the plasma processing vessel 11, initially, electricity removing plasma is produced that is comparatively weak plasma for removing the residual electrostatic attracting force existing between the substrate 1 and the placement surface 12a (step S1 in the flow chart of FIG. 5).

For instance, the electricity removing plasma P is produced by application of a voltage to the upper electrode 13 and/or the lower electrode 14 in a condition in which the inner space of the plasma processing vessel 11 has been supplied with inert gas (such as Ar, $N_2$ and $O_2$) that prevents progression of the plasma processing (such as etching) on the silicon wafer 3. The substrate 1, however, is then held on the placement surface 12a by the residual electrostatic attracting force and thus the electricity removing plasma P cannot enter between the substrate 1 and the placement surface 12a in such a condition. In the first embodiment, the upper electrode 13, the high-frequency power supply 15 for upper electrode, the lower electrode 14, the high-frequency power supply 16 for lower electrode, and a gas supplying device not shown form an example of an electricity removing plasma producing unit.

In a time segment T0-T1 shown in FIG. 6(A), subsequently, the eight first thrust-up pins 21 are integrally elevated by the first up-and-down device 22 of the first thrust-up device 20 so as to be protruded upward from the placement surface 12a (step S2). As shown in FIG. 3, more particularly in FIG. 7A, consequently, an outer portion of the substrate 1 is thrust up by the first thrust-up pins 21 so that the substrate 1 is partially released from the outer region R1 in the substrate placement region R of the placement surface 12a.

As shown in the graph of FIG. 6(A) Illustrating the change in the thrust-up force and the graph of FIG. 6(B) illustrating the change in the stroke of the first thrust-up pins 21, the thrust-up (elevating) operation of the eight first thrust-up pins 21 by the first up-and-down device 22 is performed while the thrust-up force detected by the first load cell 23 is referred to. Specifically, the thrust-up operation is performed while the thrust-up stroke of the first thrust-up pins 21 is adjusted so that the load comes into a load range that does not exceed a limit load F2 for prevention of damages such as fracture and positional deviation such as flap in the substrate 1 and that exceeds a detection threshold F1 being a reference load for commencement of the second thrust-up operation. As a result, extremities of the first thrust-up pins 21 are positioned at a stroke (or height) H1.

Thus the edge part of the substrate 1 is released from the placement surface 12a so that the electricity removing plasma P produced in the inner space of the plasma processing vessel 11 can enter between the substrate 1 and the placement surface 12a. In a time segment T1-T2, consequently, the residual electrostatic attracting force existing between the substrate 1 and the placement surface 12a is reduced on the surface brought into contact with the electricity removing plasma P, so that the release (exfoliation) of the substrate 1 from the placement surface 12a is promoted so as to spread from outside toward inside of the substrate 1.

In the time segment T1-T2, the detection of the thrust-up force by the first load cell 23 is continued, and whether the detected thrust-up force is decreased to the detection threshold F1 is also detected (step S3).

Once the first load cell 23 detects the decrease in the thrust-up force of the first thrust-up pins 21 to the detection threshold F1 at the time T2, the first thrust-up device 20 and/or the second thrust-up device 30 commence a thrust-up operation (step S4). In a time segment T2-T3 shown in FIG. 6(A), for instance, specifically, the four first thrust-up pins 21 are integrally elevated further by the first up-and-down device 22 of the first thrust-up device 20, and the four second thrust-up pins 31 are integrally elevated by the second up-and-down device 32 of the second thrust-up device 30 so as to be protruded upward from the placement surface 12a. By the thrust-up operation, the extremities of the first thrust-up pins 21 are positioned at a stroke H2, and extremities of the second thrust-up pins 31 are positioned at the stroke H1.

By the thrust-up operation by the second thrust-up pins 31 in addition to the thrust-up operation by the first thrust-up pins 21, the substrate 1 can completely or partially be released from the placement surface 12a in the inner region R2 in the substrate placement region R on the placement surface 12a, as shown in FIG. 4, more particularly in FIG. 7B. In a state of the partial release, the residual electrostatic attracting force can be reduced by further penetration of the electricity removing plasma P between the substrate 1 and the placement surface 12a, so that the release of the substrate 1 is further promoted.

On condition that the thrust-up forces of the thrust-up pins 21, 31 are made too close to the limit load F2 with the release of the substrate 1 from the placement surface 12a in the second thrust-up operation, only the second thrust-up pins 31 may be thrust up without further thrust up of the first thrust-up pins 21 so that the extremities of the second thrust-up pins 31 are positioned at the stroke H1, i.e., in the same thrust-up height position as that of the first thrust-up pins 21, instead of the thrust-up operation by the second thrust-up pins 31 in addition to the thrust-up operation by the first thrust-up pins 21. This further reduces stresses produced in the substrate 1 by the thrust-up operation from the placement surface 12a.

On condition that the substrate 1 is not completely released from the placement surface 12a by the second thrust-up operation, thrust-up operation(s) by the first thrust-up pins 21 and/or the second thrust-up pins 31 are performed again in a time segment T4-T5 after the thrust-up force of the first thrust-up pins 21 is decreased to the detection threshold F1. Consequently, the extremities of the first thrust-up pins 21 are positioned at a stroke H3, and the extremities of the second thrust-up pins 31 are positioned at the stroke H2. When the thrust-up operation(s) are commenced at the time T4, it is preferably verified by the second load cell 33 that the thrust-up force of the second thrust-up pins 31 is decreased to the detection threshold F1. There may be employed different values as the detection threshold for the first thrust-up pins 21 and the detection threshold for the second thrust-up pins 31.

On condition that the substrate 1 is still not completely released from the placement surface 12a by the third thrust-up operation, a thrust-up operation by the second thrust-up pins 31 is performed in a time segment T6-T7 after the thrust-up force of the second thrust-up pins is decreased to the detection threshold F1, for instance. Consequently, the extremities of the first thrust-up pins 21 and the second thrust-up pins 31 are positioned at the stroke H3, and the release of the substrate 1 from the placement surface 12a is promoted or the substrate 1 is completely released from the placement surface 12a.

Once it is verified that the substrate 1 is completely released from the placement surface 12a (step S5), the thrust-up operations for the release of the substrate 1 from the placement surface 12a are completed. The complete release of the substrate 1 from the placement surface 12a can be verified by detection of a fact that the thrust-up forces detected by the first load cell 23 and/or the second load cell 33 make a load corresponding to a self-weight of the substrate 1 or are not larger than a release threshold F3 indicating the release of the substrate 1 from the placement surface 12a, and/or by a fact that the strokes of the first thrust-up pins 21 and the second thrust-up pins 31 reach a specified stroke, or the like, for instance.

Hereinbelow, the releasing method that is disclosed in Patent Document 1 and that is tentatively applied to the glass-stuck substrate 1 will be described with reference to schematic diagrams of FIGS. 15 and 16, as an example of a releasing method in accordance with a comparative example contrasted with the releasing method for the substrate 1 in the plasma processing apparatus 10 of the first embodiment.

Figure 15:
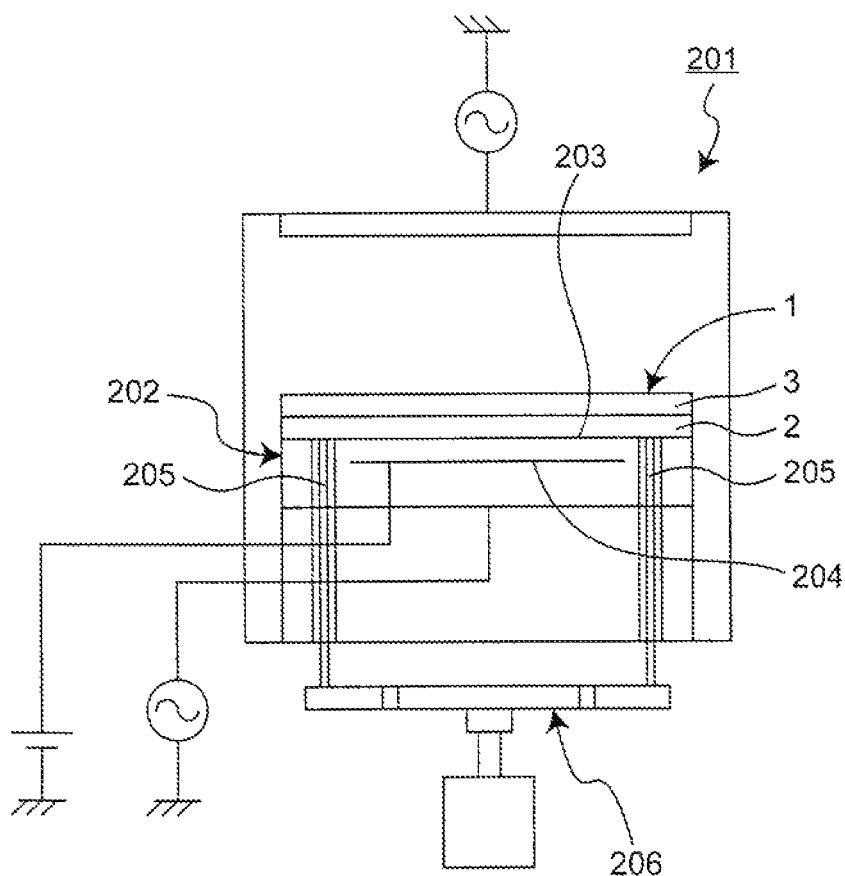
FIG. 15 is a schematic diagram illustrating an operation of thrusting up a substrate in a plasma processing apparatus in accordance with a comparative example of the first embodiment.
Figure 16:
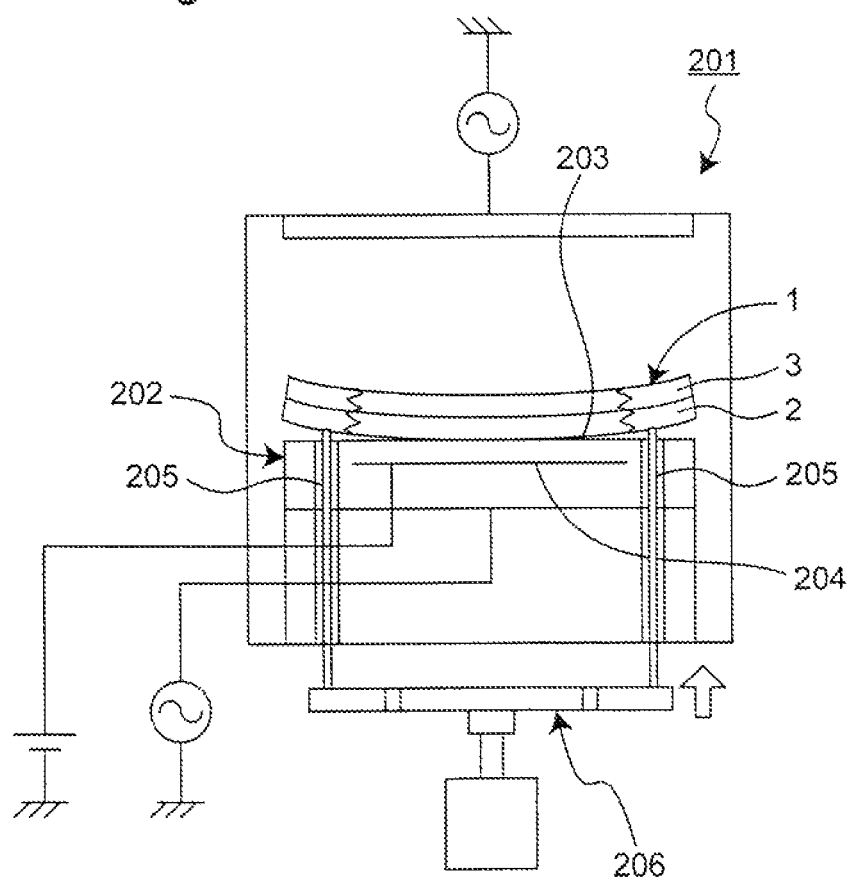
FIG. 16 is a schematic diagram illustrating the operation of thrusting up the substrate in the plasma processing apparatus in accordance with the comparative example of FIG. 15.

In a plasma processing apparatus 201 in accordance with the comparative example, as shown in FIG. 15, plasma processing of a semiconductor wafer 3 is performed in a state in which the glass-stuck substrate 1 having a glass plate 2 facing downward is placed on a placement surface 203 of a substrate holding device 202. While the plasma processing is being performed, the substrate 1 is held by electrostatic attraction by an ESC 204 embedded inside the placement surface 203. Upon completion of the plasma processing, subsequently, the electrostatic attraction by the ESC 204 is ceased.

The plasma processing apparatus 201 has a thrust-up device 206 for performing operations for moving up and down a plurality of thrust-up pins 205 that are provided on an edge part of the placement surface 203 of the substrate holding device 202 so as to form a circle concentric therewith. The thrust-up pins 205 are in retracted positions inside the placement surface 203 in a state in which the substrate 1 has just been placed thereon.

Once the electrostatic attraction by the ESC 204 is ceased, the thrust-up pins 205 are, e.g., integrally elevated by an up-and-down device 206 and the substrate 1 placed on the placement surface 203 is thereby thrust up, so that only an edge part of the substrate 1 is released from the placement surface 203 against a residual electrostatic attracting force.

The substrate 1, however, which is not a simple semiconductor wafer but has the glass plate stuck structure, makes the residual electrostatic attracting force larger than that in use of only a simple semiconductor wafer. Even after vicinity of the edge part of the substrate 1 is thrust up by the plurality of thrust-up pins 205, a high residual electrostatic attracting force still remains in vicinity of a center of the substrate 1. As a result, only the part of the substrate 1 thrust up by the thrust-up pins 205, that is, only the edge part of the substrate 1 is released from the placement surface 203, and the vicinity of the center of the substrate 1 is not released from the placement surface 203. In such condition, as shown in FIG. 16, the substrate 1 may suffer damages such as fracture and/or positional deviation may be caused by flap of the substrate 1 or the like when the substrate 1 is released from the placement surface 203.

Though the residual electrostatic attracting force can be reduced with use of electricity removing plasma as disclosed in Patent Document 1, it is thought that the substrate 1 having the glass plate stuck structure and the residual electrostatic attracting force greater than a conventional semiconductor wafer has may increase time required for the reduction in the residual electrostatic attracting force by the electricity removing plasma and that productivity of a process of the plasma processing may thereby be lowered.

According to the method of releasing the substrate in accordance with the first embodiment, contrasted with the method of releasing the substrate 1 in accordance with the comparative example, the glass-stuck substrate 1 can stably be released from the placement surface 12a without occurrence of damages, positional deviation and the like. Specifically, with use of the plurality of first thrust-up pins 21 that are concentrically provided in the outer region R1 in the substrate placement region R on the placement surface 12a and the plurality of second thrust-up pins 31 that are concentrically provided in the inner region R2 thereof, the stepwise thrust-up and suspension from outside toward inside of the substrate 1 are performed by means of the initial thrust-up operation by the first thrust-up pins 21 for the release of the edge part of the substrate 1 from the placement surface 12a and the subsequent thrust-up operation by the second thrust-up pins 31 for the release of an inside part of the substrate 1 from the placement surface 12a, and the releasing operation is performed by means of the stepped operations in which the thrust-up of the thrust-up pins is repeated afresh upon detection of the thrust-up force being not larger than the detection threshold during the suspension of the thrust-up, so that the substrate 1 with the glass-stuck structure characterized by the residual electrostatic attracting force higher than that of a conventional silicon wafer can stably be released from the placement surface 12a without occurrence of damages, positional deviation and the like.

Though deflection occurs in or in vicinity of the thrust part of the substrate 1 in the stepwise thrust-up operation with use of the first thrust-up pins 21 and the second thrust-up pins 31, damages to the substrate 1 by the thrust-up operation can be prevented by control over the thrust-up strokes (quantities) of the first thrust-up pins 21 and the second thrust-up pins 31 such that a curvature thereof may not exceed the highest degree preventing damages such as fracture in the substrate 1 according to physical properties, specifications and the like of the substrate 1.

By the use of the electricity removing plasma in those thrust-up operations, the release of the substrate 1 can further be promoted by gradual penetration of the electricity removing plasma from outside toward inside of the substrate 1.

The thrust-up operations are performed while the thrust-up force produced by the thrust-up of the first thrust-up pins 21 is detected by the first load cell 23, so that the thrust-up force can be prevented from exceeding the limit load F2 for destruction, positional deviation and the like of the substrate 1 and so that damages and the like to the substrate 1 can reliably be prevented.

By the employment of the technique in which the thrust-up operation by the second thrust-up pins 31 is commenced after the thrust-up operation by the first thrust-up pin 21 is performed and after the thrust-up force is decreased to the detection threshold F1, a direct release effect of the thrust-up operations and an indirect release effect (i.e., spreading effect of release area of the substrate 1) of maintenance of the thrust-up state and of the electricity removing plasma can be obtained with a satisfactory balance, and the release operation that prevents damages, positional deviation and the like in the substrate can be achieved.

Such a stepwise thrust-up operation with use of the first thrust-up pins 21 and the second thrust-up pins 31, that is, the operation of releasing the substrate 1 from the placement surface 12a is not limited to the method described with reference to FIGS. 6, 7A and 7B. A modification of the releasing operation will be described with reference to schematic illustrations shown in FIGS. 7A and 8.

Figure 8:
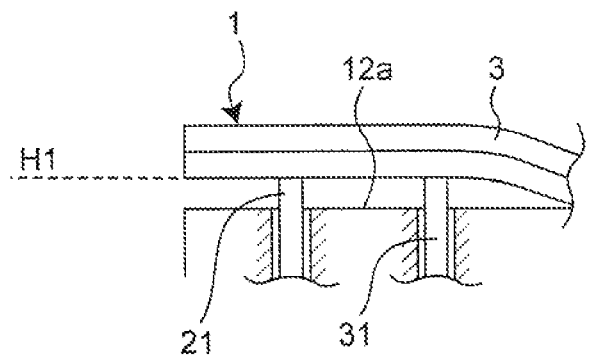
FIG. 8 is a schematic enlarged fragmentary view of the portion around the thrust-up pins in a thrust-up operation in accordance with a modification of the first embodiment.

As shown in FIG. 7A, initially, the first thrust-up pins 21 are elevated to the stroke H1 so as to thrust up the substrate 1. After that, the thrust-up state is maintained, while the decrease in the thrust-up force of the first thrust-up pins 21 to the detection threshold F1 is awaited, for instance. Upon verification of the decrease to the detection threshold F1, the second thrust-up pins 31 are elevated while the height of the first thrust-up pins 21 is maintained at the stroke H1. On this occasion, the second thrust-up pins 31 are elevated at a velocity that is sufficiently lower than a velocity at which the first thrust-up pins 21 are elevated in the first thrust-up operation. Thus the second thrust-up pins 31 are slowly elevated, so that an area in which the substrate 1 is exfoliated from the placement surface 12a can be spread without sudden change in stress load in the substrate 1. The second thrust-up pins 31 that are slowly elevated in this manner are finally thrust up to the stroke H1, as shown in FIG. 8, for instance. Instead of the elevation of the second thrust-up pins 31 at such a slow velocity, stepwise thrust-up may be performed a plurality of times in a stroke smaller than the stroke H1, for instance.

With the elevating velocity of the thrust-up pins lowered in this manner, the thrust-up elevating operation may continuously be performed so as to prevent the thrust-up force from going beyond the detection threshold F1 without suspension of the thrust-up elevating operation of the thrust-up pins in the midst, in the operation of releasing the substrate 1 from the placement surface 12a.

Rather than the re-elevation of the thrust-up pins upon the fall to or below the detection threshold F1 not larger than the limit load F2, a detection threshold F1a (F1<F1a<F2) is set for a target value of elevation of the thrust-up pins, the thrust-up pins are moved up at a specified constant velocity or specified variable velocities in the first thrust-up operation, and the elevation of the thrust-up pins is suspended upon detection of the detection threshold F1a. On condition that the thrust-up force falls to or below the detection threshold F1a and that the release of the substrate 1 from the placement surface 12a has not been completed, subsequently, the operation of elevating the thrust-up pins is performed afresh for the second thrust-up operation. In the elevating operation for the second time, a minute-step elevating operation with repetition of elevation and suspension is performed (an elevation height in one elevating operation is of 0.1 to 0.2 mm, for instance, and the elevation height in at least one elevating operation is smaller than an elevation height in the first elevating operation of the thrust-up pins), and an operation of detecting the completion of the release of the substrate 1 from the placement surface 12a is performed in the suspension after the elevation of the thrust-up pins. The minute-step elevating operation further reduces the stresses produced in the substrate 1 by the thrust-up operations from the placement surface 12a, and further promotes the release of the substrate 1 from the placement surface 12a.

Instead of the operation of detecting the completion of the release of the substrate 1 from the placement surface 12a in the suspension after the elevation of the thrust-up pins in the minute-step elevating operation, the operation of detecting the completion of the release may continuously be performed during the minute-step elevating operation, if there is no adverse effect on the operation of releasing the substrate 1 from the placement surface 12a.

Subsequently will be described arrangement of the first thrust-up pins 21 and the second thrust-up pins 31 on the placement surface 12a of the substrate holding device 12.

Figure 9A:
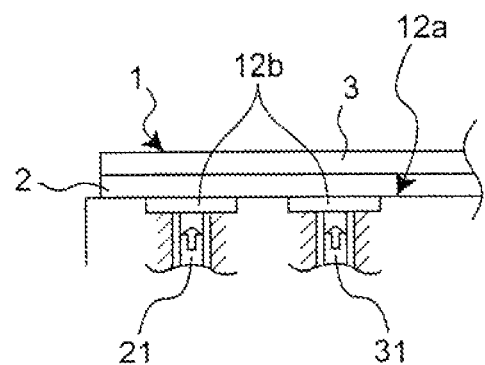
FIG. 9A is a schematic sectional view illustrating positions of the thrust-up pins (a state before elevation of the thrust-up pins) in accordance with the modification of the first embodiment.
Figure 9B:
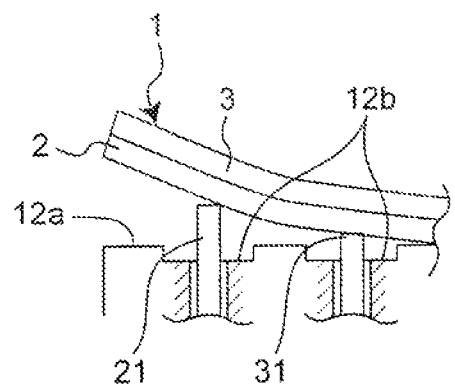
FIG. 9B is a schematic sectional view illustrating positions of the thrust-up pins (a state after the elevation of the thrust-up pins) in accordance with the modification of the first embodiment.

The plasma processing apparatus 10 is configured so that He gas is supplied between the placement surface 12a and the substrate 1 for purpose of cooling the substrate 1 and the placement surface 12a in the plasma processing. For that purpose, recesses for allowing flow or accumulation of He gas are formed on the placement surface 12a. In terms of a relation with the recesses 12b formed on the placement surface 12a, positions where the first thrust-up pins 21 and the second thrust-up pins 31 are formed preferably reside in depressions of the recesses 12b in plan view, as show in FIGS. 9A and 9B. During the cooling of the substrate 1 by He gas in the plasma processing, the heights of the extremities of the thrust-up pins 21 are preferably not higher than a height of bottoms of the recesses 12b so as to facilitate flow of He gas in the recesses 12b. The employment of such arrangement of the thrust-up pins reduces a quantity of leakage of He gas.

Figure 10:
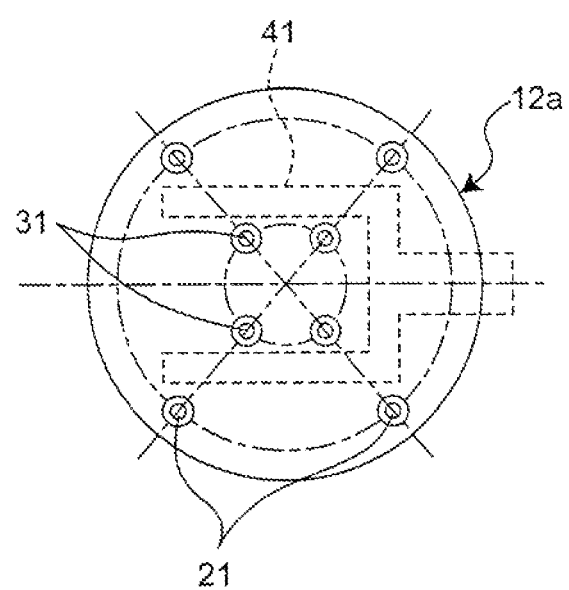
FIG. 10 is a schematic plan view illustrating positions of the thrust-up pins in accordance with the modification of the first embodiment.

Various arrangements can be employed as the arrangement in plan view of first thrust-up pins 21 and the second thrust-up pins 31 on the placement surface 12a. In view of performance of the thrust-up operations for the release from the placement surface 12a without application of a great load to the substrate 1 that is generally shaped like a disc, the thrust-up forces exerted on the substrate 1 are preferably exerted in a more uniform manner. As shown in FIG. 2, therefore, the first thrust-up pins 21 are preferably provided at uniform intervals on the first concentric circle C1 having the center on the center of the placement surface 12a and the second thrust-up pins 31 are preferably provided at uniform intervals on the second concentric circle C2 having the center on the center of the placement surface 12a, similarly. In the apparatus in which the substrate 1 released from the placement surface 12a is conveyed while being held by a substrate conveyance arm 41 from underside, as show in FIGS. 2 and 10, the arrangement of the first thrust-up pins 21 and the second thrust-up pins 31 is preferably determined so as to ensure a route for insertion of the substrate conveyance arm 41 between the substrate 1 and the placement surface 12a.

Though the configuration in which the plurality of first thrust-up pins 21 and the plurality of second thrust-up pins 31 are provided on the placement surface 12a and in which the stepwise thrust-up operations of the first thrust-up pins 21 and the second thrust-up pins 31 are performed has been described in the description of the first embodiment, the first embodiment is not limited to such a configuration. Instead of such a configuration, for instance, only the plurality of first thrust-up pins 21 may be provided at least on a periphery region of the placement surface 12a, and a stepwise thrust-up operation may be performed with detection of a thrust-up force during integral elevation of the plurality of first thrust-up pins 21 and with control over thrust-up strokes thereof such that excess over the limit load F2 is avoided; or the thrust-up pins may be elevated at a specified constant velocity or specified variable velocities in the first thrust-up operation, the elevation of the thrust-up pins may be suspended upon detection of the detection threshold F1a, and an operation of elevating the thrust-up pins as the second thrust-up operation may be performed afresh in form of a minute-step elevating operation on condition that the thrust-up force falls to or below the detection threshold F1a and that the release of the substrate 1 from the placement surface 12a has not been completed. Such thrust-up operations by only the first thrust-up pins 21 are effective for a condition in which the substrate 1 has a small diameter and a condition in which time required for the release of the substrate 1 can be ensured to a certain degree.

Though an object of the first embodiment is the glass-stuck substrate, a wafer having an insulating film formed on a back surface of the silicon wafer 3, a wafer having a semiconductor or an insulating metal film formed on a glass plate as insulating material, or glass or the silicon wafer 3 itself can be used as an object to be thrust up. Though the residual electrostatic attracting force of the silicon wafer 3 alone tends to become comparatively smaller than that of the glass-stuck substrate 1, the method of the release from the placement surface 12a by the thrust-up operations of the first embodiment can more effectively be applied to the silicon wafer 3 having an increased diameter not smaller than 300 mm.

Though the description has been given on the control over the thrust-up strokes and timing of the stepwise thrust-up with the detection by the first load cell 23 and the second load cell 33 of the thrust-up forces caused by the thrust-up operations of the first thrust-up pins 21 and the second thrust-up pins 31, the first embodiment is not limited to such a technique. Alternatively, there may be used devices for detecting motor torques of the first up-and-down device 22 and the second up-and-down device 32, for instance.

The thrust-up operations of the first embodiment can be performed with control over only the thrust-up strokes without the detection of the thrust-up forces in the thrust-up operations. For example, a time sequence for thrust-up strokes by which the thrust-up forces can be kept with a proper range is made by an experiment or the like on basis of physical properties, specifications and the like of the substrate 1 as an object to be thrust up, and the thrust-up operations can be performed with control over the thrust-up strokes with use of the time sequence.

Second Embodiment

Hereinbelow, a second embodiment of the invention will be described. For the plasma processing apparatus 10 of the first embodiment, the substrate thrust-up operations have been described by which the substrate 1 is released from the placement surface 12a against the residual electrostatic attracting force without damages to the substrate 1 after the plasma processing of the substrate 1 is performed. For the second embodiment will be described a method of releasing the substrate 1 from the placement surface 12a by reduction in the residual electrostatic attracting force existing before thrust-up operations, i.e., at instant of completion of plasma processing of the substrate 1.

For the description of the second embodiment, initially, the residual electrostatic attracting force that is produced in a plasma processing apparatus of a comparative example for the second embodiment, as a plasma processing apparatus to which a configuration and a method of the second embodiment are not applied, will be described with reference to drawings.

Figure 11:
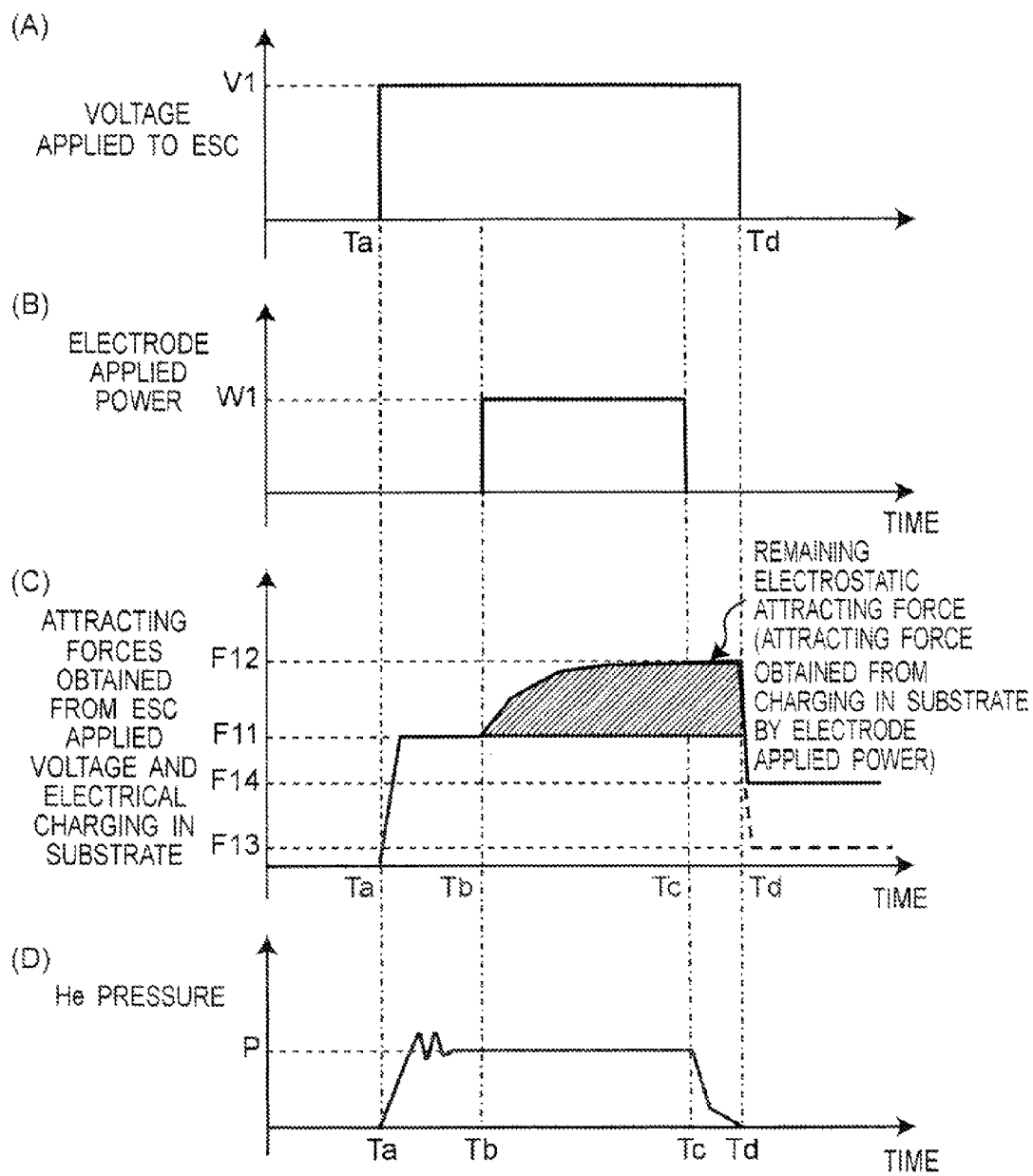
FIG. 11(A) is a graph illustrating temporal change in ESC applied voltage in a plasma processing apparatus in accordance with a comparative example of a second embodiment of the invention.
FIG. 11(B) is a graph illustrating ON/OFF state of power applied to electrodes therein.
FIG. 11(C) is a graph illustrating change in an electrostatic attracting force of a substrate for a placement surface therein.
FIG. 11(D) is a graph illustrating supply conditions of He gas therein.

FIG. 11 are diagrams illustrating temporal change in the electrostatic attracting forces for the substrate, and the like, that are produced in the plasma processing in a conventional plasma processing apparatus, as the comparative example contrasted with the second embodiment. Specifically, FIG. 11(A) is a graph illustrating temporal change in ESC applied voltage, FIG. 11(B) is a graph illustrating existence or absence of electric power application to an upper electrode and/or a lower electrode (i.e., whether plasma processing such as etching is being performed or not), FIG. 11(C) is a graph illustrating temporal change in the electrostatic attracting forces of the substrate for the placement surface, produced by the ESC applied voltage and electrical charging in the substrate by the electrode applied power, and FIG. 11(D) is a graph illustrating existence or absence of supply of He gas to between the placement surface and the substrate for purpose of cooling of the substrate and the placement surface.

As shown in FIGS. 11(A) and 11(C), initially, the substrate is placed on the placement surface at time Ta, then the application of the voltage to the ESC produces an electrostatic attracting force F11, and the substrate is attracted and held in a time segment. Ta-Tb. In the time segment Ta-Tb, as shown in FIG. 11(D), He gas is supplied between the substrate and the placement surface and is kept at a pressure P. As shown in FIG. 11(B), subsequently, the power application to the upper electrode and/or the lower electrode (e.g., application of a power W1) is commenced at time Tb, and the plasma processing of the substrate is performed in a time segment Tb-Tc.

Once the power application to the electrodes is commenced at the time Tb, accumulation of residual charge in the glass plate of the substrate and the like produces the residual electrostatic attracting force. As shown in FIG. 11(C), the residual electrostatic attracting force increases with lapse of time, and the total electrostatic attracting force that is a sum of the electrostatic attracting force F11 by the ESC and the residual electrostatic attracting force increases to F12 at time Tc when the plasma processing is completed, for instance. That is, the substrate is being held by the electrostatic attracting force F12 greater than the electrostatic attracting force F11 for reliably holding the substrate. In FIG. 11(C), a part with hatching pattern represents the residual electrostatic attracting force caused by the residual charge and the like.

Though the supply of the power to the electrodes such as the upper electrode and/or the lower electrode is stopped at time Tc, the residual electrostatic attracting force is not decreased by the stoppage of the supply of the power. At the time Tc, the supply of He gas is also stopped and the plasma processing is completed.

Upon the completion of the plasma processing, the voltage application to the ESC is stopped and the electrostatic attraction by the ESC is cancelled at time Td. If the residual electrostatic attracting force was not produced, the cancellation of the attraction by the ESC would decrease the electrostatic attracting force for the substrate from F11 to F13 (see a dashed line in FIG. 11(C)); nevertheless, the electrostatic attracting force actually decreases from F12 to no less than F14 because of the existence of the residual electrostatic attracting force. That is, the electrostatic attracting force (residual electrostatic attracting force) F14 evidently larger than F13 remains even after the electrostatic attraction by the ESC is cancelled (at the time Td and later). On condition that such a great electrostatic attracting force remains, problems may occur such as difficulty in releasing the substrate from the placement surface and damages to the substrate by the thrust-up operations for the release.

In particular, use of a glass-stuck substrate or the like tends to cause a warp of the substrate (for instance, a warp on the order of 600 to 800 μm in a convex shape is prone to occur) and thus necessitates application of a high voltage to the ESC and the resultant holding of the substrate by a great attracting force for correction of such a warp. For instance, attraction of a common wafer alone requires application of a voltage on the order of 600 to 900V, while a glass-stuck substrate requires application of a voltage about three to four times the former, i.e., on the order of 2500V. Besides, a glass plate, which tends to have strong polarization, makes the residual electrostatic attracting force extremely strong and makes it more difficult to adequately release the substrate from the placement surface.

An object of the plasma processing apparatus and the plasma processing method of the second embodiment is to reduce a remaining quantity of the residual electrostatic attracting force and to smooth the operations of releasing the substrate from the placement surface after the completion of the plasma processing.

Figure 12:
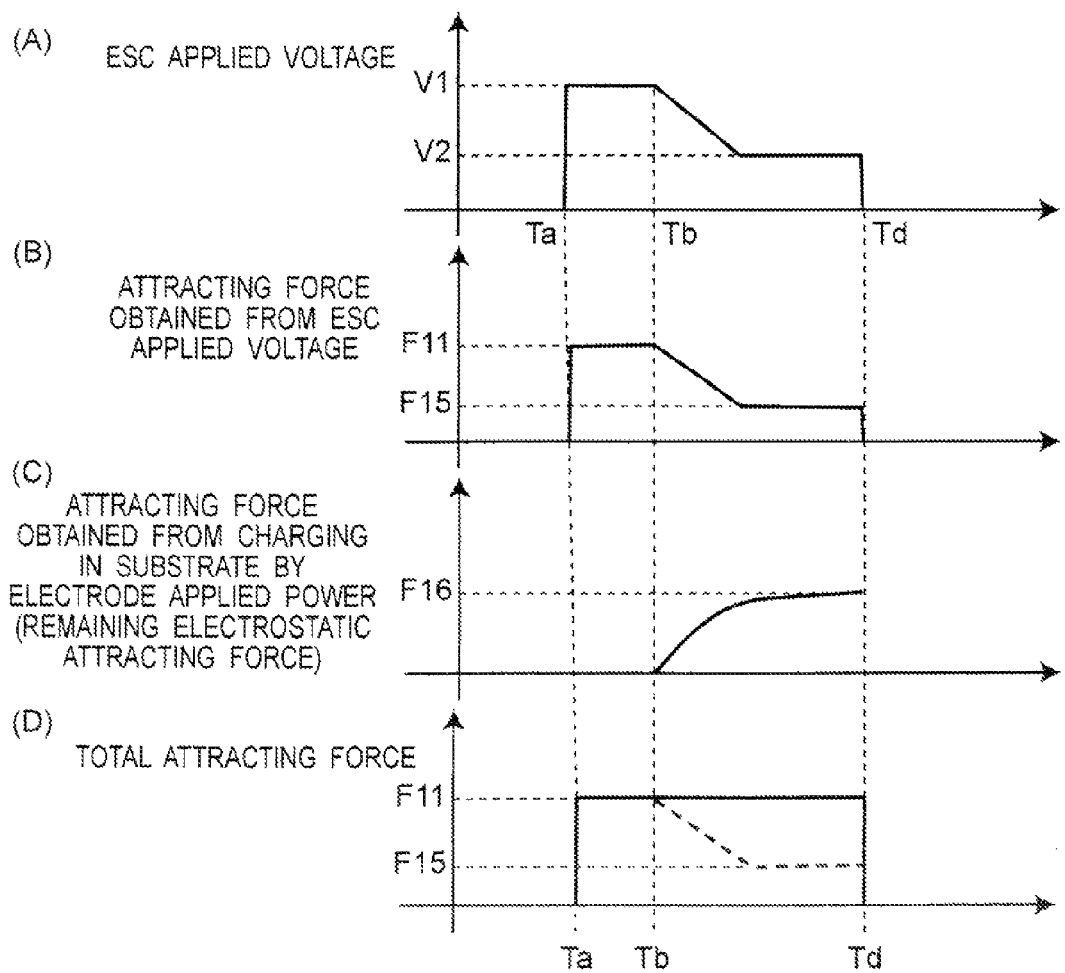
FIG. 12 are diagrams for illustration of a method of reducing residual electrostatic attracting forces in a plasma processing apparatus of the second embodiment.

A concept of the second embodiment for the reduction in the remaining quantity of the residual electrostatic attracting force will be described with reference to diagrams (graphs) of FIGS. 12(A) through 12(D). FIG. 12(A) is a graph illustrating temporal change in ESC applied voltage, FIG. 12(B) is a graph illustrating temporal change in electrostatic attracting force of an ESC that is obtained from the ESC applied voltage, FIG. 12(C) is a graph illustrating temporal change in electrostatic attracting force produced by electrical charging of the substrate that is caused by a voltage applied to the electrodes, i.e., residual electrostatic attracting force, and FIG. 12(D) is a graph illustrating temporal change in total attracting force that is a sum of the electrostatic attracting force of FIG. 12(B) and the residual electrostatic attracting force of FIG. 12(C). Time Ta, Tb, Tc and Td are in common with FIG. 11.

As shown in FIG. 12(C), power application (application of high-frequency voltage) to the electrodes such as the upper electrode and/or the lower electrode and the plasma processing are commenced at the time Tb, and then the residual electrostatic attracting force increases and finally reaches F16 at the time Td. In the second embodiment, as shown in FIG. 12(D), the total attracting force is prevented from increasing and is kept constant, e.g., at F11 in the time segments Ta-Td, even if an increase in the residual electrostatic attracting force occurs between the time Tb and the time Td.

As shown in FIGS. 12(A) and 12(B), specifically, the electrostatic attracting force F11 is produced in the ESC by an applied voltage V1 at the time Ta and, after that, the applied voltage is gradually decreased from the time Tb to a voltage V2, so that the electrostatic attracting force obtained from the voltage application to the ESC is decreased from F11 to F15. That is, after the commencement of the application of the high-frequency voltage, a quantity of the voltage application to the ESC is decreased in accordance with a quantity of the increase in the residual electrostatic attracting force generated with the high-frequency voltage application. Herein, the attracting forces have a relation close to (F11–F15)=F16. According to this technique, as shown in FIG. 12(D), the increase in the residual electrostatic attracting force can be reduced or offset by the decrease in the electrostatic attracting force produced by the voltage application to the ESC, so that the total attracting force in the time segments Ta-Td can be kept generally constant.

Thus the total attracting force kept generally constant makes it possible to reduce the residual electrostatic attracting force that remains when the substrate is released from the placement surface and to smooth the releasing operations that are to be performed later. The electrostatic attracting force F15 produced by the voltage application to the ESC is an attracting force that alone is below a force required for reliable holding of the substrate, for instance, and a shortfall relative to the force required for the reliable holding is made up by the residual electrostatic attracting force so that the total attracting force exceeds the force required for the reliable holding.

Subsequently, specific embodiments of the plasma processing apparatus and the plasma processing method of the second embodiment will be described with reference to drawings.

Figure 13:
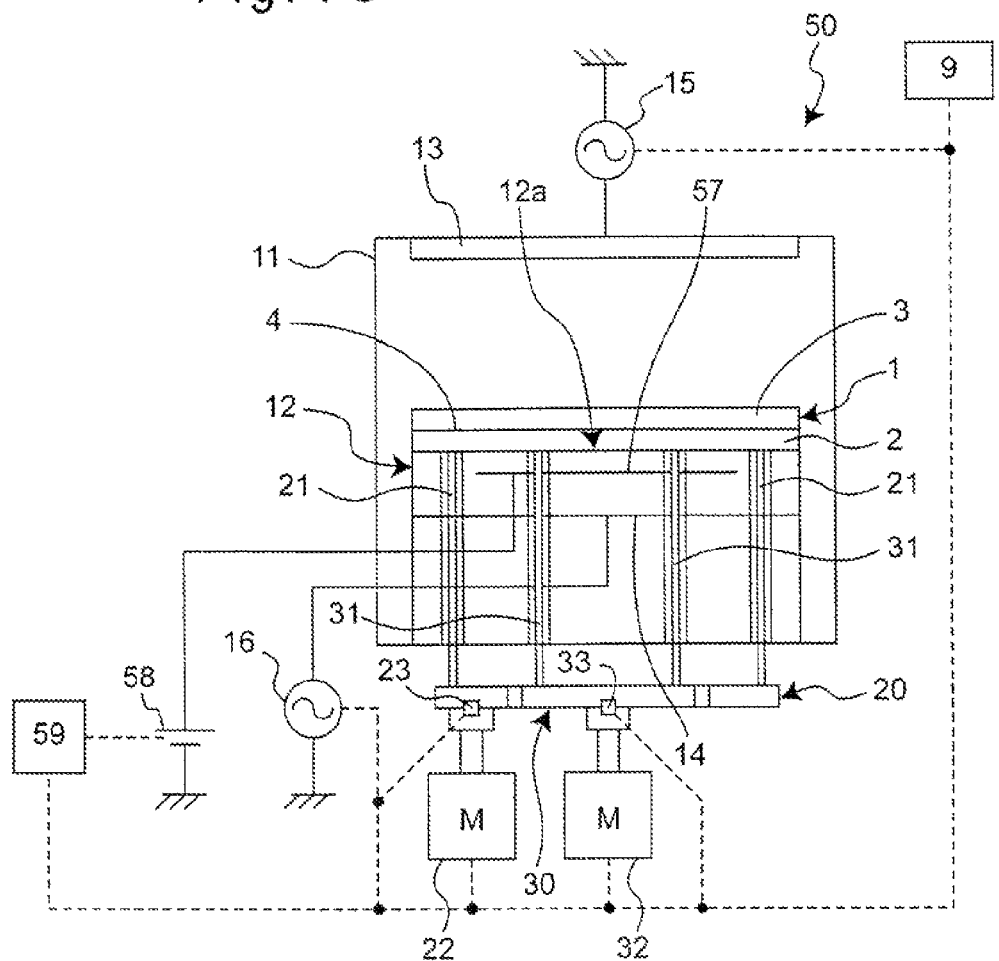
FIG. 13 is a schematic diagram of the plasma processing apparatus in accordance with the second embodiment.

FIG. 13 shows a schematic diagram of main components of a plasma processing apparatus 50 in accordance with the second embodiment. The plasma processing apparatus 50 of the second embodiment is different from the plasma processing apparatus 10 of the first embodiment in configuration of substrate holding device. Hereinbelow, the different configuration will chiefly be described. For the plasma processing apparatus 50 of the second embodiment in FIG. 13, the same component members as those of the plasma processing apparatus 10 of the first embodiment in FIG. 1 are designated by the same reference characters and description thereof is omitted.

As shown in FIG. 13, a substrate holding device of the plasma processing apparatus 50 has an ESC 57 for holding a substrate 1 placed on a placement surface 12a by an electrostatic attracting force, and a power supply 58 for ESC for applying a direct current voltage (DC voltage) to the ESC 57. The substrate holding device further has a voltage control device 59 as an example of voltage control device for controlling magnitude of the voltage applied from the power supply 58 for ESC to the ESC 57. The voltage control device 59 is associated with operations of other component members and is integrally controlled by a control device 9. Specifically, the voltage control device 59 is controlled in association with timing of application of power to an upper electrode 13 and/or a lower electrode by the control device 9. The association can be performed as sequential control with use of a program in which timing of the operations of the component members is designed in advance. Instead of the use of such a program, the control may be performed with use of timing signals for commencement/stoppage of the operations of the component members.

A method for performing plasma processing for the substrate while suppressing increase in the attracting forces imparted to the substrate 1 with use of the plasma processing apparatus 50 having such a configuration will be described with reference to graphs shown in FIGS. 14(A) through 14(C). FIG. 14(A) is a graph illustrating temporal change in voltage applied to the ESC 57, FIG. 14(B) is a graph illustrating temporal change in power applied to the upper electrode 13 and/or the lower electrode 14, and FIG. 14(C) is a graph illustrating temporal change in pressure of He gas.

In the plasma processing apparatus 50, initially, the substrate 1 is placed on the placement surface 12a. After that, a DC voltage is applied from the power supply 58 for ESC to the ESC 57 at time Ta. Magnitude of the voltage applied at the timing is associated with the timing and is set in the program or the like, for instance. The applied voltage is controlled by the voltage control device 59 on basis of such a program, and the DC voltage of, e.g., 2500V is applied to the ESC 57 as shown in FIG. 14(A). By the voltage application, an electrostatic attracting force proportional to the magnitude of the voltage is produced in the ESC 57, and the substrate 1 on the placement surface 12a is thereby attracted and held. The applied voltage of 2500V is determined so as to have magnitude such that a warp (deflection) which may occur in the glass-stuck substrate 1 can reliably be corrected, and the electrostatic attracting force produced by the ESC 57 fulfils the correction of the warp in the substrate 1 and the attraction and holding of the substrate 1. Once the warp is corrected by the initial attraction and holding in this manner, the applied voltage is decreased to, e.g., 2000V at time Ta1, so that an adequate electrostatic attracting force for holding the substrate 1 is maintained. As shown in FIG. 14(C), supply of He gas to between the substrate 1 and the placement surface 12a is commenced and the gas is kept at a specified pressure P.

Subsequently, the plasma processing of the substrate 1 is commenced at time Tb. Specifically, plasma is produced by application of power W1 to the upper electrode 13 and/or the lower electrode 14 in a condition in which specified gas is supplied into a plasma processing vessel 11, and the plasma processing such as etching on the substrate 1 is commenced.

Once the power application to the electrodes 13 and 14 is commenced, in this manner, accumulation of electrical charge in a glass plate 2 of the glass-stuck substrate 1 leads to generation of the residual electrostatic attracting force, and magnitude of the force gradually increases. Accordingly, the voltage applied to the ESC 57 is decreased from 2000V to 400V, for instance, at time Tb1 by the voltage control device 59 on basis of the program. This reduces the electrostatic attracting force produced in the ESC 57 by the application of the voltage thereto, while the residual electrostatic attracting force corresponding to a quantity of the reduction is generated, so that the total attracting force can be kept generally constant and so that the plasma processing is continued with maintenance of the holding of the substrate 1 on the placement surface 12a. Upon time Tb2, subsequently, the residual electrostatic attracting force further increases, and thus the voltage applied to the ESC 57 is decreased from 400V to 100V, for instance, so as to substantially offset the increase.

Accordingly, the total attracting force imparted to the substrate 1 can be kept generally constant so as not to increase, in spite of the increase in the residual electrostatic attracting force.

At time Tc, subsequently, the application of the power to the upper electrode 13 and/or the lower electrode 14 is stopped and the plasma processing of the substrate 1 is completed. At the same time, the supply of He gas is stopped, so that the pressure of He is decreased. At time Td, subsequently, a sign-inverted voltage, e.g., a voltage of −3000V (sign-inverted great voltage), is applied to the ESC 57 by the power supply 58 for ESC. This drastically reduces the residual electrostatic attracting force.

After that, electricity removing plasma is produced by application of comparatively weak power W2 to the upper electrode 13 and/or the lower electrode 14 from time Te to time Tf. In a condition in which the electricity removing plasma is produced in this manner, the stepwise thrust-up operations for the substrate 1 by the first thrust-up pins 21 and the second thrust-up pins 31 of the first embodiment are performed, and then the substrate 1 is spaced apart from the placement surface 12a.

In the second embodiment, the voltage applied to the ESC 57 can be decreased according to the quantity of increase in the residual electrostatic attracting force that is generated in the plasma processing and that increases with lapse of time, so that the increase in the residual electrostatic attracting force can be suppressed or offset by the decrease in the electrostatic attracting force produced by the voltage application to the ESC 57. Accordingly, the attracting force for reliably holding the substrate 1 is ensured in the plasma processing while the attracting force (total attracting force) can be prevented from increasing, and thus a remaining quantity of the residual electrostatic attracting force after the completion of the plasma processing can be reduced. Thus the thrust-up operations for spacing the substrate 1 apart from the placement surface 12a can be performed smoothly and appropriately thereafter. Such an effect of the reduction in the residual electrostatic attracting force is particularly effective for a glass-stuck substrate that tends to have the residual electrostatic attracting force greater than a sole wafer has.

Though the magnitude and timing of application of the voltage applied from the power supply 58 for ESC to the ESC 57 is sequentially controlled by the voltage control device 59 on basis of the program, such a voltage and timing of application thereof can be determined on basis of a result of measurement that is conducted in advance for temporal change in the residual electrostatic attracting force generated in the substrate 1.

Though the stepwise (step-down) control over the voltage applied to the ESC 57 has been described as shown in FIG. 14(A), the applied voltage may be controlled continuously (linearly), alternatively.

Though the voltage applied to the ESC 57 of unipolar type has been described above, the ESC of bipolar type involves positive and negative applied voltages, while the ESC of unipolar type involves application of positive voltage or negative voltage.

Third Embodiment

Figure 17:
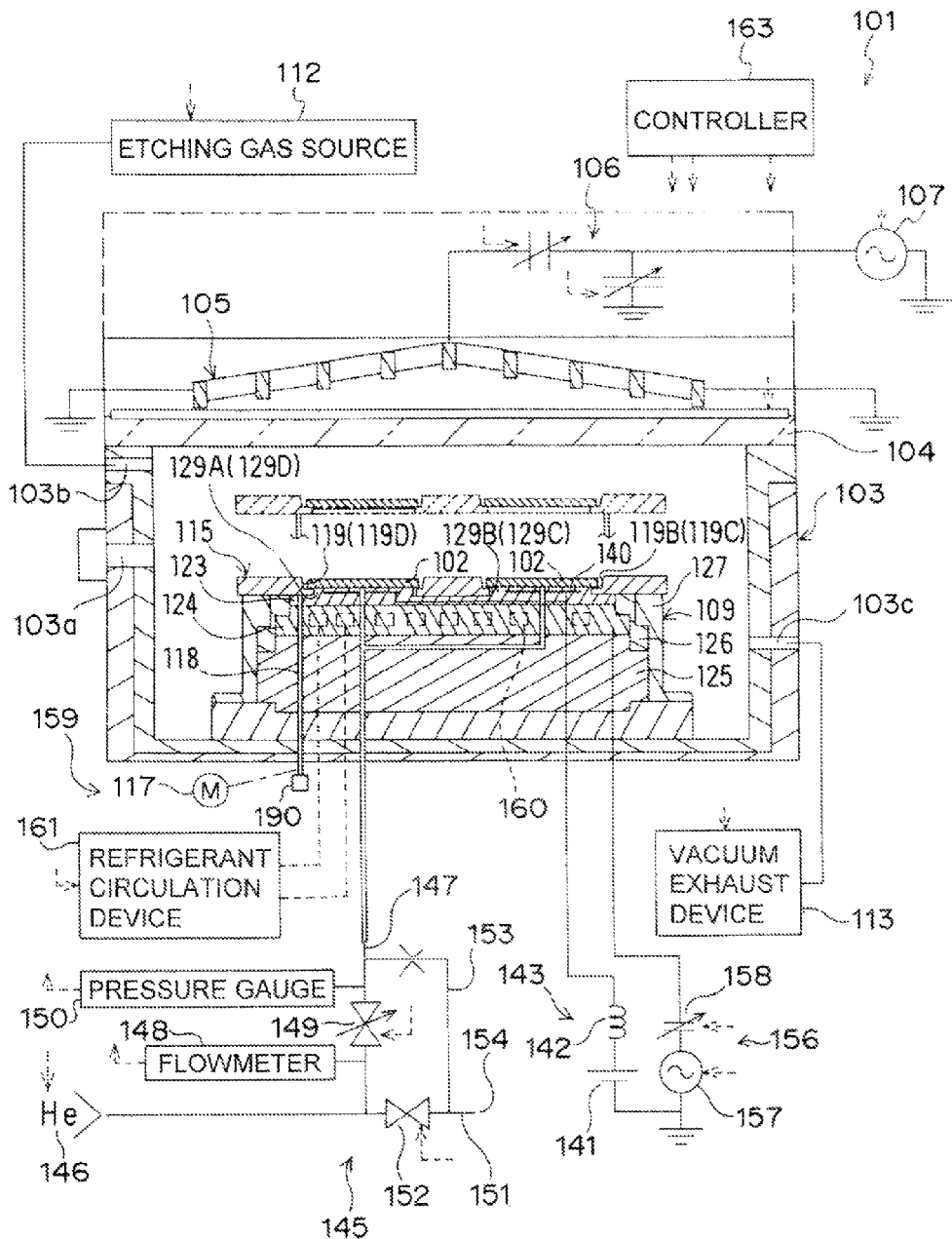
FIG. 17 is a schematic diagram of a plasma processing apparatus in accordance with a third embodiment of the invention.

FIG. 17 shows a schematic diagram illustrating main components of a plasma processing apparatus 101 in accordance with a third embodiment of the invention. The plasma processing apparatus 101 of the third embodiment has a configuration different from the configurations of the embodiments described above in that a plurality of wafers held by a tray as will be described later are handled therein as substrates on which plasma processing is to be performed. For material of the wafers held by the tray for handling, there may be used sapphire substrate, GaN/sapphire substrate, GaN/GaN substrate, GaN/SiC substrate, or GaN/Si substrate, for LED, for instance; SiC substrate for power device; GaP substrate, ZnO substrate, $LiGaO_2$ substrate, $\beta GaO_3$ substrate, or the like for others. Initially, the configuration of the plasma processing apparatus 101 of the third embodiment will be described with reference to drawings. The plasma processing apparatus 101 of the third embodiment is a dry etching apparatus of ICP (inductively coupled plasma) type.

The plasma processing apparatus 101 has a chamber (vacuum vessel or plasma processing vessel) 103 that configures a processing chamber in which plasma processing is performed for substrates (such as wafers) 102. An upper end opening of the chamber 103 is hermetically closed with a top plate 104 composed of dielectric such as quartz. On the top plate 104 is provided an ICP coil (upper electrode) 105. A high-frequency power supply (high-frequency power supply for upper electrode) 107 is electrically connected to the ICP coil 105 through a matching circuit 106. On bottom side facing the top plate 104 in the chamber 103 is provided a substrate suscepter 109 (as an example of substrate holding device) having a function as a lower electrode to which a bias voltage is applied and a function as a holder mount for the substrates 102. On the chamber 103 is provided a closable gate 103a for carrying-in-and-out that communicates with an adjoining load lock chamber (not shown). An etching gas source 112 is connected to an etching gas supply port 103b provided on the chamber 103. The etching gas source 112 has an MFC (mass flow controller) or the like and is thus capable of supplying etching gas at a desired flow rate through the etching gas supply port 103b. A vacuum exhaust device 113 having a vacuum pump or the like is connected to an exhaust port 103c provided on the chamber 103.

Figure 18A:
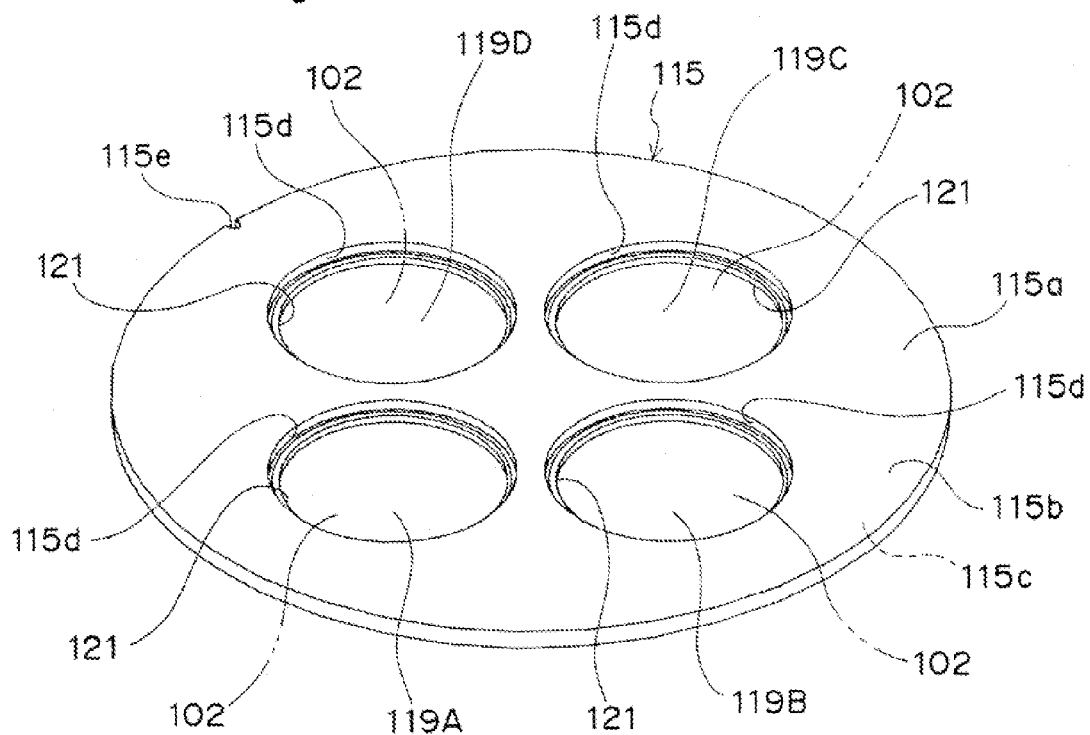
FIG. 18A is a perspective view of a tray handled in the plasma processing apparatus in accordance with the third embodiment.
Figure 18B:
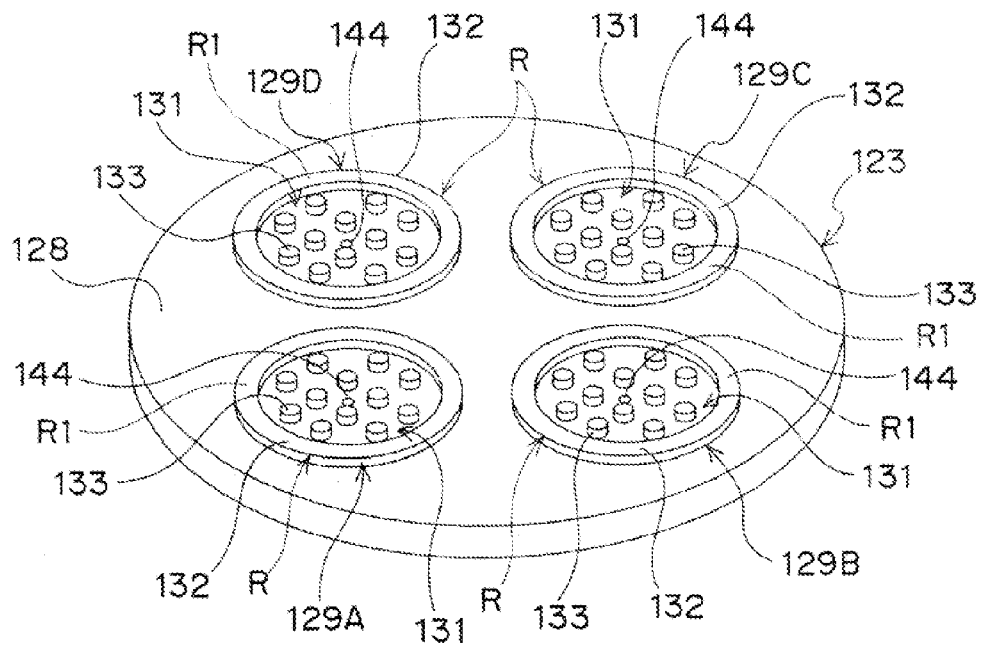
FIG. 18B is a perspective view of a dielectric plate of the plasma processing apparatus in accordance with the third embodiment.
Figure 19A:
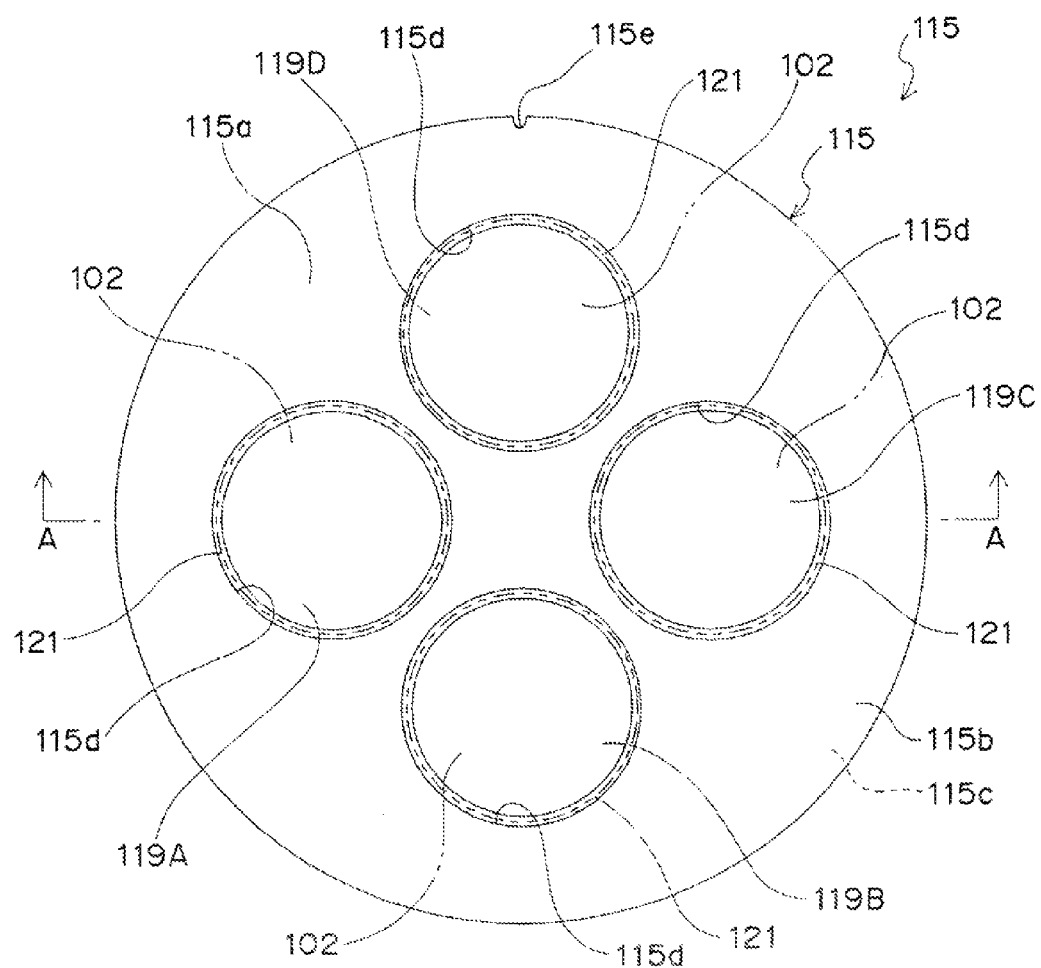
FIG. 19A is a plan view of the tray of FIG. 18A.
Figure 19B:
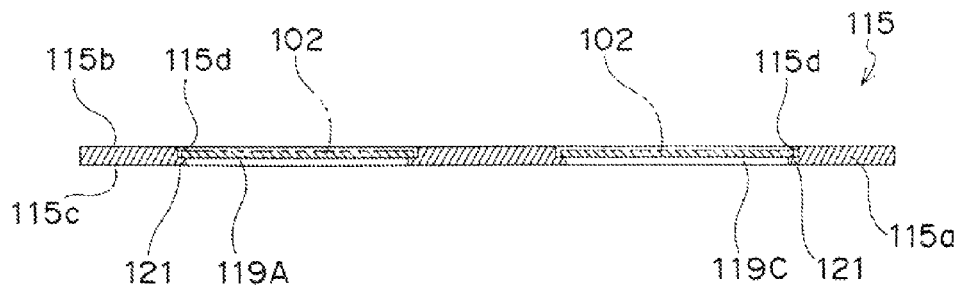
FIG. 19B is a sectional view taken along a line A-A of the tray of FIG. 19A.

In the third embodiment, four substrates 102 are accommodated in one tray 115 shown in FIGS. 18A and 18B, and the tray 115 is carried from the load dock chamber through the gate 103a into the chamber 103 (processing chamber). The carrying-in of the tray 115 is performed with use of a carrier arm capable of performing linear movement in horizontal directions and rotational movement in a horizontal plane, for instance. In the chamber 103 are provided a plurality of thrust-up pins 118 that extend through the substrate suscepter 109 and that move up and down by being driven by a driving device (an example of thrust-up device) 117. The plurality of thrust-up pins 118 are provided at uniform intervals so as to form a concentric circle, for instance, and thrust-up against a bottom surface of the tray 115 and support of the tray 115 in a thrust-up state can be performed by upper ends of the pins. When the tray 115 is carried in, the carrier arm supporting the tray 115 enters from the load dock chamber through the gate 103a into the chamber 103. On this occasion, the thrust-up pins 118 are in elevated positions as shown by two-dot chain lines in FIG. 1, and then the tray 115 is transferred from the carrier arm 116 having entered into the chamber 103 onto the upper ends of the thrust-up pins 118. In this state, the tray 115 is positioned with a space above the substrate suscepter 109. Subsequently, the thrust-up pins 118 are moved down to lowered positions shown by solid lines in FIG. 1, and the substrates (wafers) 102 held by the tray 115 for handling are thereby placed together with the tray 115 on the substrate suscepter 109. When the tray 115 is carried out after the completion of the plasma processing, the thrust-up pins 118 are moved up to the elevated positions and the tray 115 is subsequently transferred onto the carrier arm having entered from the load dock chamber into the chamber 103. An operation of releasing the tray 115 and the substrates 102 from the substrate suscepter 109 after the completion of the plasma processing will be described later. As shown in FIG. 17, the driving device 117 has a load cell 190 as an example of thrust-up force detector for detecting a thrust-up force exerted on the thrust-up pins 118 by the driving device 117 upon the thrust-up of the tray 115.

Hereinbelow, the tray 115 will be described with reference to FIGS. 18A through 19B. The tray 115 has a tray body 115a shaped like a thin disc. As material of the tray 115, there may be used alumina ($Al_2O_3$), aluminum nitride (AlN), zirconia (ZrO), yttria ($Y_2O_3$), ceramics material such as silicon nitride (SiN) and silicon carbide (SiC), metal such as aluminum coated with anodized aluminum, aluminum having surfaces thermally sprayed with ceramics, and aluminum coated with resin material, for instance. It is thought that alumina, yttria, silicon carbide, aluminum nitride or the like is employed for Cl-based process and that quartz, crystal, yttria, silicon carbide, aluminum thermally sprayed with anodized aluminum, or the like is employed for F-based process.

On the tray body 115a are provided, e.g., four substrate accommodating holes 119A through 119D extending therethrough in a direction of thickness thereof from a top surface 115b to the bottom surface 115c. The substrate accommodating holes 119A through 119D are provided at uniform angle intervals with respect to a center of the tray body 115a in view from the top surface 115b and the bottom surface 115c. As most clearly shown in FIGS. 20A and 20B, substrate support parts 121 protruding toward centers of the substrate accommodating holes 119A through 119D are provided on side of the bottom surface 115c on hole walls 115d of the substrate accommodating holes 119A through 119D. In the third embodiment, the substrate support parts 121 are provided on the whole periphery of the hole walls 115d, for instance, and are in annular shape in plan view.

Figure 20A:
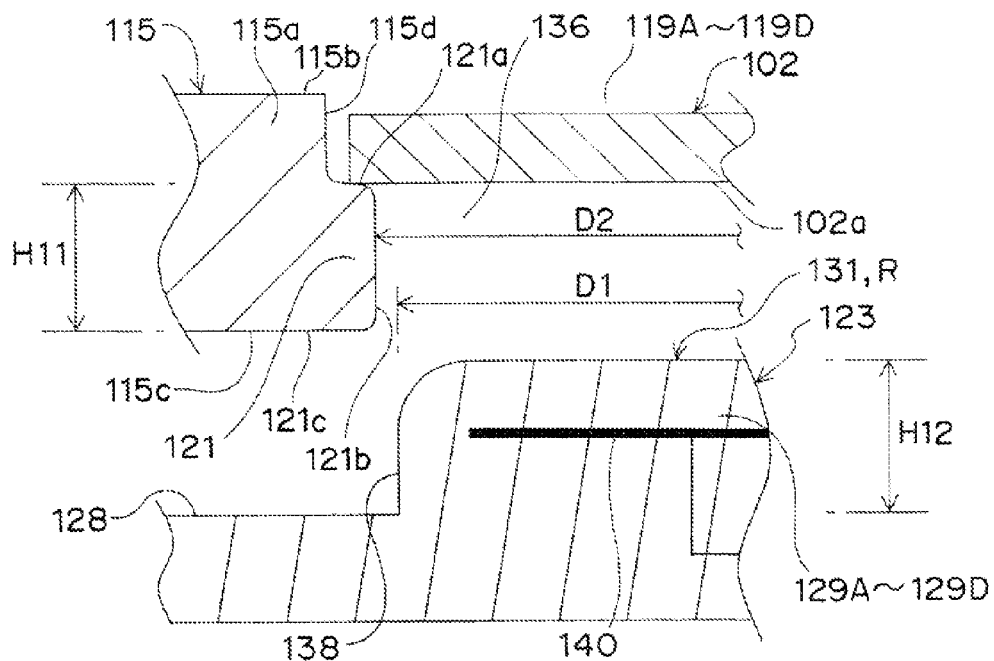
FIG. 20A is an enlarged fragmentary sectional view of the tray and the dielectric plate (before placement of the tray) in accordance with the third embodiment.

Each of substrate accommodating holes 119A through 119D accommodates one substrate 102. For the substrates 102 accommodated in the substrate accommodating holes 119A through 119D, as shown in FIG. 20A, periphery parts of the lower surfaces 102a thereof are supported by top faces 121a of the substrate support parts 121. The substrate accommodating holes 119A through 119D are formed so as to extend through the tray body 115a in the direction of thickness thereof, as described above, and thus the lower surfaces 102a of the substrates 102 are exposed through the substrate accommodating holes 119A through 119D in view from the side of the bottom surface 115c of the tray body 115a.

On the tray body 115a is provided a positioning cutout 115e in which outer periphery thereof is partially cut out. When the tray is placed on the carrier arm for carrying-in-and-out described above, a positioning protrusion of the carrier arm is fitted into the positioning cutout 115e. A turning angle position of the tray 115 can be detected by detection of the positioning cutout 115e and the positioning protrusion by a sensor or the like provided in the load lock chamber.

Hereinbelow, the substrate suscepter 109 will be described with reference to FIGS. 17, 18A, 18B, 20A, and 20B. Referring to FIG. 17, initially, the substrate suscepter 109 has a dielectric plate (dielectric member) 123 composed of ceramics or the like, a metal plate (support member) 124 that is composed of aluminum having anodized aluminum coating formed on surfaces thereof and the like and that functions as a pedestal electrode in the third embodiment, a spacer plate 125 composed of ceramics or the like, a guide cylinder 126 composed of ceramics or the like, and an earth shield 127 made of metal. The dielectric plate 123 configuring a top part of the substrate suscepter 109 is fixed onto a top surface of the metal plate 124. The metal plate 124 is fixed onto the spacer plate 125. Furthermore, the guide cylinder 126 covers peripheries of the dielectric plate 123 and the metal plate 124, and the earth shield 127 covers outside thereof and periphery of the spacer plate 125.

Referring to FIGS. 18A, 18B, 20A, and 20B, the dielectric plate 123 is generally shaped like a thin disc and an outside shape thereof in plan view is circular. An upper end surface of the dielectric plate 123 configures a tray support surface (tray support part or tray placement region) 128 for supporting the bottom surface 115c of the tray 115. Four substrate placement parts 129A through 129D, in shape of short columns, corresponding to the substrate accommodating holes 119A through 119D of the tray 115 protrude upward from the tray support surface 128.

Upper end surfaces of the substrate placement parts 129A through 129D configure substrate placement surfaces (substrate placement regions R) 131 on which the lower surfaces 102a of the substrates 102 are directly placed. On the substrate placement parts 129A through 129D are provided circular protruding parts 132 protruding upward from periphery parts of the substrate placement surfaces 131 and having upper end surfaces supporting the lower surfaces 102a of the substrates 102. On parts of the substrate placement surfaces 131 surrounded by the circular protruding parts 132, a plurality of columnar protrusions 133 that have diameters sufficiently smaller than the substrate placement surfaces 131 have are provided so as to be distributed uniformly. Quantities by which the columnar protrusions 133 and the circular protruding parts 132 protrude from the substrate placement surfaces 131 are the same, so that upper end surfaces of not only the circular protruding parts 132 but also the columnar protrusions 133 support the lower surfaces 102a of the substrates 102.

Figure 20B:
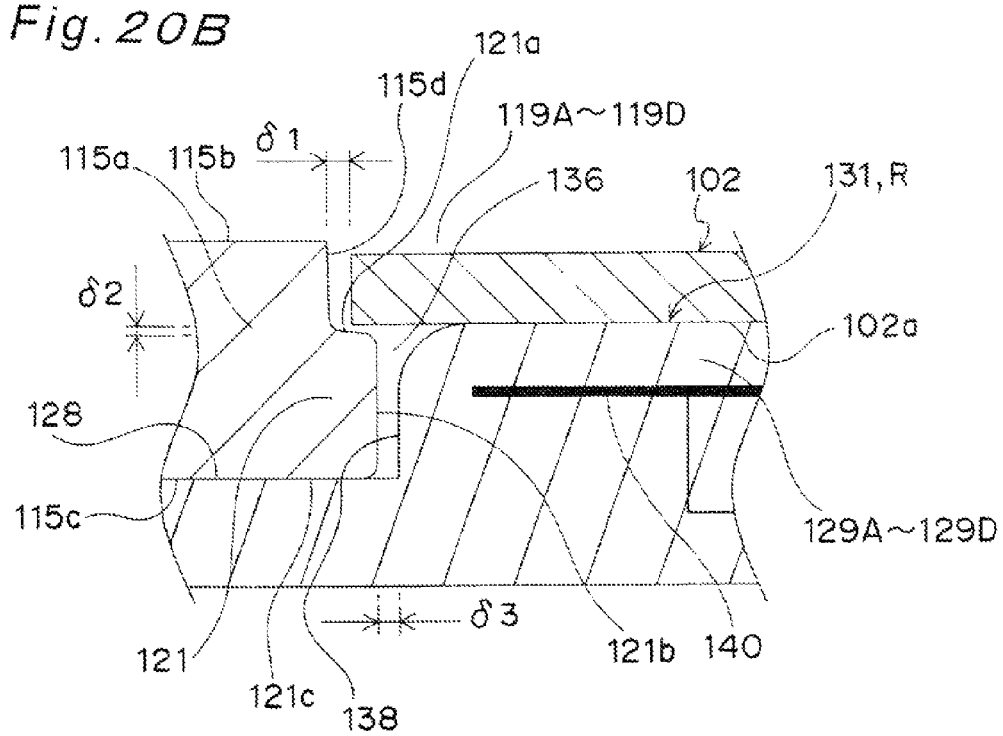
FIG. 20B is an enlarged fragmentary sectional view of the tray and the dielectric plate (after the placement of the tray) in accordance with the third embodiment.

Referring to FIGS. 20A and 20B, an outside diameter D1 of the substrate placement parts 129A through 129D is set so as to be smaller than a diameter D2 of circular openings 136 surrounded by extremity surfaces 121b of the substrate support parts 121. When the tray 115 is lowered toward the dielectric plate 123 in the carrying-in described above, accordingly, the substrate placement parts 129A through 129D enter into the corresponding substrate accommodating holes 119A through 119D from the side of the bottom surface 115c of the tray body 115a, and the bottom surface 115c of the tray 115 is placed on the tray support surface (tray placement region) 128 of the dielectric plate 123. A height H11 of the top faces 121a of the substrate support parts 121 from the bottom surface 115c of the tray body 115a is set so as to be smaller than a height H12 of the substrate placement surfaces 131 from the tray support surface 128. In a state in which the bottom surface 115c of the tray 115 is placed on the tray support surface 128, therefore, the substrates are pushed up by the substrate placement surfaces 131 on the upper ends of the substrate placement parts 129A through 129D and are floated above the substrate support, parts 121 of the tray 115. In other words, the substrates (wafers) 102 accommodated and held in the substrate accommodating holes 119A through 119D of the tray 115 for handling are carried in together with the tray 115 onto the substrate suscepter 109, and the bottom surface 115c of the tray 115 is placed on the tray support surface 128 of the dielectric plate 123 of the substrate suscepter 109, so that the substrates (wafers) 102 are transferred onto the substrate placement regions R of the substrate placement surfaces 131 that are the upper end surfaces of the substrate placement parts 129A through 129D protruding upward from the tray support surface 128 while being floated above the substrate support parts 121 of the tray 115. In the third embodiment, the plurality of substrate placement parts 129A through 129D are formed in the upper surface of the dielectric plate 123, the top surfaces of the substrate placement parts 129A through 129D are made into the substrate placement surfaces 131, i.e., the substrate placement regions R, and the placement region for the tray 115 is provided on the upper surface of the dielectric plate 123 around the substrate placement parts 129A through 129D.

As shown in FIGS. 20A and 20B, connected parts between periphery surfaces 138 of the substrate placement parts 129A through 129D and the substrate placement surfaces 131 are chamfered into round surfaces. Accordingly, outside diameters on upper end side of the substrate placement parts 129A through 129D as seen in a direction of penetration of the substrate accommodating holes 119A through 119D increase from side of the substrate placement surfaces 131 toward the tray support surface 128. On the other hand, outside diameters on lower end side of the periphery surfaces 138 of the substrate placement parts 129A through 129D as seen in the direction of the penetration of the substrate accommodating holes 119A through 119D are uniform.

Figure 24:
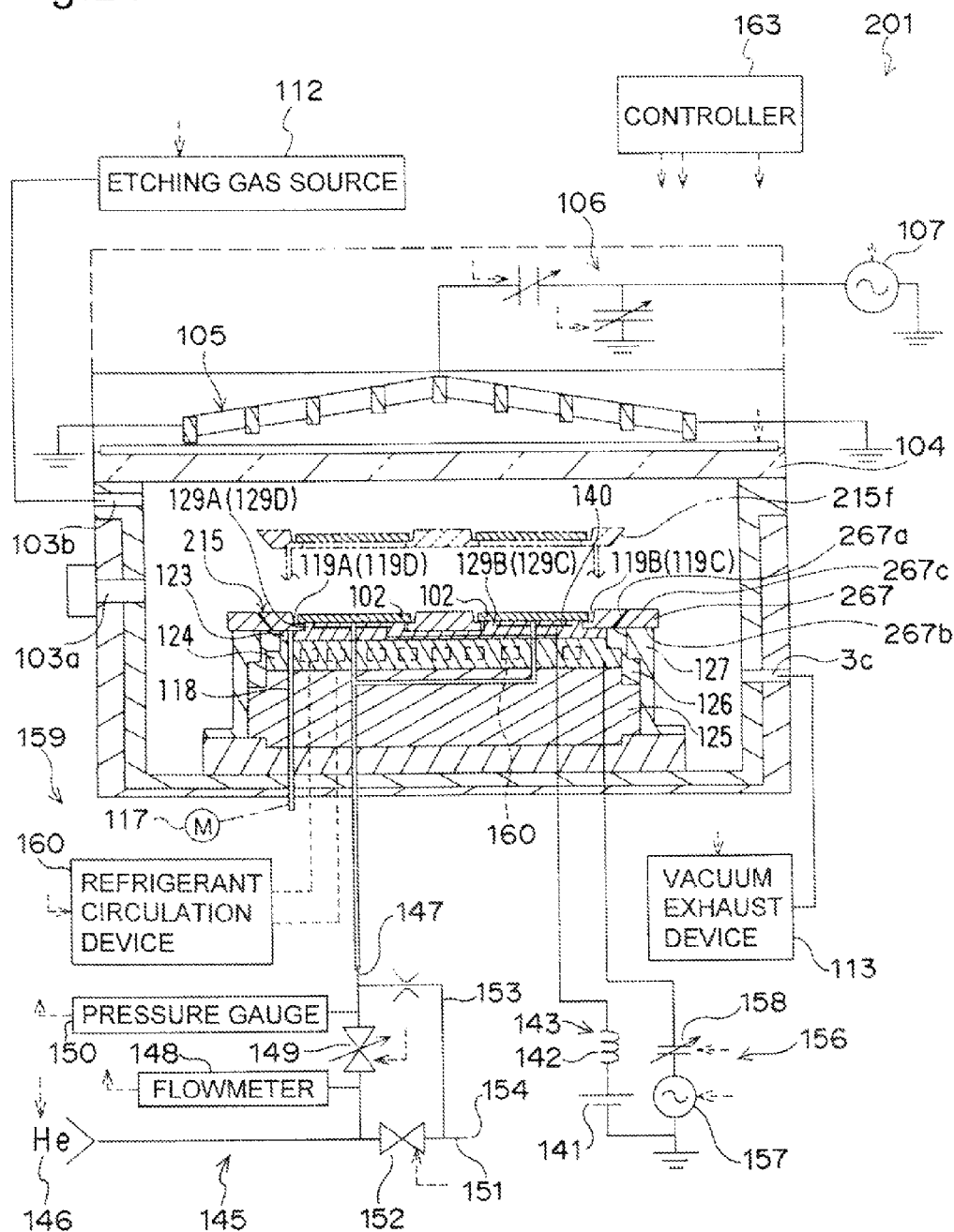
FIG. 24 is a schematic diagram of a plasma processing apparatus in accordance with a modification of the third embodiment of the invention.

As in a plasma processing apparatus 201 as a modification of the third embodiment that is shown in FIG. 24, there may be provided a circular guide plate 267 for positioning a tray 215 with respect to the dielectric plate 123 from the periphery side. The guide plate 267 is fixed to a top surface of the guide cylinder 126 and surrounds the four substrate placement parts 129A through 129D of the dielectric plate 123. An inner periphery surface 267a of the guide plate 267 is a tapered surface extending from a bottom surface 267b toward a top surface 267c. A thickness of the guide plate 267 is set so as to be on the same order as the thickness of the tray 215 in general. For the plasma processing apparatus 201 of the modification shown in FIG. 24, the same component members as those of the plasma processing apparatus 101 in FIG. 17 are designated by the same reference characters and description thereof is omitted.

In the modification of the third embodiment, referring to FIG. 17 in addition, an outer periphery surface 215f of the tray 215 is a tapered surface having outside diameters increasing from a bottom surface 215c toward a top surface 215b. Sizes and shapes of the inner periphery surface 267a of the guide plate 267 and the outer periphery surfaces 215f of the tray 215, including degrees of taper, are determined so that the outer periphery surfaces 215f of the tray 215 is positioned and guided by the inner periphery surface 267a of the guide plate 267 when the bottom surface 215c of the tray 215 is placed on the tray support surface 128.

When the tray 215 is lowered from an elevated position shown by two-dot chain lines in FIG. 24 toward the dielectric plate 123, the outer periphery surfaces 215f of the tray 215 is guided by the inner periphery surface 267a of the guide plate 267. By the insertion of the substrate placement parts 129A through 129D into the substrate accommodating holes 119A through 119D, not only the substrates 102 in the substrate accommodating holes 119A through 119D are positioned with respect to the substrate placement surface 131 of the dielectric plate 123 but also the tray 215 itself holding the substrates 102 is positioned with respect to the dielectric plate 123 by the guide plate 267. As a result, an accuracy of the positioning of the substrates 102 with respect to the substrate placement surface 131 of the dielectric member 123 can further be improved.

In the plasma processing apparatus 101 of the third embodiment, referring to FIG. 17, unipolar type electrodes (one example of electrostatic chuck) 140 for electrostatic attraction are embedded in vicinity of the substrate placement surfaces 131 of the substrate placement parts 129A through 129D of the dielectric plate 123. The electrodes 140 for electrostatic attraction are electrically insulated from one another, and a DC voltage for electrostatic attraction is applied thereto from a common DC voltage applying mechanism 143 including a DC power supply 141, a resistor 142 for adjustment and the like.

Referring to FIGS. 18A and 18B, a supply port 144 for heat transfer gas (helium in the third embodiment) is provided on the substrate placement surface 131 of each of the substrate placement parts 129A through 129D. The supply ports 144 are connected to a common heat transfer gas supply mechanism 145 (shown in FIG. 17). The heat transfer gas supply mechanism 145 has a heat transfer gas source (helium gas source in the third embodiment) 146, a supply channel 147 extending from the heat transfer gas source 146 to the supply port 144, flowmeters 148 provided in the supply channel 147 sequentially from side of the heat transfer gas source 146, a flow control valve 149, and a pressure gauge 150. Additionally, the heat transfer gas supply mechanism 145 has a discharge channel 151 branching from the supply channel 147, and a cutoff valve 152 provided in the discharge channel 151. The heat transfer gas supply mechanism 145 further has a bypass channel 153 connecting a portion of the supply channel 147, extending toward the supply port 144 with respect to the pressure gauge 150, and the discharge channel 151. The heat transfer gas is supplied by the heat transfer gas supply mechanism 145 to between the substrate placement surfaces 131 of the substrate placement parts 129A through 129D and the lower surfaces 102a of the substrates 102, particularly, into closed spaces enclosed by the lower surfaces 102a of the substrates 102 and the circular protruding parts 132. During the supply of the heat transfer gas, the cutoff valve 152 is closed and the heat transfer gas is delivered from the heat transfer gas source 146 through the supply channel 147 to the supply port 144. A controller 163 that will be described later controls the flow control valve 149 on basis of flow rates and a pressure in the supply channel 147 that are detected by the flowmeters 148 and the pressure gauge 150. During the discharge of the heat transfer gas, on the other hand, the cutoff valve 152 is opened and the heat transfer gas between the lower surfaces 102a of the substrates 102 and the substrate placement surfaces 131 is discharged from a discharge port 154 through the supply port 144, the supply channel 147 and the discharge channel 151.

A high-frequency applying mechanism 156 for applying high frequency is electrically connected to the metal plate (lower electrode) 124 as bias voltage. The high-frequency applying mechanism 156 has a high-frequency power supply (high-frequency power supply for lower electrode) 157 and a variable capacitor 158 for matching.

There is also provided a cooling mechanism 159 for cooling the metal plate 124. The cooling mechanism 159 has a refrigerant channel 160 formed in the metal plate 124 and a refrigerant circulation device 161 for circulating refrigerant, having a temperature controlled, in the refrigerant channel 160.

On basis of various sensors including the flowmeters 148 and the pressure gauge 150, operational input or the like, the controller (control device) 163 schematically shown only in FIG. 17 controls operations of the whole plasma processing apparatus 101 including the high-frequency power supply 107, the etching gas supply 112, the carrier arm, the vacuum exhaust device 113, the driving device 117, the DC voltage applying mechanism 143, the heat transfer gas supply mechanism 145, the high-frequency voltage applying mechanism 156, and the cooling mechanism 159. The controller 163 is capable of controlling the thrust-up force detecting operation in which the thrust-up force caused by the thrust-up operations of thrust-up pins 118 against the tray 115 by the driving device 117 is detected through the load cell 190. The controller 163 is further capable of controlling the driving device 117 to drive the thrust-up pins 118 by a desired quantity of driving, that is, to elevate the thrust-up pins 118 to a desired height.

Hereinbelow will be described a method of performing plasma processing for the substrates 102 held by the tray 115 in the plasma processing apparatus 101 of the third embodiment.

Initially, a substrate 102 is accommodated in each of the substrate accommodating holes 119A through 119D of the tray 115. In view from the side of the bottom surface 115c of the tray body 115a, the substrates 102 supported by the substrate support parts 121 of the tray 115 are exposed from the bottom surface 115c of the tray body 115a through the substrate accommodating holes 119A through 119D.

Subsequently, the tray 115 having the substrates 102 accommodated in the substrate accommodating holes 119A through 119D is supported by the carrier arm and is carried from the load dock chamber through the gate 103a into the chamber 103. As shown by the two-dot chain lines in FIG. 17, the tray 115 is positioned with a space provided above the substrate suscepter 109.

Then the thrust-up pins 118 driven by the driving device 117 are elevated, and the tray 115 is transferred from the carrier arm onto the upper ends of the thrust-up pins 118. After the tray 115 is transferred, the carrier arm is evacuated into the load lock chamber and the gate 103a is closed.

Then the thrust-up pins 118 supporting the tray 115 on the upper ends thereof are lowered from the elevated position shown by the two-dot chain lines in FIG. 17 toward the substrate suscepter 109. Referring to FIGS. 20A and 20B, the bottom surface 115c of the tray 115 is lowered onto the tray support surface 128 of the dielectric plate 123 of the substrate suscepter 109, so that the tray 115 is supported by the tray support surface 128 of the dielectric plate 123. When the tray 115 is lowered toward the tray support surface 128, the substrate placement parts 129A through 129D protruding upward from the tray support surface 128 of the dielectric plate 123 enter into the corresponding substrate accommodating holes 119A through 119D of the tray 115 from the side of the bottom surface 115c of the tray 115. As the bottom surface 115c of the tray 115 approaches the tray support surface 128, the substrate placement surfaces 131 on the upper ends of the substrate placement parts 129A through 129D advance in the substrate accommodating hole 119A through 119D toward the top surface 115b of the tray 115. When the bottom surface 115c of the tray 115 is placed on the tray support surface 128 of the dielectric plate 123, as shown in FIG. 20B, the substrates 102 in the substrate accommodating holes 119A through 119B are lifted up by the substrate placement parts 129A through 129D from the top faces 121a of the substrate support parts 121. Particularly, the lower surfaces 102a of the substrates 102 are placed on the substrate placement surfaces 131 of the substrate placement parts 129A through 129D, and the lower surfaces 102a are spaced apart from and are positioned above the top faces 121a of the substrate support parts 121 of the tray 115.

By such entrance of the substrate placement parts 129A through 129D into the substrate accommodating holes 119A through 119D of the tray 115, the substrates 102 are floated up from the substrate support parts 121 of the tray 115, transferred therefrom onto the substrate placement surfaces 131 that are the upper end surfaces of the substrate placement parts 129A through 129D protruding upward from the tray support surface 128, and directly placed on the substrate placement surfaces 131. Accordingly, the four substrates 102 accommodated in the tray 115 are placed on the substrate placement surfaces 131 of the substrate placement parts 129A through 129D with a high positioning accuracy for all the substrates. The connected parts between the periphery surfaces 138 of the substrate placement parts 129A through 129D and the substrate placement surfaces 131 are chamfered into the round surfaces, and thus the chamfered parts of the substrate placement parts 129A through 129D will come into contact with the extremity surfaces 121b of the substrate support parts 121 even if there are minute deviations between positions of the substrate accommodating holes 119A through 119D and those of the substrate placement parts 129A through 129D in plan view. As a result, the substrate placement parts 129A through 129D are inserted smoothly and reliably into the substrate accommodating holes 119A through 119D. In this regard also, the substrates 102 are placed on the substrate placement surfaces 131 with a high positioning accuracy.

Subsequently, electrostatic attracting forces are produced by application of a DC voltage from the DC voltage applying mechanism 143 to the electrodes 140 for electrostatic attraction that are embedded in the plurality of the substrate placement parts 129A through 129D protruding upward from the tray support surface 128 of the dielectric plate 123, and the substrates 102 transferred onto the substrate placement regions R of the substrate placement surfaces 131 on the substrate placement parts 129A through 129D are held by electrostatic attraction. The lower surfaces 102a of the substrates 102 are directly placed on the substrate placement surfaces 131 without interposition of the tray 115. Therefore, the substrates 102 are held on the substrate placement surfaces 131 with a high degree of adhesion.

Subsequently, the heat transfer gas is supplied from the heat transfer gas supply device 145 through the supply ports 144 to the spaces enclosed by the circular protruding parts 132 of the substrate placement parts 129A through 129D and the lower surfaces 102a of the substrates 102, and the spaces are filled with the heat transfer gas such as He gas.

After that, etching gas is supplied from the etching gas supply 112 into the chamber 103, and inside of the chamber is kept at a specified pressure by the vacuum exhaust device 113. Subsequently, a high-frequency voltage is applied from the high-frequency power supply 107 to the ICP coil 105 and a bias voltage is applied to the metal plate 124a of the substrate suscepter 109 by the high-frequency applying mechanism 156, so as to produce plasma in the chamber 103. The substrates 102 are etched by the plasma. In the example of the third embodiment, four substrates 102 can be placed on the substrate suscepter 109 with use of one tray 115, so that batch processing can be performed.

During the etching, the refrigerant is circulated through the refrigerant channel 160 by the refrigerant circulation device 161 so as to cool the metal plate 124 and so as to thereby cool the dielectric plate 123 and the substrates 102 held on the substrate placement surfaces 131 of the dielectric plate 123. As described above, the lower surfaces 102a of the substrates 102 are directly placed on the substrate placement surfaces 131 without interposition of the tray 115 and the substrates 102 are held with the high degree of adhesion. This leads to a high degree of sealing of the spaces enclosed by the circular protruding parts 132 and the lower surfaces 102a of the substrates 102 and filled with the heat transfer gas and a satisfactory heat conductivity between the substrates 102 and the substrate placement surfaces 131 through He gas, that is, the heat transfer gas. Consequently, the substrates 102 held on the substrate placement surfaces 131 of the substrate placement parts 129A through 129D can be cooled with a high cooling efficiency and temperatures of the substrates 102 can be controlled with a high accuracy. The spaces enclosed by the circular protruding parts 132 of the substrate placement parts 129A through 129D and the lower surfaces 102a are separately filled with the heat transfer gas, for the individual substrates 102. In other words, the spaces filled with the heat transfer gas differ among the individual substrates 102. In this regard also, the heat conductivity is made satisfactory between the individual substrates 102 and the substrate placement surfaces 131 of the dielectric plate 123, so that a high cooling efficiency and the temperature control with a high accuracy can be achieved.

The substrates 102 are directly placed on and electrostatically attracted by the substrate placement surfaces 131 of the substrate placement parts 129A through 129D that are formed so as to protrude, as described above, so that the high degree of adhesion to the substrate placement surfaces 131 is attained. Therefore, there is no necessity for members such as clamp ring for mechanically pressing periphery parts of the upper surfaces of the substrates 102 with respect to the dielectric plate 123. In other words, such members as may cause an instable plasma state are absent from not only the center parts but also vicinity of the periphery on the upper surfaces of the substrates 102. Accordingly, uniform plasma processing can be attained on the whole area of the surfaces of the substrates 102 including the vicinity of the periphery.

For the substrates (wafers) 102 held by the tray 115 for handling may be used substrates with GaN epitaxially grown on sapphire substrates (GaN/sapphire substrates), GaN/GaN substrates, GaN/SiC substrates, GaN/Si substrates, or sapphire substrates for LED, LD and the like of blue or white, for instance. Dominant sizes of these substrates are as small as about 2 to 3 inches and, particularly, GaN/sapphire substrates require the electrodes (ESC electrodes) 140 for electrostatic attraction that produce great electrostatic attracting forces for holding the substrates 102 by electrostatic attraction because insulative sapphire substrates are used for the substrates 102.

For reliable electrostatic attraction (ESC attraction) of the GaN/sapphire substrates and cooling of the substrates 102 with high efficiency with the spaces, between wide areas of the lower surfaces 102a of the substrates 102 and the substrate placement surfaces 131 of the substrate placement parts 129A through 129D, filled with He gas as the heat transfer gas for cooling the substrates 102, preferably, a faint leakage current on the order of several tens of micro-amperes to several hundred micro-amperes is produced by application of a high voltage with use of monopolar (unipolar type) electrodes 140 for electrostatic attraction of low resistance type (with a volume resistivity (25° C.) of $10^{10}$ to $10^{11}$ Ω·cm), so that the electrostatic attraction for the substrates by greater Coulomb force and/or Johnson-Rahbeck force is attained. Specifically, the electrostatic attraction is preferably performed as follows.

Initially, the spaces enclosed by the circular protruding parts 132 of the substrate placement parts 129A through 129D and the lower surfaces 102a of the substrates 102 are filled with He gas that is the heat transfer gas for cooling the substrates 102. On the parts of the substrate placement surfaces 131 surrounded by the circular protruding parts 132, the plurality of columnar protrusions 133 that have the diameters sufficiently smaller than the substrate placement surfaces 131 have are provided so as to be distributed uniformly. The quantities by which the columnar protrusions 133 and the circular protruding parts 132 protrude from the substrate placement surfaces 131 are substantially the same, so that the upper end surfaces of not only the circular protruding parts 132 but also the columnar protrusions 133 support the lower surfaces 102a of the substrates 102. A ratio of contact areas of the substrate placement parts 129A through 129D with respect to the lower surfaces 102a of the substrates 102 is 5 to 30%, preferably 10 to 20%. The larger the ratio of the contact areas between the substrates 102 and the substrate placement surfaces 131, the greater the electrostatic attracting forces for the substrates 102, while the smaller areas of the spaces filled with the heat transfer gas and the lower a capacity to cool the substrates 102.

In order to increase the electrostatic attracting forces by decrease in the ratio of the contact areas, the leakage current that locally flows is preferably increased, and the plurality of island-shaped columnar protrusions 133 having small contact areas preferably reside on portions of contact parts of the substrate placement surfaces 131 with respect to the lower surfaces 102a of the substrates 102 which portions are surrounded by the circular protruding parts 132 of the substrate placement surfaces 131. For electrostatic attraction for such substrates of sapphire, glass or the like as have high insulation resistance values, particularly, a high voltage is preferably applied into the substrate placement parts composed of ceramics material having a low resistance value, with use of unipolar type electrostatic attraction electrodes. This causes charge polarization in the substrate placement parts composed of ceramics material having the low resistance value, so that the holding by electrostatic attraction can be attained with exertion of strong Coulomb forces between the surfaces of the substrate placement surfaces and the substrates. In consideration of the above, the substrate placement surfaces 131 are preferably provided with the plurality of island-shaped columnar protrusions 133 that are configured so as to have the ratio of contact area of 10 to 20% for the contact with the lower surfaces 102a of the substrates 102, that are provided in the spaces surrounded by the circular protruding parts 132, and that have small contact areas. A distance between the electrodes 140 for electrostatic attraction embedded in the substrate placement parts 129A through 129D and the substrate placement surfaces 131 for placement and support of the lower surfaces 102a of the substrates 102 is 0.2 to 1.0 mm, preferably 0.3 to 0.8 mm. The distance had better be decreased in order to strengthen the electrostatic attracting forces, whereas the decrease in the distance causes deterioration in dielectric strength. In order to ensure the dielectric strength on the order of 26.0 KV with the applied voltage of 3.0 KV at maximum for greater electrostatic attracting forces, the distance between the electrodes 140 for electrostatic attraction and the substrate placement surfaces 131 for placement and support of the lower surfaces 102a of the substrates 102 is preferably set to be 0.3 to 0.8 mm. For formation of the spaces to be filled with the heat transfer gas between the lower surfaces 102a of the substrates 102 and the substrate placement surfaces 131, the substrate placement surfaces 131 are formed as the circular protruding parts 132 for conformation to the wafer-like substrates, whereas the surfaces may be formed as quadrilateral or polygonal protruding parts for conformation to quadrilateral substrates. Though such an apparatus as described above makes the remaining attracting forces greater, the GaN/sapphire substrates can be released by operations of releasing the substrates 102 from the substrate placement regions R of the substrate placement surfaces 131 which operations will be described later.

In order to ensure an accuracy of the positioning of the substrates 102 with respect to the substrate placement surfaces 131 and to prevent the plasma from flowing to the side of the lower surfaces 102a of the substrates 102 in the etching processing, preferably, clearance δ1 between the periphery of, the substrates 102 and the hole walls 115d of the substrate accommodating holes 119A through 119D is on the order of 0.1 to 0.2 mm, a clearance δ2 between the lower, surfaces 102a of the substrates 102 and the top faces 121a of the substrate support parts 121 of the tray 115 is on the order of 0.2 to 0.3 mm, and a clearance δ3 between the side walls of the substrate placement parts 129A through 129D and the extremities of the substrate support parts 121 is on the After the etching is completed, the application of the high-frequency voltage from the high-frequency power supply 107 to the ICP coil 105 and the application of the bias voltage from the high-frequency applying mechanism 156 to the metal plate 124 are ceased. Subsequently, the etching gas is exhausted from the chamber 103 by the vacuum exhaust device 113. On the other hand, the heat transfer gas is exhausted from the substrate placement surfaces 131 and the lower surfaces 102a of the substrates 102 by the heat transfer gas supply mechanism 145. Besides, the application of the DC voltage from the DC voltage applying mechanism 143 to the electrodes 140 for electrostatic attraction is ceased, so that the electrostatic attraction for the substrates 102 is released. After that, the operations of releasing the substrates 102 from the substrate placement regions R of the protruding substrate placement surfaces 131 are performed by the thrust-up operations of the thrust-up pins 118 against the tray 115 as will be described later. Details of the releasing operations will be described later.

After that, the tray 115 holding the substrates 102 is supported on the upper ends of the thrust-up pins 118 moved up to the elevated position by the driving device 117. The tray 115 is thereafter transferred onto the carrier arm having entered from the load lock chamber through the gate 103a into the chamber 103. The tray 115 is carried out to the load lock chamber by the carrier arm. This results in completion of the plasma processing for the substrates 102 held by the tray 115.

Figure 21A:
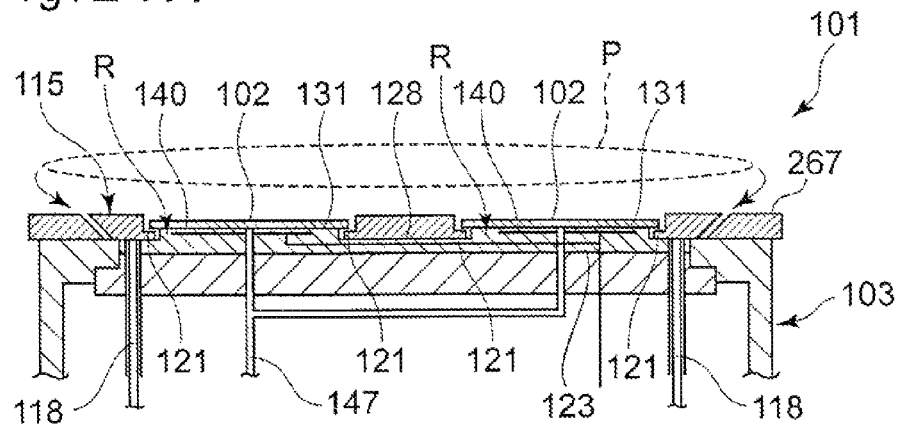
FIG. 21A is a schematic illustration of an operation of releasing substrates in the plasma processing apparatus of the third embodiment.
Figure 21B:
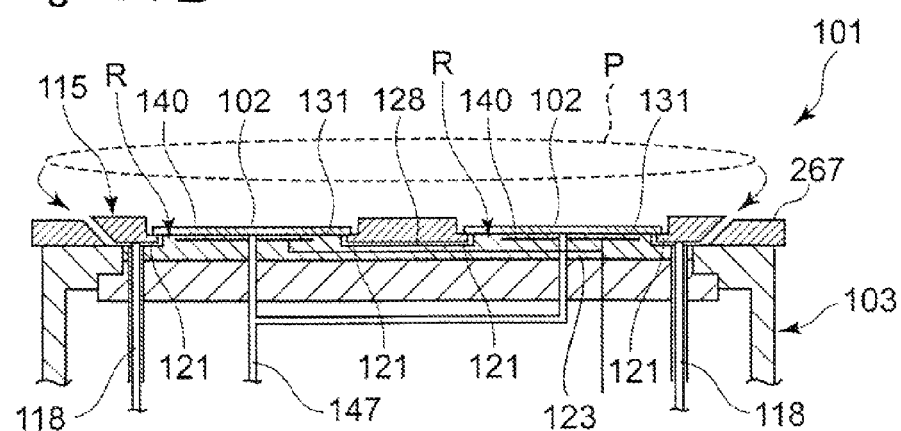
FIG. 21B is a schematic illustration of the operation of releasing the substrates in the plasma processing apparatus of the third embodiment.
Figure 21C:
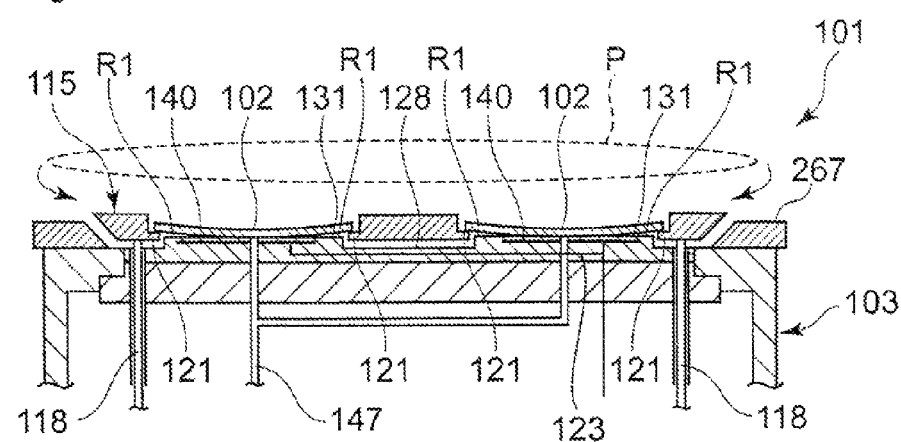
FIG. 21C is a schematic illustration of the operation of releasing the substrates in the plasma processing apparatus of the third embodiment.
Figure 22:
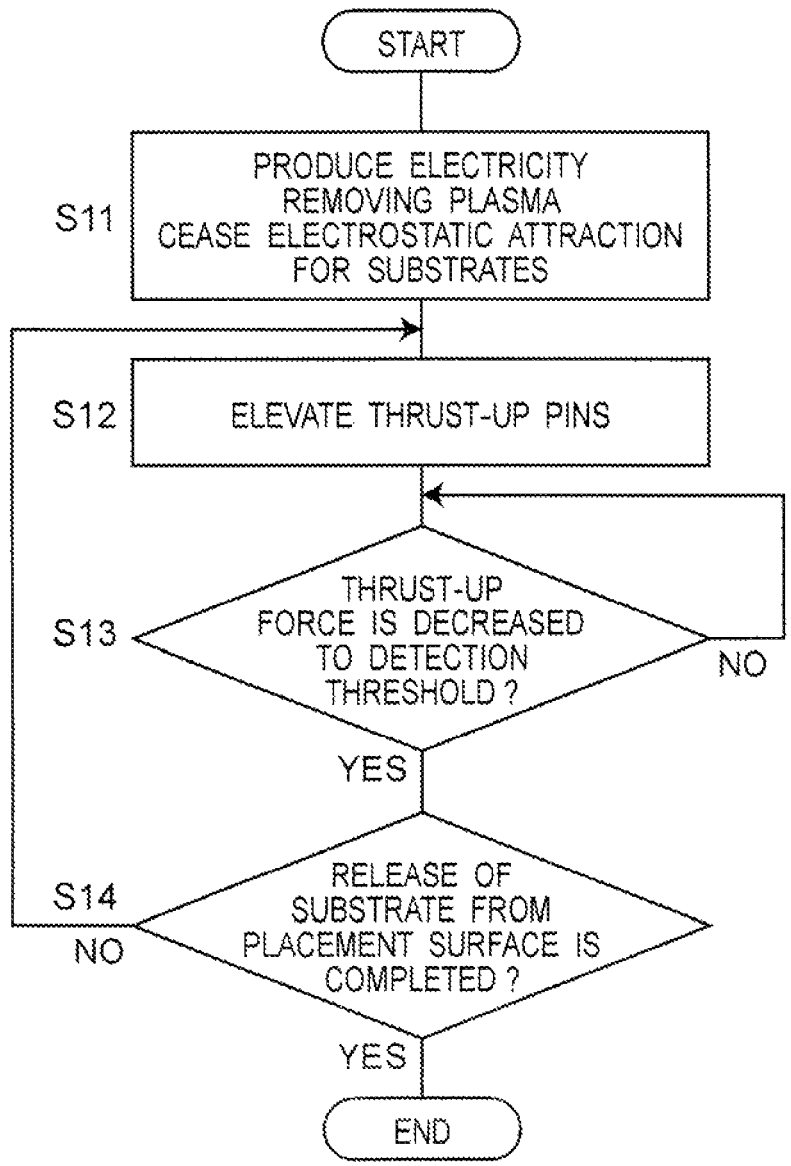
FIG. 22 is a flow chart of the operation of releasing the substrates in accordance with the third embodiment.
Figure 23:
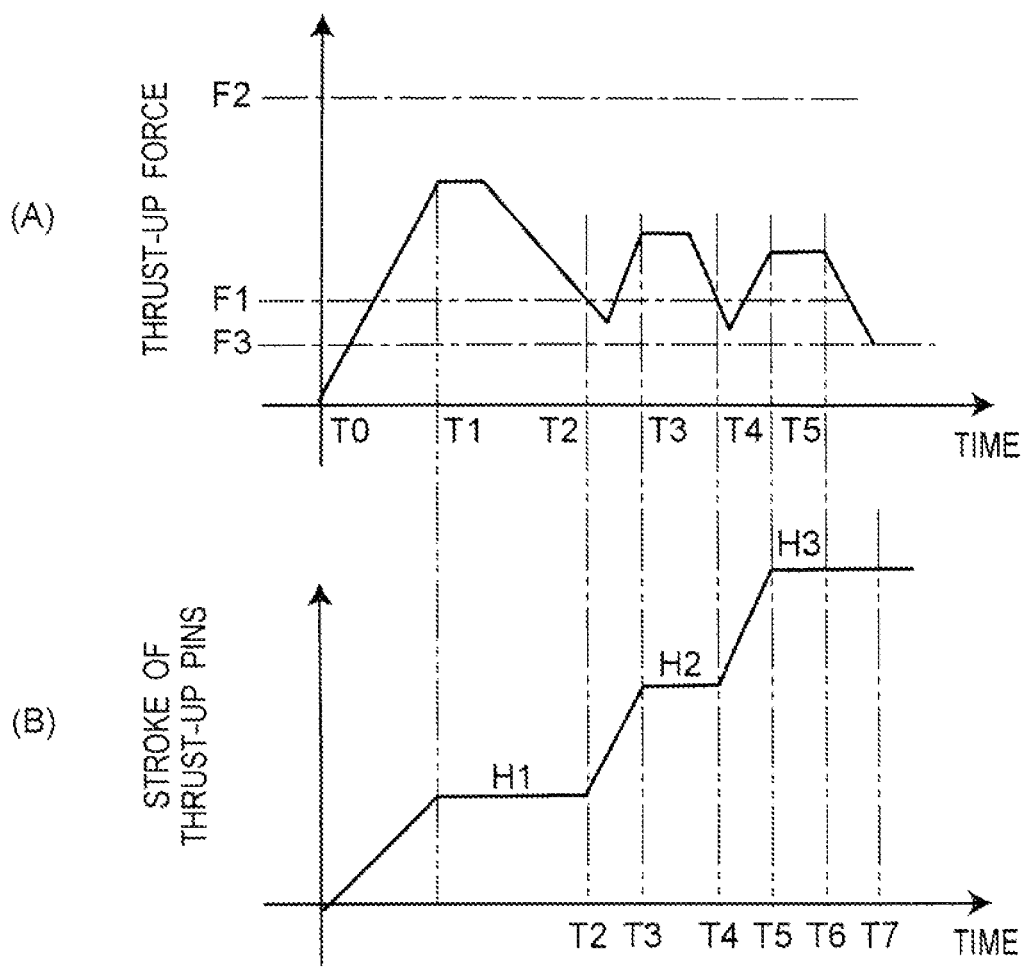
FIG. 23(A) is a graph illustrating change in thrust-up force in the substrate releasing operation of FIG. 22.
FIG. 23(B) is a graph illustrating change in stroke of thrust-up pins therein.

Hereinbelow will be described the operations for releasing the substrates 102, having undergone the completion of the plasma processing, from the substrate placement surfaces 131 in the plasma processing apparatus 101 that performs the plasma processing for the four substrates 102 held by the tray 115. For description of that, FIGS. 21A through 21E show schematic illustrations for the operations of the plasma processing apparatus 101, FIG. 22 shows a flow chart of procedures of the release operations, and FIG. 23 show graphs illustrating temporal change in thrust-up force (reaction force) and thrust-up stroke of the thrust-up pins 118. For the schematic illustrations shown in FIGS. 21A through 21E, the description will be given with reference to an example in which the guide plate 267 used in the plasma processing apparatus 201 of the modification described above is used in the plasma processing apparatus 101.

Initially, the application of the DC voltage from the DC voltage applying mechanism 143 to the electrodes 140 for electrostatic attraction is ceased so that the electrostatic attraction for the substrates 102 by the electrostatic attracting forces is ceased, and the electricity removing plasma is produced that is comparatively weak plasma for removing the residual electrostatic attracting forces existing between the substrates 102 and the substrate placement surfaces 131 in the inner space of the chamber 103 (step S11 in the flow chart of FIG. 22). Then the substrates 102 are being held on the substrate placement regions R of the substrate placement surfaces 131 by the residual electrostatic attracting forces, as shown in FIG. 21A, and thus the produced electricity removing plasma cannot enter between the substrates 102 and the placement surfaces 131 in such a condition.

In a time segment T0-T1 shown in FIG. 23(A), subsequently, the thrust-up pins 118 are integrally elevated by the driving device 117 so as to be protruded upward from the tray support surface 128 (step S12). As shown in FIG. 21B, consequently, the tray 115 is thrust up by the thrust-up pins 118 and is lifted up from the tray support surface 128. In this state, the top faces 121a of the substrate support parts 121 of the tray 115 are in contact with the periphery parts of the lower surfaces of the substrates 102 held on the substrate placement surfaces 131. As the thrust-up pins 118 are integrally elevated by the driving device 117, the whole tray 115 is further thrust up by the thrust-up pins 118, and the periphery parts of the substrates 102 are lifted up by the substrate support parts 121 of the tray 115, as shown in FIG. 21C. Consequently, the substrates 102 are partially released from the outer regions R1 in the substrate placement regions R of the substrate placement surfaces 131.

As shown in the graph of FIG. 23(A) illustrating the change in the thrust-up force and the graph of FIG. 23(B) illustrating the change in the stroke of the thrust-up pins 118, the thrust-up (elevating) operations of the thrust-up pins 118 by the driving device 117 are performed while the thrust-up force detected by the load cell 190 is referred to. Specifically, the thrust-up operations are performed while the thrust-up stroke of the thrust-up pins 118 is adjusted so that the thrust-up forces given indirectly to the substrates 102 come into a load range that does not exceed a limit load F2 for prevention of damages such as fracture and positional deviation such as flap of the substrates 102 and that exceeds a detection threshold F1 being a reference load for commencement of the second thrust-up operation. As a result, the extremities (upper ends) of the thrust-up pins 118 are positioned at a stroke (or height) H1.

Thus the whole tray 115 is lifted upward from the tray support surface 128 and the periphery parts of the substrates 102 are released from the protruding substrate placement surfaces 131 so that the electricity removing plasma P produced in the inner space of the chamber 103 can enter between the tray 115 and the tray support surface 128 and so that the electricity removing plasma having entered can enter between the substrates 102 and the substrate placement surfaces 131. In a time segment T1-T2, consequently, the residual electrostatic attracting forces existing between the substrates 102 and the substrate placement surfaces 131 are reduced on the surfaces brought into contact with the electricity removing plasma P, so that the release (exfoliation) of the substrates 102 from the substrate placement surfaces 131 is promoted so as to spread from outside toward inside of the substrates 102.

In the time segment T1-T2, the detection of the thrust-up force by the load cell 190 is continued, and whether the detected thrust-up force is decreased to the detection threshold F1 is also detected (step S13).

Once the load cell 190 thereafter detects the decrease in the thrust-up force of the thrust-up pins 118 to the detection threshold F1 at the time T2, the thrust-up operation by the driving device 117 is resumed (step S12) on condition that the substrates 102 are not completely released from the substrate placement surfaces 131 (step S14). Specifically, the thrust-up pins 118 are integrally further elevated by the driving device, e.g., in a time segment T2-T3 shown in FIG. 23(A). By the thrust-up operation, the extremities of the thrust-up pins 118 are positioned at a stroke H2.

Figure 21D:
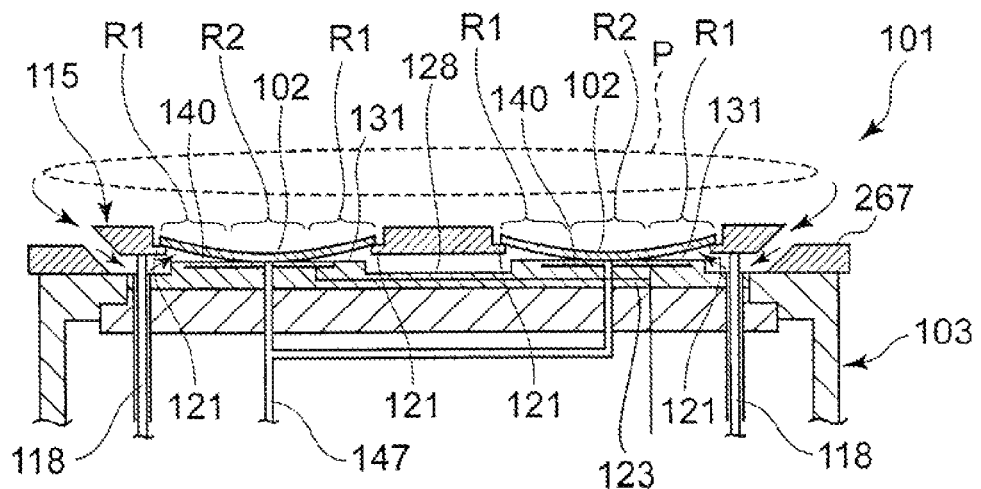
FIG. 21D is a schematic illustration of the operation of releasing the substrates in the plasma processing apparatus of the third embodiment.

By the thrust-up operation in which the thrust-up pins 118 are further thrust up, the whole tray 115 can further be thrust up by the thrust-up pins 118 so as to lift up the periphery parts of the substrates 102, as shown in FIG. 21D, and the substrates 102 can completely or partially be released from the protruding substrate placement surfaces 131 in the inner regions R2 in the substrate placement regions R of the substrate placement surfaces 131. In a condition of the partial release, the electricity removing plasma P having entered gaps between the tray 115 and the tray support surface 128 can be made to further enter between the substrates 102 and the substrate placement surfaces 131 so as to decrease the residual electrostatic attracting forces, and thus the release of the substrates 102 is further promoted.

On condition that the substrates 102 are not completely released from the substrate placement surfaces 131 by the second thrust-up operation, a thrust-up operation by the thrust-up pins 118 is performed afresh in a time segment T4-T5 after the thrust-up force of the thrust-up pins 118 is decreased to the detection threshold F1. As a result, the extremities of the thrust-up pins 118 are positioned at a stroke H3.

Figure 21E:
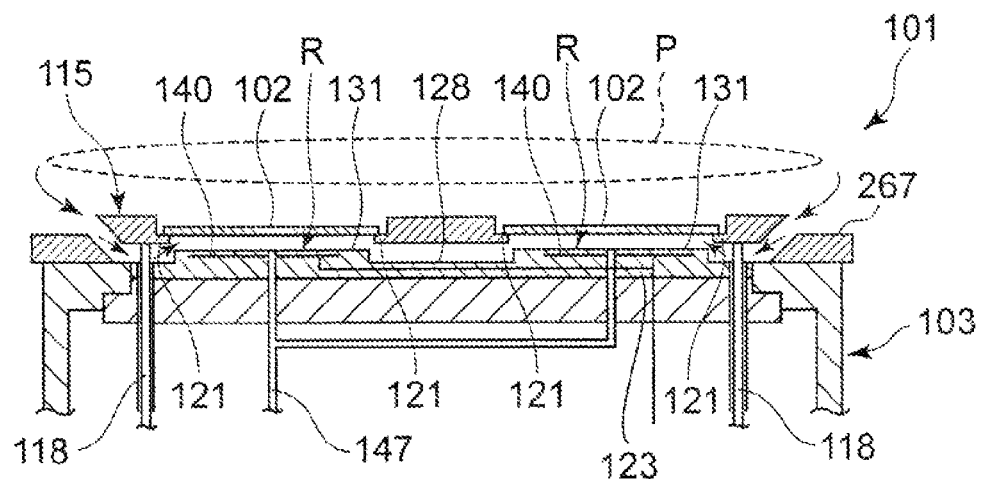
FIG. 21E is a schematic illustration of the operation of releasing the substrates in the plasma processing apparatus of the third embodiment.

On condition that the substrates 102 are not yet completely released from the substrate placement surfaces 131 by the third thrust-up operation, a thrust-up operation by the thrust-up pins 118 is performed in time segments posterior to T6, after the thrust-up force of the thrust-up pins 118 is decreased to the detection threshold F1, for instance. Once it is verified that the substrates 102 are completely released from the substrate placement surfaces 131 (step S14), as shown in FIG. 21E, the thrust-up operations for the release of the substrates 102 from the substrate placement surfaces 131 are completed. The complete release of the substrates 102 from the substrate placement surfaces 131 can be verified by any one, a combination of plurality or the like of a fact that the thrust-up force detected by the load cell 190 makes a load corresponding to a total self-weight of the substrates 102 and the tray 115, detection of a fact that the thrust-up force is not larger than a release threshold F3 indicating the release of the substrates 102 from the substrate placement surfaces 131, and a fact that the stroke of the thrust-up pins 118 reaches a specified stroke, for instance.

When the plurality of substrates 102 held by the tray 115 are released from the substrate placement surfaces 131, the whole tray 115 can be lifted up from the tray support surface 128 with use of the plurality of thrust-up pins 118 that are concentrically arranged and the periphery parts of the substrates 102 can be lifted up by the substrate support parts 121 of the lifted tray 115. That is, the plurality of substrates 102 held by the tray 115 and having a comparatively small diameter can indirectly be thrust up (lifted up) through the tray 115 without being directly lifted up by the thrust-up pins 118. Therefore, the operations of the release of the plurality of substrates 102 from the substrate placement surfaces 131 can be performed without complicated configuration of the apparatus. The thrust-up operations of the thrust-up pins 118 against the tray 115 are stepped operations in which the operation of elevating the thrust-up pins 118 is repeated with detection of the thrust-up force, and thus the substrates 102 can stably be released from the substrate placement surfaces 131 without occurrence of damages, positional deviation and the like in the substrates 102 even in presence of great residual electrostatic attracting forces.

With use of the electricity removing plasma in such indirect thrust-up operations through the tray 115, the release of the substrates 102 can be promoted by the penetration of the electricity removing plasma between the tray 115 lifted up and the tray support surface 128 and by the gradual penetration of the electricity removing plasma, having penetrated, from outside toward inside of the substrates 102.

In the plasma processing apparatus 101 of the third embodiment also, the plasma processing for the substrates 102 can be performed with suppression of increase in the electrostatic attracting forces imparted to the substrates 102, as is the case with the plasma processing apparatus 50 of the second embodiment. That is, the residual electrostatic attracting forces that exist when the substrates 102 are released can be reduced by the stepwise decrease in the voltage applied from the DC voltage applying mechanism 143 to the electrodes 140 for electrostatic attraction, for instance, after the substrates 102 are reliably attracted to and held on the substrate placement surfaces 131 by the electrostatic attracting forces in the plasma processing. The plasma processing apparatus 101 of the third embodiment is not intended only for such stepwise control over the voltage applied to the electrodes 140 for electrostatic attraction. That is, the operations of releasing the substrates can be performed while occurrence of damages or the like in the substrates 102 is suppressed, even in the plasma processing apparatus 101 of the third embodiment in which only the operations of releasing the substrates by the stepwise elevation of the thrust-up pins 118 are performed without the stepwise control over the voltage applied to the electrodes 140 for electrostatic attraction.

Though the example in which the thrust-up pins 118 are concentrically arranged so as to be capable of uniformly thrusting up the periphery part of the tray 115 has been described in the above description, various manners may be employed for the arrangement of the thrust-up pins. In particular, the third embodiment employs the releasing method in which the substrates 102 are indirectly lifted up by the thrust-up of the tray 115 formed of material that can neither be attracted nor held (resists being attracted and held) on the tray support surface 128 by the electrostatic attracting forces. The tray 115 itself is formed of the material and in a shape that resist having flexure in comparison with the substrates 102. Therefore, the thrust-up pins 118 have only to be arranged so that generally uniform thrust-up forces are applied onto the tray 115, and the thrust-up pins 118 may be arranged so as to thrust up vicinity of the center of the tray 115, for example. In addition to the thrust-up pins for thrusting up the outer periphery part of the tray 115, thrust-up pins for thrusting up an inside region thereof may be provided for stable thrust-up operation for the tray 115 having a comparatively large diameter (e.g., a diameter not smaller than 300 mm).

Though the timing of the production of the electricity removing plasma is precedent to the commencement of the operations of thrusting up the substrates 102 or the tray 115 in the above description, the electricity removing plasma may be produced after the commencement of the thrust-up operations unless the release of the substrates 102 from the placement surfaces is adversely affected.

Fourth Embodiment

Hereinbelow will be described a plasma processing apparatus in accordance with a fourth embodiment of the invention. Prior to description of a configuration of the plasma processing apparatus of the fourth embodiment, a configuration of a conventional wafer holding device that holds wafers by electrostatic attraction will be described.

In a plasma processing apparatus for performing plasma processing for wafers such as semiconductor wafers (formed of Si, compounds or the like), the plasma processing such as etching on the wafers is conducted with the wafers placed and held on a placement surface of a wafer holding device provided in a processing vessel. In such a wafer holding device, an electrostatic chuck, which is commonly referred to as "ESC (Electrostatic Chuck)," is embedded in the placement surface, and the wafers are held with use of electrostatic attracting forces composed of Coulomb forces and/or Johnson-Rahbeck forces that are produced by the electrostatic chuck.

A structure of an ESC used in such a conventional plasma processing apparatus will be described with reference to a schematic illustration shown in FIG. 33.

Figure 33:
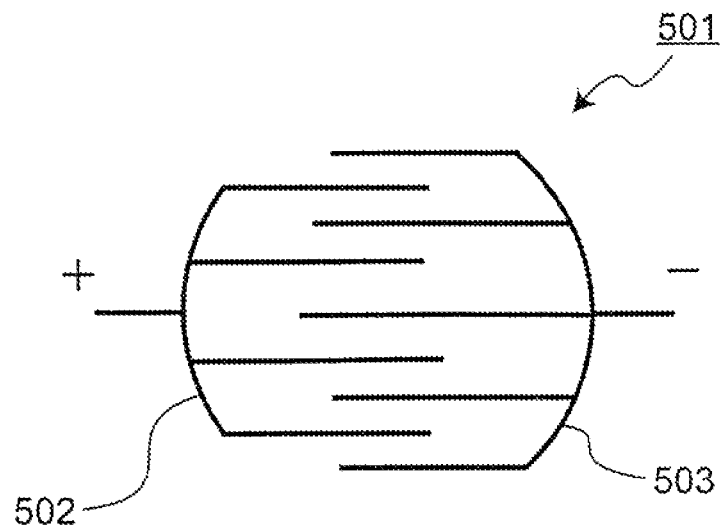
FIG. 33 is a schematic diagram illustrating a configuration of a conventional ESC.

As shown in FIG. 33, an ESC 501 is embedded in a placement surface of a wafer holding device. The ESC 501 has a first electrode 502 that is generally shaped like a comb from a plurality of strip-like electrodes extending from one side to the other side in plan view, and a second electrode 503 that is generally shaped like a comb from a plurality of strip-like electrodes extending from the other side to the one side. In the ESC 501, the first and second electrodes 502, 503 are arranged in a combined state without contact with each other so that end portions of the strip-like electrodes on the one side are positioned between the strip-like electrodes on the other side.

When a wafer placed on the placement surface is held by electrostatic attraction by the conventional ESC 501, electrostatic attracting forces are produced by application of a positive voltage to the first electrode 502 and application of a negative voltage to the second electrode 503, and the wafer is held on the placement surface by the produced electrostatic attracting forces, for instance. For such a conventional ESC, various proposals have been made for equalizing the electrostatic attracting forces on the placement surface (see JP 3527823 B2, for instance).

In such a conventional wafer holding device, however, electrostatic attracting forces (which will be referred to as "residual electrostatic attracting forces" below) remain through agency of electric charge accumulated on the placement surface and the wafer even after the electrostatic attraction by the ESC is ceased. This causes a problem in that the residual electrostatic attracting forces may block the wafer from being released from the placement surface.

On condition that the wafer is not a simple semiconductor wafer alone but a substrate having a glass plate stuck structure, in particular, the residual electrostatic attracting forces become larger than in handling of the wafer alone. Therefore, the handling of a substrate having the glass plate stuck structure makes it more difficult to release the substrate from the placement surface.

For an operation of releasing a wafer, a substrate or the like from the placement surface, a method has widely been employed in which a plurality of thrust-up pins are integrally elevated from the placement surface, for instance, after release of the electrostatic attraction by the ESC. When such a thrust-up operation for the substrate or the like by the thrust-up pins is performed in a state that great residual electrostatic attracting forces remain, however, damages such as fracture may be caused in the substrate and/or positional deviation may be caused by flap of the substrate or the like when the substrates is released from the placement surface.

The plasma processing apparatus of the fourth embodiment resolves such a problem by structural and functional properties employed in the ESC.

Figure 25:
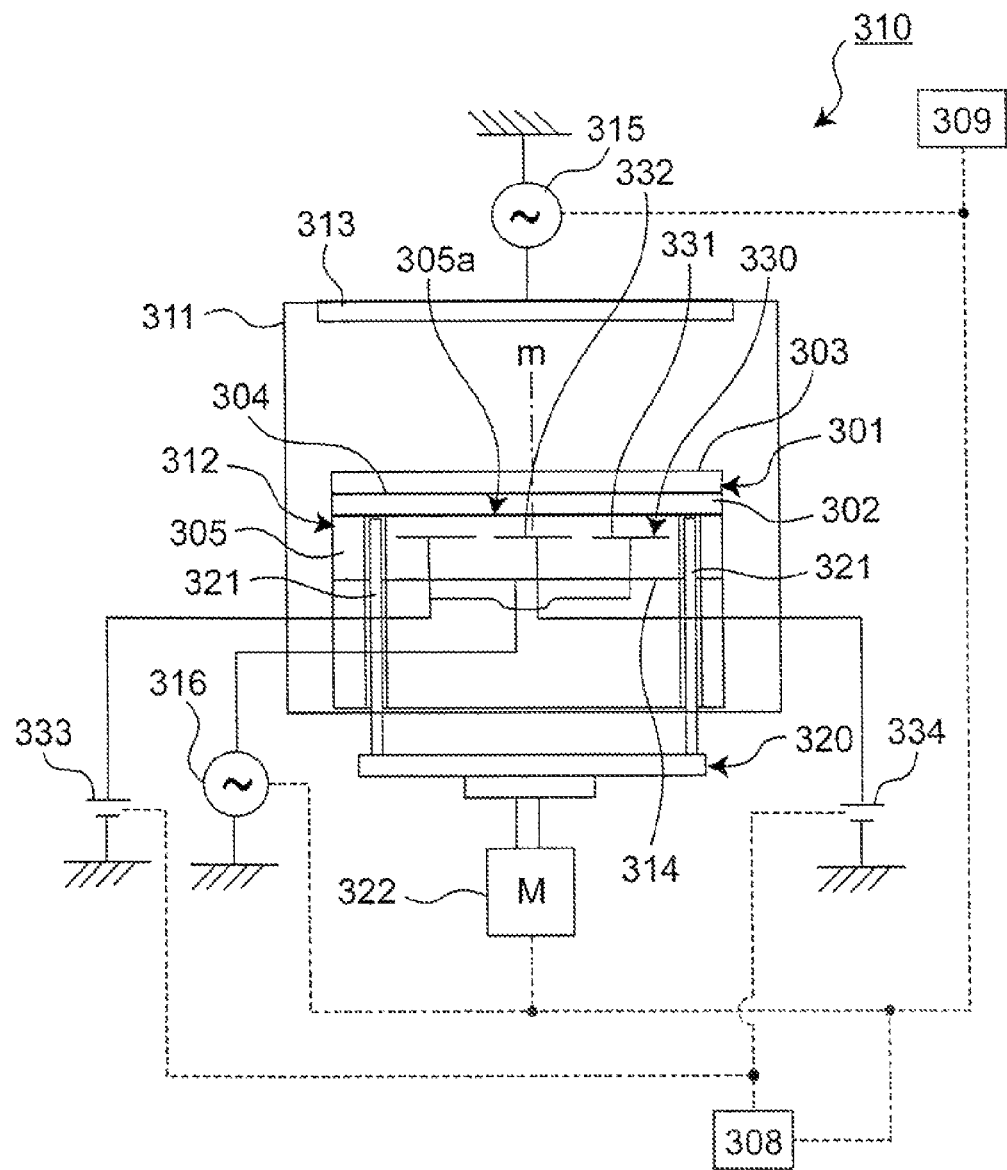
FIG. 25 is a schematic diagram of a plasma processing apparatus in accordance with a fourth embodiment of the invention.

FIG. 25 shows a schematic diagram illustrating main components of a plasma processing apparatus 310 in accordance with the fourth embodiment. In the plasma processing apparatus 310 of the embodiment, a glass-stuck substrate 301 (which will be referred to as "substrate 301") having a glass-stuck structure in which a wafer such as a silicon wafer 303 (semiconductor wafer formed of Si and compounds thereof), as an example of semiconductor wafer, is stuck on a glass plate 302 of insulating material through paste material 304 is handled as an object of plasma processing. Herein is used the silicon wafer 303 having a thickness, e.g., of 25 to 400 µm, especially of 50 to 200 µm. The glass plate 302 used therein has a thickness, e.g., of 300 to 500 µm, especially on the order of 400 µm. As the paste material 304, resist, tackiness agent or an adhesive sheet is used, for instance. Devices such as image sensors are manufactured by performance of specified plasma processing for the silicon wafer 303 of such a substrate 301. The substrate 301 has a shape like a disc with a diameter of 200 mm, for instance.

As shown in FIG. 25, the plasma processing apparatus 310 has a plasma processing vessel 311 in which the specified plasma processing is performed in an inner space (plasma processing space) therein, and a substrate holding device 312 that is provided in the plasma processing vessel 311, that has a placement platform 305 as an example of a placement member having a placement surface 305a on which a side of the substrate 301 having the glass plate 302 is placed, and that holds the substrate 301, placed on the placement surface 305a, by electrostatic attraction. As shown in FIG. 25, furthermore, an upper electrode 313 is provided in upper part of inside of the plasma processing vessel 311 and a lower electrode 314 is provided in the substrate holding device 312. A high-frequency power supply 315 for upper electrode is connected to the upper electrode 313 and a high-frequency power supply 316 for lower electrode is connected to the lower electrode 314. An ESC 330 as an example of electrostatic chuck for effecting the electrostatic attraction is embedded in the placement platform 305, that is, in the placement surface 305a of the substrate holding device 312, and a power supply for ESC (as an example of power supply for electrostatic chuck) is connected to the ESC 330. Details of the ESC 330 and the power supply for ESC will be described later.

In the plasma processing apparatus 310 having such a configuration, the substrate 301 is placed on the placement surface 305a of the substrate holding device 312 so as to be held by electrostatic attraction by the ESC 330 and, after that, inside of the plasma processing vessel 311 is supplied and filled with specified plasma processing gas while a pressure therein is kept at a specified value. Subsequently, a voltage is applied to the upper electrode 313 by the high-frequency power supply 315 for upper electrode and a voltage is applied to the lower electrode 314 by the high-frequency power supply 316 for lower electrode, so that plasma is produced and so that plasma processing is performed for the silicon wafer 303 of the substrate 301. Upon completion of the plasma processing, the application of the voltages by the high-frequency power supplies 315, 316 is stopped and the gas is exhausted from the inside of the plasma processing vessel 311, so that the plasma processing of the substrate 301 is completed. Simultaneously, the supply of the power to the ESC 330 by the power supply for ESC is stopped, so that the electrostatic attraction to the substrate 301 by the ESC 330 is cancelled.

Figure 26:
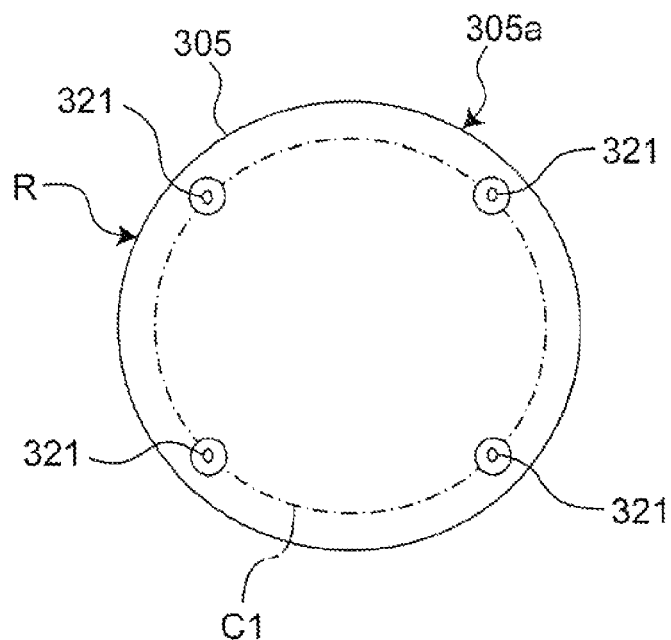
FIG. 26 is a schematic plan view of a placement surface of the plasma processing apparatus in accordance with the fourth embodiment.

Subsequently will be described a configuration in the plasma processing apparatus 310 that is provided for releasing the substrate 301, having undergone completion of the plasma processing, from the placement surface 305a against the residual electrostatic attracting forces existing between the placement surface 305a and the substrate 301. FIG. 26 shows a schematic plan view of the placement surface 305a of the substrate holding device 312.

As shown in FIGS. 25 and 26, the substrate holding device 312 has a thrust-up device 320 having a plurality of thrust-up pins 321 provided in a region in vicinity of periphery of a substrate placement region R on the placement surface 305a, and an up-and-down device 322 for integrally moving up and down the thrust-up pins 321 from the placement surface 305a so as to protrude or retract the pins from or into the placement surface 305a. As shown in FIG. 26, four thrust-up pins 321 are provided at uniform intervals, for instance, on a circumference of a concentric circle C1 that is a circle having a center on a center of the substrate placement region R of the placement surface 305a. The concentric circle C1 on which the thrust-up pins 321 are provided is positioned in a region that is in the substrate placement region R and that includes an edge part of the substrate 301 placed on the placement surface 305a and vicinity thereof, or a region that is positioned on periphery side of a half of a radius of the substrate 301 placed on the placement surface 305a.

Though the whole placement surface 305a forms the substrate placement region R for the substrate 301, as shown in FIG. 26, in the plasma processing apparatus 310 of the embodiment shown in FIG. 25, a part of the placement surface may be formed as the substrate placement region, alternatively, or the substrate placement region R may be formed so as to be larger than the placement surface 305a. The substrate placement region R smaller than the placement surface 305a improves uniformity of process characteristics (such as etching rate) in the periphery part of the substrate 301, and the electrode of the ESC 330 that is provided in the placement surface 305a and that is larger than the substrate placement region R may be exposed to the plasma and thus may have a shortened life. By contrast, the substrate placement region R larger than the placement surface 305a makes the electrode of the ESC 330 smaller than the periphery of the substrate 301 and thus prevents the problem of the expose to the plasma, whereas process characteristics in the periphery part of the substrate 301 may be made heterogenous under such a condition.

As shown in FIG. 25, the plasma processing apparatus 310 has a control device 309 for controlling an operation of moving up and down the thrust-up pins 321 by the up-and-down device 322, an operation of applying the voltage by the high-frequency power supply 315 for upper electrode, an operation of applying the voltage by the high-frequency power supply 316 for lower electrode, and an operation of applying a voltage to the ESC 330 by the power supply for ESC, while associating the operations with one another. The control device 309 is further capable of detecting a quantity of thrust-up (stroke) of the thrust-up pins 321 from the placement surface 305a, through the up-and-down device 322.

Figure 27:
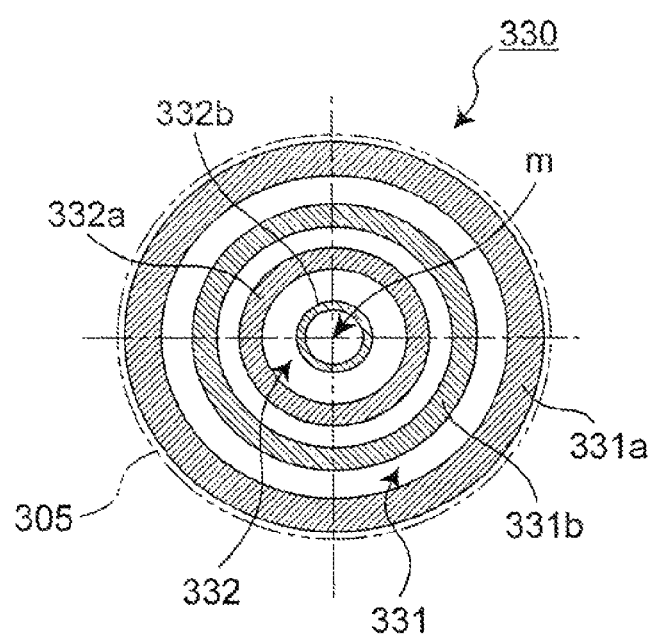
FIG. 27 is a schematic plan view of an ESC embedded in the placement surface of the plasma processing apparatus in accordance with the fourth embodiment.

Subsequently will be described a configuration of the ESC 330 that makes possible reducing the residual electrostatic attracting forces existing between the placement surface 305a and the substrate 301 while reliably holding the substrate 301 on the placement surface 305a by the electrostatic attracting forces in the plasma processing apparatus 310. FIG. 27 shows a schematic plan view of arrangement and configuration of electrodes of the ESC 330.

As shown in FIG. 27, the ESC 330 has a plurality of bipolar electrodes provided inside (below) the placement surface 305a of the placement platform 305. As the electrodes of the ESC 330, specifically, there are provided a first bipolar electrode 331 composed of a pair of a first positive part 331a to which a positive voltage is applied and a first negative part 331b to which a negative voltage is applied and a second bipolar electrode 332 composed of a pair of a second positive part 332a to which a positive voltage is applied and a second negative part 332b to which a negative voltage is applied. The first positive part 331a has a configuration having a strip-like electrode shaped like a ring and is provided in vicinity of the periphery of the placement surface 305a so that a center of the ring coincides with a center m of the placement surface 305a and/or the substrate placement region R. The first negative part 331b has a configuration having a strip-like electrode shaped like a ring, as is the case with the first positive part 331a, and is provided inside the first positive part 331a, at a specified distance from an inside edge of the first positive part 331a, so that a center of the ring coincides with the center m. The second positive part 332a having a configuration with a strip-like electrode shaped like a ring is provided inside the first negative part 331b, so as to have a center thereof coinciding with the center m, and so as to be positioned at a specified distance from an inside edge of the first negative part 331b. Inside the second positive part 332a, the second negative part 332b having a configuration with a strip-like electrode shaped like a ring or a circle is provided so as to have a center thereof coinciding with the center m, and so as to be positioned at a specified distance from an inside edge of the second positive part 332a. The strip-like electrodes (such as the first positive part 331a) are formed so as to have respective optimum given widths. Instead, however, all the strip-like electrodes may be formed so as to have the same width. Similarly, the specified distances between neighboring strip-like electrodes are set at respective optimum sizes. Instead of the first bipolar electrode 331 and the second bipolar electrode 332 that are shaped like rings, a plurality of electrodes each shaped like a partial arc strip may be formed with ring-like arrangement, for instance.

Figure 34:
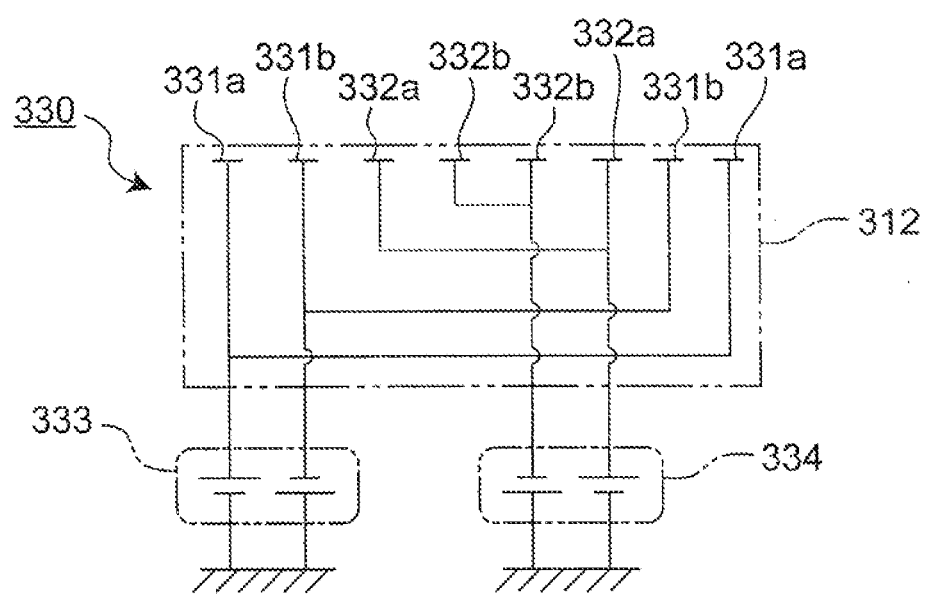
FIG. 34 is a schematic diagram illustrating a detailed configuration of the ESC in the plasma processing apparatus of FIG. 25.

FIG. 34 shows a schematic diagram illustrating, in detail, a configuration of the ESC 330 shown in FIG. 25. As shown in FIG. 34, a power supply 333 for first bipolar electrode is electrically connected to the first bipolar electrode 331 composed of the first positive part 331a and the first negative part 331b. Specifically, the power supply 333 for first bipolar electrode is connected so that the positive voltage can be applied to the first positive part 331a and so that the negative voltage can be applied to the first negative part 331b. Similarly, a power supply 334 for second bipolar electrode is electrically connected to the second bipolar electrode 332 composed of the second positive part 332a and the second negative part 332b. Specifically, the power supply 334 for second bipolar electrode is connected so that the positive voltage can be applied to the second positive part 332a and so that the negative voltage can be applied to the second negative part 332b. In the embodiment, the power supply 333 for first bipolar electrode and the power supply 334 for second bipolar electrode form an example of the power supply for ESC, i.e., a power supply for electrostatic attraction.

Figure 28:
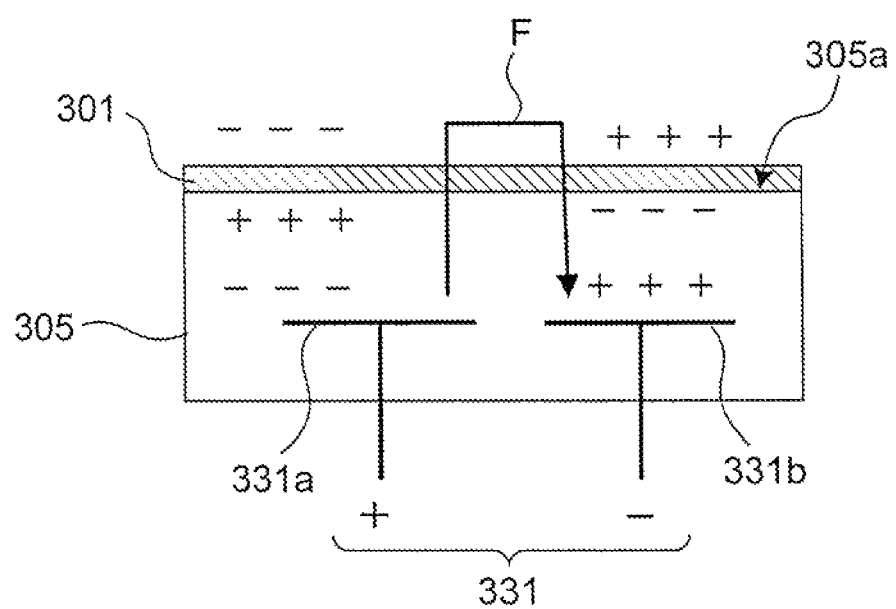
FIG. 28 is a schematic illustration of a principle of production of electrostatic attracting forces by the ESC of FIG. 27.

A principle of holding of the substrate 301 by the application of the voltages to the bipolar electrodes and the resultant production of the electrostatic attracting forces will be described with reference to a schematic diagram of FIG. 28. As shown in FIG. 28, the application of the positive voltage to the first positive part 331a and of the negative voltage to the first negative part 331b in the first bipolar electrode 331 causes dielectric polarization on front and back surfaces of the substrate 301 placed on the placement surface 305a. On the front surface of the substrate 301 that is an upper surface of the substrate 301 facing the placement surface 305a, consequently, the front surface of the substrate 301 facing the first positive part 331a is positively charged and the front surface of the substrate 301 facing the first negative part 331b is negatively charged, while the back surface of the substrate 301 that is opposite thereto is oppositely charged. Such occurrence of the dielectric polarization in the substrate 301 causes a Coulomb force F, which is referred to as a Johnson-Rahbeck force F, between the first positive part 331a and the first negative part 331b, and the substrate 301 is held with respect to the placement surface 305a by the Coulomb force. The application of the voltages to the second bipolar electrode 332 also produces a Johnson-Rahbeck force F, in the same manner, which holds the substrate 301 on the placement surface 305a.

As shown in FIG. 25, the plasma processing apparatus 310 has a voltage control device 308 for ESC for controlling magnitude and timing of the voltages applied from the power supply 333 for first bipolar electrode to the first bipolar electrode 331 and for controlling magnitude and timing of the voltages applied from the power supply 334 for second bipolar electrode to the second bipolar electrode 332. The voltage control device 308 is capable of controlling the magnitude and timing of the voltages applied by the power supply 333 for first bipolar electrode and the magnitude and timing of the voltages applied by the power supply 334 for second bipolar electrode so as to make the magnitude and timing different from each other. The voltage control device 308 is integrally controlled by the control device 309, as is the case with other component devices.

Figure 29:
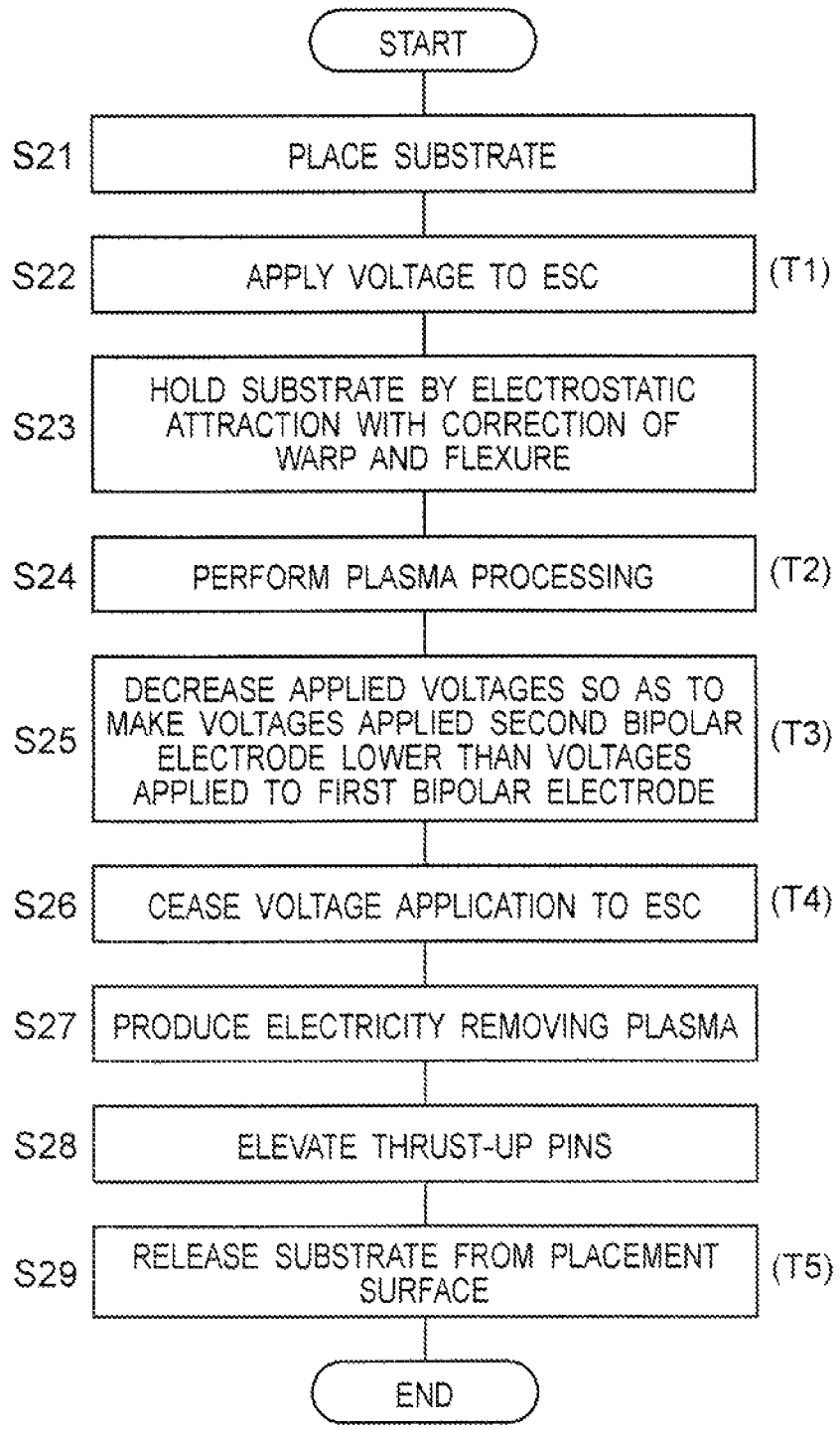
FIG. 29 is a flow chart of procedures of a plasma processing method in accordance with the fourth embodiment.

Subsequently will be described a method of performing the plasma processing for the substrate 301 placed on the placement surface 305a of the substrate holding device 312 and thereafter releasing the substrate 301 from the placement surface 305a in the plasma processing apparatus 310 having such a configuration. For description of that, FIG. 29 shows a flow chart of specific procedures and FIGS. 30(A) and 30(B) show graphs illustrating the magnitude of the applied voltages and the timing of the application for the first bipolar electrode 331 and the second bipolar electrode 332. FIG. 30(C) shows a graph illustrating timing of application of power to the upper electrode 313 and/or the lower electrode 314 for performance of the plasma processing, and FIGS. 30(D) and 30(E) show graphs illustrating changes in magnitude of the electrostatic attracting forces in a substrate periphery vicinity region and a substrate center vicinity region. Operations in the procedures that will be described below are performed on basis of control by the control device 309 over the component devices the plasma processing apparatus 310 includes.

In a step S21 of the flow chart of FIG. 29, the substrate 301 is carried into the plasma processing vessel 311 of the plasma processing apparatus 310 and is placed on the placement surface 305a. After that, the power supply 333 for first bipolar electrode and the power supply 334 for second bipolar electrode for the ESC 330 are controlled by the voltage control device 308 so that the voltages are applied to the first bipolar electrode 331 by the power supply 333 for first bipolar electrode and so that the voltages are applied to the second bipolar electrode 332 by the power supply 334 for second bipolar electrode (step S22).

Figure 30:
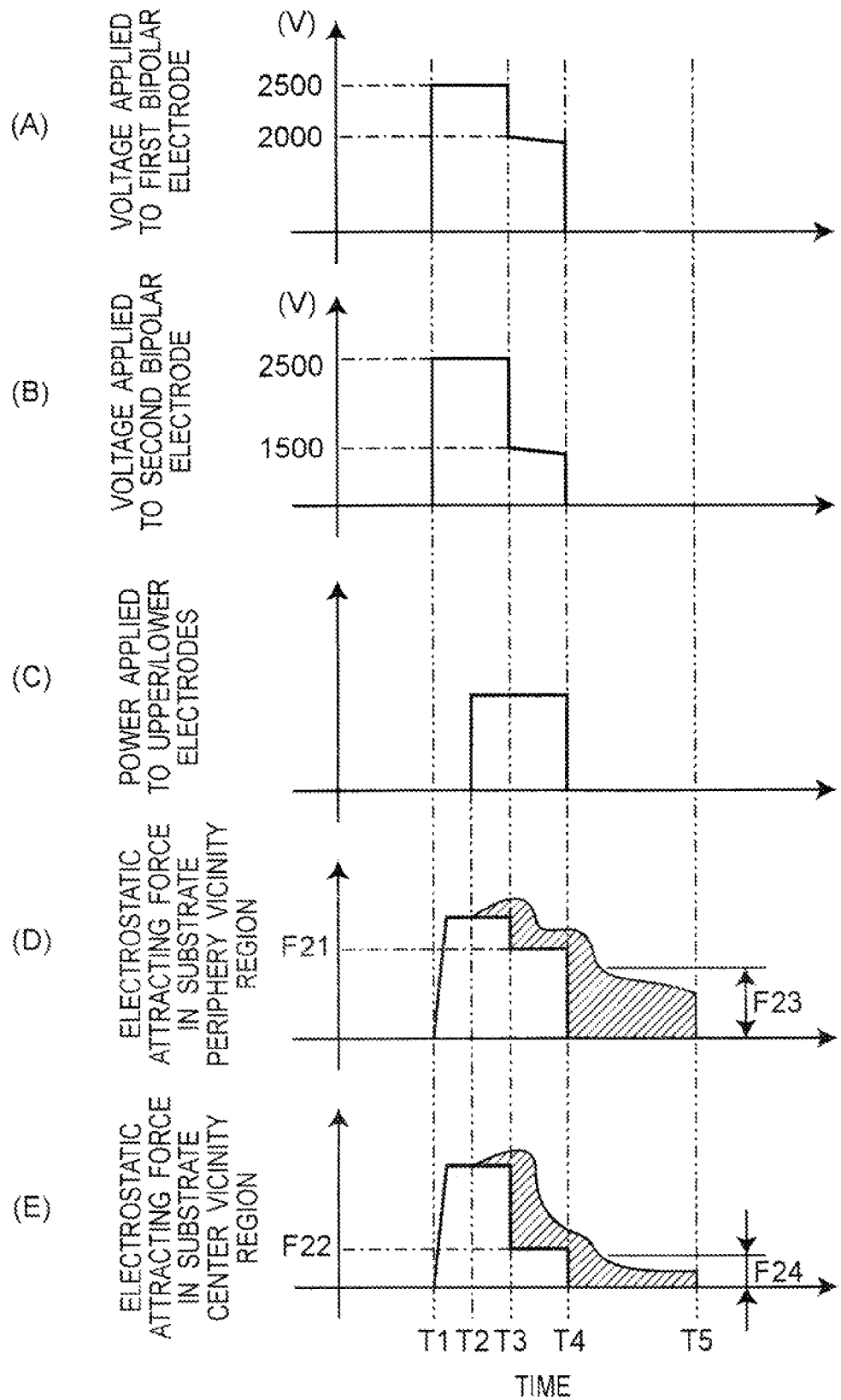
FIG. 30 are graphs illustrating voltages applied to the ESC in the plasma processing of the fourth embodiment.

As shown in the graphs of FIG. 30, specifically, the application of the voltages is commenced at time T1, the voltage of, e.g., 2500V (±2500V) applied to the first bipolar electrode 331 positioned on the periphery side of the placement surface 305a, the voltage of, e.g., 2500V (±2500V) applied to the second bipolar electrode 332 positioned on inner side of the placement surface 305a. The voltages of 2500V are applied as voltages comparatively greater than voltages that are continuously applied while the plasma processing which will be described later is performed. By the application of the voltages, electrostatic attracting forces are produced on the placement surface 305a, and the substrate 301 is held by electrostatic attraction on the placement surface 305a, with correction by the electrostatic attracting forces of warp, flexure and/or the like on condition that those are produced in the substrate 301 simply placed thereon, for instance (step S23).

As shown in the graph of FIG. 30(C), subsequently, the application of the voltages to the upper electrode 313 and the lower electrode 314 is commenced at time T2, and the plasma processing for the substrate 301 held on the placement surface 305a is performed (step S24).

In the embodiment in which the substrate 301 that is the glass-stuck substrate having the wafer stuck on the glass plate 302 is used, the residual electrostatic attracting forces strongly remain as electrostatic attracting forces after completion of the plasma processing. On condition that the release of the substrate 301 from the placement surface 305a is performed by the thrust-up against the periphery vicinity region of the substrate 301 by the integral elevation of the plurality of thrust-up pins in such a state in which the residual electrostatic attracting forces strongly remain, it is difficult to release the substrate 301 from the placement surface 305a because greater residual electrostatic attracting forces remain between the substrate 301 and the placement surface 305a in the center vicinity region of the substrate 301 in comparison with the periphery vicinity region thereof where the release of the substrate 301 from the placement surface 305a by the plurality of thrust-up pins has just been started. On the other hand, decrease in the electrostatic attracting forces on the whole substrate 301 by the ESC 330 leads to increase in a quantity of leakage of He gas from the periphery of the substrate 301 and deterioration in quality of the plasma processing for the substrate, particularly on condition that the back surface of the substrate 301 is cooled by He gas from the side of the placement surface 305a. Therefore, it is preferable to relatively decrease, the residual electrostatic attracting forces in the center vicinity region where releasability of the substrate 301 from the placement surface 305a is lower than in the periphery vicinity region of the substrate, for improvement in the releasability. That is; the substrate 301 is preferably held by electrostatic attraction on the placement surface 305a with the electrostatic attracting forces in the center vicinity region of the substrate 301 set to be relatively lower than those given to the outer periphery vicinity region.

In the embodiment, from this viewpoint, the power supplies 333, 334 for bipolar electrodes for the ESC 330 are controlled by the voltage control device 308, with coming of time T3 from the time T1, so as to decrease the applied voltages (step S25). Specifically, the voltages applied from the power supply 333 for first bipolar electrode to the first bipolar electrode 331 are decreased from 2500V to 2000V, and the voltages applied from the power supply 334 for second bipolar electrode to the second bipolar electrode 332 are decreased from 2500V to 1500V. That is, the applied voltages are controlled so that the voltages applied to the second bipolar electrode 332 placed in the center vicinity region of the placement surface 305a and/or the substrate placement region R become lower than the voltages applied to the first bipolar electrode 331 placed in the periphery side of the placement surface 305a and/or the substrate placement region R. As a result, an electrostatic attracting force F22 exerted by the ESC 330 on the substrate 301 in the center vicinity region of the placement surface 305a and/or the substrate placement region R is made lower than an electrostatic attracting force F21 in the periphery side of the placement surface 305a and/or the substrate placement region R. Herein, "periphery vicinity region" of the substrate 301 is defined as a region that includes at least the substrate placement region R for the substrate 301 on the placement surface 305a and that is positioned in the edge part of the substrate 301 placed on the placement surface 305a and/or in vicinity thereof, or that is positioned on the periphery side of a half of the radius of the substrate 301 placed on the placement surface 305a, and "center vicinity region" of the substrate 301 is defined as a region that is positioned on the center side in the substrate 301 with respect to the periphery vicinity region of the substrate 301.

Thus the electrostatic attracting forces of the ESC 330 are produced with different magnitude in the center vicinity region and in the periphery vicinity region, so that relative attracting forces, including the remaining attracting forces, received by the substrate 301 from the placement surface 305a in the plasma processing can be decreased so as to differ in outer periphery vicinity region and in the center vicinity region in the substrate 301. This relatively reduces the remaining attracting forces in vicinity of the center region that the substrate 301 receives from the placement surface 305a before being released from the placement surface 305a on which the substrate 301 having undergone the plasma processing is placed. Herein the substrate 301 is held by electrostatic attraction on the placement surface 305a with the electrostatic attracting forces in the center vicinity region of the substrate 301 set to be at least relatively lower than those given to the periphery vicinity region in the plasma processing, whereas the electrostatic attracting forces in the center vicinity region of the substrate 301 may be set or switched to be relatively lower than those given to the periphery vicinity region, even before the plasma processing, unless problems due to warp in the substrate 301, temperature or the like are caused concerning quality of the plasma processing. The detailed procedures for the plasma processing have been described above and description thereof is therefore omitted at present.

Upon completion of the plasma processing for the substrate 301 at time T4 in the graphs of FIG. 30, the application of the voltages from the power supplies 333, 334 for bipolar electrode to the bipolar electrodes 331, 332 of the ESC 330 is ceased (step S26). Even with the cease of the voltage application, at the time T4 in the graphs of FIGS. 30(D), 30(E), a residual electrostatic attracting force F24 in the center vicinity region of the substrate 301 is lower than a residual attracting force F23 in the periphery vicinity region, as the residual attracting forces existing between the substrate 301 and the placement surface 305a.

In the inner space of the plasma processing vessel 311, electricity removing plasma is thereafter produced that is comparatively weak plasma for removing the residual electrostatic attracting forces F23, F24 existing between the substrate 301 and the placement surface 305a (step S27). For instance, the electricity removing plasma P is produced by application of a voltage to the upper electrode 313 and/or the lower electrode 314 in a condition in which the inner space of the plasma processing vessel 311 has been supplied with inert gas (such as Ar, $N_2$ and $O_2$) that prevents progression of the plasma processing (such as etching) on the silicon wafer 303. The substrate 301, however, is then held on the placement surface 312a by the residual electrostatic attracting forces and thus the electricity removing plasma P cannot enter between the substrate 301 and the placement surface 312a in such a condition. In the embodiment, the upper electrode 313, the high-frequency power supply 315 for upper electrode, the lower electrode 314, the high-frequency power supply 316 for lower electrode, and a gas supplying device not shown form an example of an electricity removing plasma producing unit.

Figure 31:
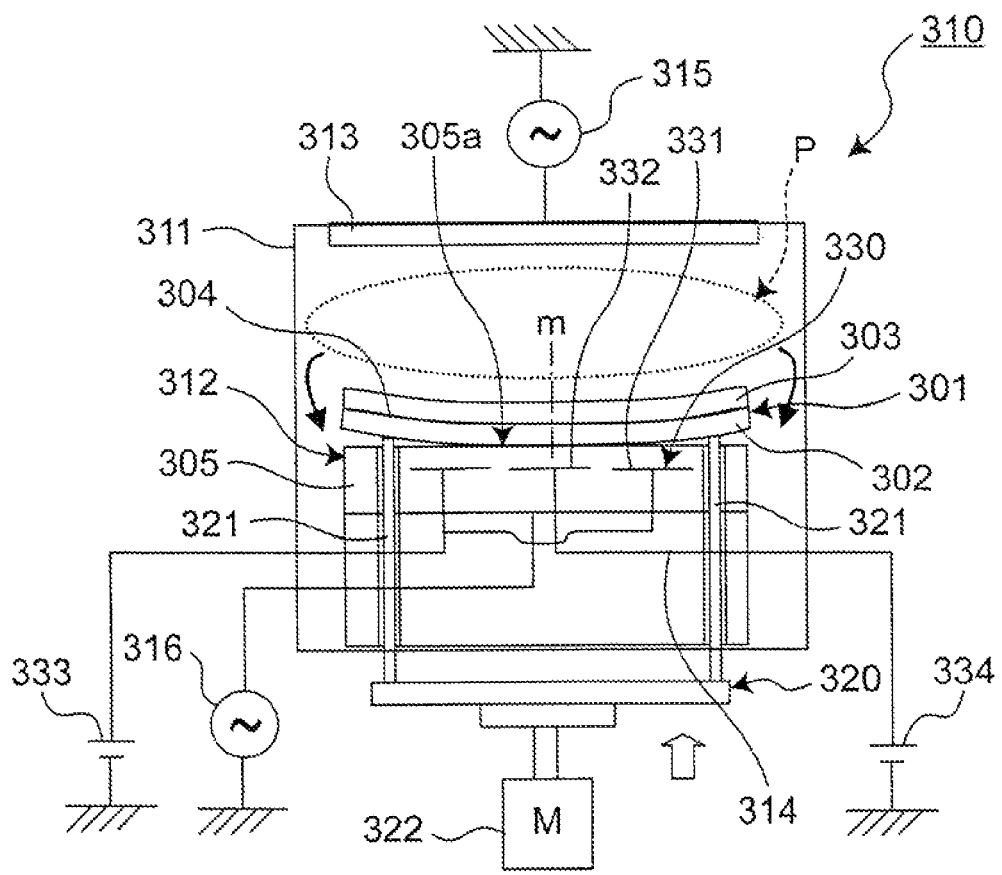
FIG. 31 is a schematic diagram of the plasma processing apparatus of the fourth embodiment in which a thrust-up operation is being performed.

As shown in a schematic diagram of the plasma processing apparatus 310 of FIG. 31, subsequently, the four thrust-up pins 321 are integrally elevated by the up-and-down device 322 of the thrust-up device 320 so as to be protruded upward from the placement surface 305a (step S28). As shown in FIG. 31, consequently, the periphery part of the substrate 301 is thrust up by the thrust-up pins 321 so that the substrate 301 is partially released in the periphery vicinity region in the substrate placement region R on the placement surface 305a. That is, the edge part of the substrate 301 is released from the placement surface 305a.

Thus the edge part of the substrate 301 is released from the placement surface 305a so that the electricity removing plasma P produced in the inner space of the plasma processing vessel 311 can enter between the substrate 301 and the placement surface 305a from the periphery side of the substrate 301. In a time segment T4-T5 in the graphs of FIG. 30, consequently, the residual electrostatic attracting forces existing between the substrate 301 and the placement surface 305a are reduced on the surfaces brought into contact with the electricity removing plasma P, so that spread of an area of the substrate 301 released (exfoliated) from the placement surface 305a is promoted from outside toward inside of the substrate 301.

With integral re-elevation by the plurality of thrust-up pins 321 or the like, for instance, the electricity removing plasma P thereafter reaches the center vicinity region between the substrate 301 and the placement surface 305a where the remaining attracting forces have relatively been reduced in advance by the second bipolar electrode of the ESC 330, and the residual electrostatic attracting forces in vicinity of the center are removed, so that the substrate 301 is released from the placement surface 305a (step S29, time T5).

In the plasma processing apparatus 310 of the embodiment, the ESC 330 embedded in the placement surface 305a of the placement platform 305 of the substrate holding device 312 is composed of the plurality of bipolar electrodes 331, 332 that are concentrically provided and that are shaped annularly and like strips, so that the electrostatic attracting forces without bias relative to the center of the substrate 301 can be produced and so that the substrate can stably be held by electrostatic attraction.

Besides, the electrostatic attracting forces produced in the center vicinity region of the substrate 301 can be made lower than those produced in the periphery vicinity region of the substrate 301 by the control over the magnitude of the applied voltages such that the voltages applied from the power supply 334 for second bipolar electrode to the second bipolar electrode 332 placed on the center side of the concentric circles are made lower than the voltages applied from the power supply 333 for first bipolar electrode to the first bipolar electrode 331 placed on the outer periphery side thereof on the placement surface 305a. The substrate 301 placed on the placement surface 305a is thrust up by the thrust-up pins 321 in the periphery vicinity region and thus can locally be released with ease in comparison from the placement surface 305a in the periphery vicinity region of the substrate 301. In the substrate 301 released locally in the periphery vicinity region, additionally, the electricity removing plasma P can be introduced into between the substrate 301 and the placement surface 305a so as to be in contact therewith, and thus the released area of the substrate 301 can be spread from the outer edge toward the center vicinity region of the substrate 301. In particular, the electrostatic attracting forces in the center vicinity region of the substrate 301 are controlled so as to be comparatively small as in the embodiment, and thus the releasing effect of the introduction of the electricity removing plasma P can effectively be obtained. Concomitantly, the area in which the substrate 301 is released by the thrust-up operation by the thrust-up pins 321 in the periphery vicinity region of the substrate 301 can be spread toward the center vicinity region of the substrate 301.

Therefore, the substrate 301 with the glass-stuck structure characterized by the residual electrostatic attracting forces higher than those of a conventional silicon wafer can stably be released from the placement surface 305a without occurrence of damages, positional deviation and the like.

The substrate 301, having the glass stuck structure, may have warp, flexure and/or the like. The warp, flexure and/or the like in the substrate 301 can be corrected and removed by comparatively great electrostatic attracting forces produced by the application of comparatively high voltages (high voltages in comparison with the voltages applied in the plasma processing) to the bipolar electrodes 331, 332 when the electrostatic attracting forces are imparted to the substrate 301 placed on the placement surface 305a. By the decrease in the applied voltages to an extent just required for the holding of the substrate 301 and the individual control over the electrostatic attracting forces imparted in the center vicinity region and in the periphery vicinity region of the substrate 301 after the correction of the warp, flexure and/or the like, the decrease in the residual electrostatic attracting forces and stable release of the substrate from the placement surface can be attained while reliable holding (holding in a state in which the warp, flexure and/or the like have been corrected) of the substrate 301 on the placement surface 305a is ensured.

Figure 32:
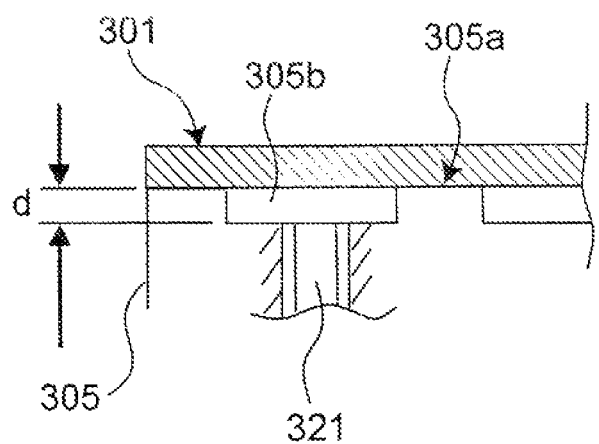
FIG. 32 is a schematic enlarged fragmentary view of an end portion of a placement platform of a substrate holding device in the plasma processing apparatus in accordance with the fourth embodiment.

The plasma processing apparatus 310 is configured so that He gas is supplied between the placement surface 305a and the substrate 301 for purpose of cooling the substrate 301 and the placement surface 305a in the plasma processing. For that purpose, recesses 305b for allowing flow or accumulation of the He gas are formed on the placement surface 305a. In terms of a relation with the recesses 305b formed on the placement surface 305a, the thrust-up pins 321 are preferably provided in depressions of the recesses 305b in plan view, as show in FIG. 32. During the cooling of the substrate 301 by the He gas in the plasma processing, heights of extremities of the thrust-up pins 321 are preferably not higher than bottoms of the recesses 305b so as to facilitate flow of the He gas in the recesses 305b. The employment of such arrangement of the thrust-up pins reduces a quantity of leakage of the He gas. The recesses 305b are formed with a depth d of 100 μm, for instance.

For the use of He gas in the plasma processing, the reliable holding is preferably attained by the electrostatic attracting forces so as to prevent leakage of the He gas (or so as to reduce a quantity of leakage) from between the edge part of the substrate 301 and the placement surface 305a. In the fourth embodiment, therefore, the first positive part 331a of the first bipolar electrode 331 is provided on outermost periphery of the placement surface 305a, as shown in FIG. 27. Negative charge of the substrate 301 in the plasma processing causes potential differences between the substrate 301 and the ESC electrode to be greater in the positive parts 331a and causes the electrostatic attracting forces produced in the positive parts to be greater than those produced in the negative parts, and thus the placement of the first positive part 331a on the periphery side of the first negative part 331b in the first bipolar electrode 331 results in more reliable holding of the periphery of the substrate 301.

Figure 35:
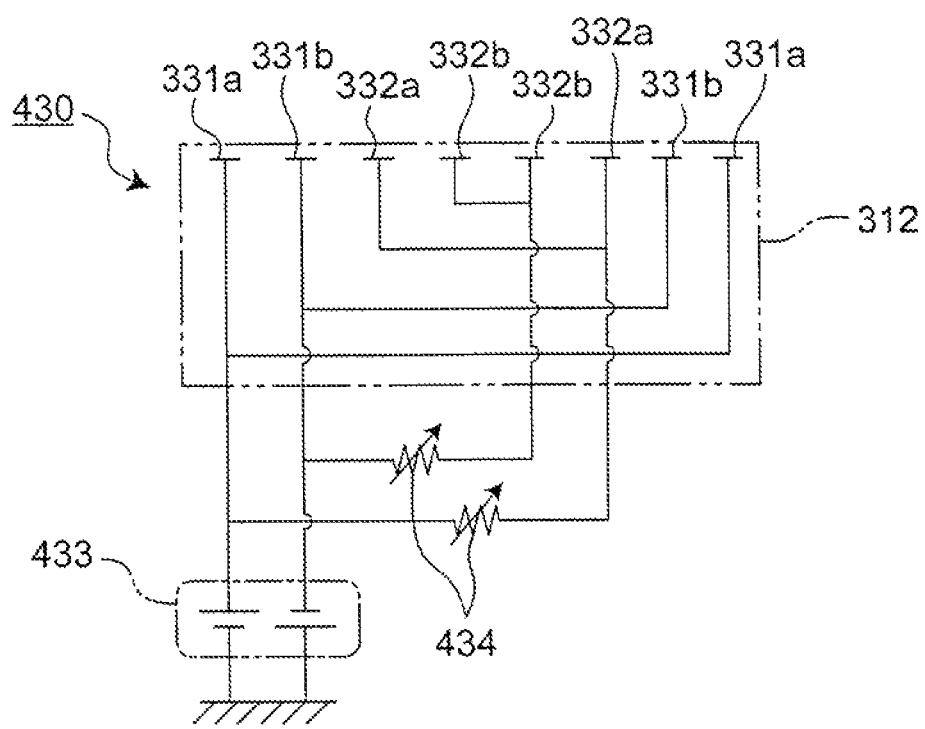
FIG. 35 is a schematic diagram illustrating a configuration of an ESC in accordance with a modification of the fourth embodiment.

For the fourth embodiment, an example has been described that includes the application of the voltages from the power supply 333 for first bipolar electrode to the first bipolar electrode 331 placed on the periphery side of the placement surface 305a, the application of the voltages from the power supply 334 for second bipolar electrode to the second bipolar electrode 332 placed on the center side, and the control over the voltages applied to the bipolar electrodes 331, 332, whereas the embodiment is not limited to such an example. For instance, there may alternatively be employed a configuration in which one common power supply for bipolar electrode is used to make a voltage from the common power supply branch and to apply the voltages to the bipolar electrodes and in which the applied voltages are varied by variation in a ratio of the branch. As in an ESC 430 shown in a schematic diagram of FIG. 35, specifically, there may be employed a configuration in which one power supply 433 for bipolar electrode is used with a circuit from the power supply 433 branching into the first positive part 331a and the first negative part 331b of the first bipolar electrode 331 and into the second positive part 332a and the second negative part 332b of the second bipolar electrode 332 and in which a branching ratio adjuster 434 by which the voltages applied to the second bipolar electrode 332 can be controlled so as to differ from the voltages applied to the first bipolar electrode 331 is provided in middle of the circuit to the second bipolar electrode 332. The use of the common power supply 433 reduces a cost of the apparatus.

Control means for making different the magnitude of the electrostatic attracting forces produced in the periphery vicinity region and the center vicinity region of the placement surface 305a is not limited to means for making different the magnitude of the voltages applied to the first bipolar electrode 331 and the second bipolar electrode 332. Instead of such means, the electrostatic attracting forces on the center side can be made smaller than those on the periphery side by an increase in an area of the first bipolar electrode placed on the periphery side of the placement surface 305a and a decrease in an area of the second bipolar electrode placed on the center side, for instance. The magnitude of the electrostatic attracting forces can be made different by setting of a difference in distance from the bipolar electrodes to the placement surface 305a. Specifically, the electrostatic attracting forces on the center side can be made smaller than those on the periphery side by setting of the distance from the second bipolar electrode to the placement surface 305 larger than the distance from the first bipolar electrode to the placement surface 305a. Among those means, the means of varying the magnitude of the applied voltages has an advantage in that the electrostatic attracting forces on the inner side and the outer side can be varied so as to have desired magnitude.

Though the example in which the plurality of thrust-up pins 321 that are concentrically provided are integrally elevated and thrust up against the periphery vicinity region of the substrate 301 has been described for the fourth embodiment, various methods can be employed as such a method of controlling the operations of the thrust-up pins 321. For example, load cells for detecting loads caused by the thrust-up against the substrate 301 by the thrust-up pins 321 may be provided in the thrust-up device 320, and thrust-up strokes, number of times of operations and/or the like of the thrust-up pins 321 can be controlled on basis of magnitude of the loads detected by the load cells. Besides, release of the substrate 301 from the placement surface 305a can be detected on basis of the loads detected by the load cells. Arrangement of the thrust-up pins is not limited to that on one concentric circle but arrangement with distribution on a plurality of concentric circles can be employed.

Though the example in which the bipolar electrodes are provided on the concentric circles and shaped like rings or circles has been described for the fourth embodiment on premise of the circular substrate, other various shapes can be employed as the shape of the bipolar electrodes. For instance, polygonal shapes such as triangular or quadrilateral shapes may be employed as the shape of the bipolar electrodes unless problems are caused about the holding and release of the substrate on and from the placement surface and quality of the plasma processing.

It is to be noted that, by properly combining the arbitrary embodiments of the aforementioned various embodiments, the effects possessed by them can be produced. For example, the structure of the ESC of the fourth embodiment may combine with the structures of the plasma processing apparatus of the first through third embodiments.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The disclosures of specifications, drawings, and claims of Japanese Patent Application No. 2008-142338 filed on May 30, 2008, Japanese Patent Application No. 2008-142341 filed on May 30, 2008, Japanese Patent Application No. 2008-207594 filed on Aug. 12, 2008, and Japanese Patent Application No. 2009-058375 filed on Mar. 11, 2009 are incorporated herein by reference in its entirety.

The invention claimed is:

1. A plasma processing method for performing plasma processing for a substrate, the method comprising:
 placing the substrate on a placement surface of a substrate holding device and holding the substrate on the placement surface by electrostatic attraction, the substrate holding device including a plurality of first thrust-up pins disposed in an outer region of a substrate placement region of the placement surface and a plurality of second thrust-up pins disposed in an inner region of the substrate placement region of the placement surface;
 performing the plasma processing for the substrate held by the electrostatic attraction;
 ceasing the electrostatic attraction after completion of the plasma processing;
 after said ceasing the electrostatic attraction, elevating the plurality of first thrust-up pins from the placement surface so as to release the substrate from the outer region in the substrate placement region of the placement surface;
 after said elevating the plurality of first thrust-up pins, elevating the plurality of second thrust-up pins so as to release the substrate from the inner region in the substrate placement region of the placement surface;
 wherein one of said elevating the plurality of first thrust-up pins or said elevating the plurality of second thrust-up pins includes a stepped elevating operation, the stepped elevating operation including:
  detecting a thrust-up force while the first thrust-up pins or the second thrust-up pins are being elevated;
  ceasing the elevation of the first thrust-up pins or the second thrust-up pins such that the thrust-up force being detected does not exceed a limit load;
  after said ceasing the elevation, elevating the first thrust-up pins or the second thrust-up pins on a condition that the thrust-up force being detected has fallen below a detection threshold;
  detecting whether release of the substrate is complete; and
  continuing the stepped elevating operation if the release of the substrate is not complete.

2. The method of claim 1, wherein said detecting whether the release of the substrate is complete is performed by determining whether the thrust-up force being detected corresponds to a weight of the substrate.

3. The method of claim 1, wherein said detecting whether the release of the substrate is complete is performed by determining whether the thrust-up force being detected is larger than a release threshold.

4. The method of claim 1, wherein said detecting whether the release of the substrate is complete is performed by determining whether a stroke of the first thrust-up pins and the second thrust-up pins has reached a specified stroke.

5. A plasma processing method for performing plasma processing for a substrate, the method comprising:
 placing the substrate on a placement surface of a substrate holding device and holding the substrate on the placement surface by electrostatic attraction, the substrate holding device including a plurality of first thrust-up pins and a plurality of second thrust-up pins;
 performing the plasma processing for the substrate held by the electrostatic attraction;
 ceasing the electrostatic attraction after completion of the plasma processing;
 after said ceasing the electrostatic attraction, elevating the plurality of first thrust-up pins from the placement surface so as to release the substrate from the outer region in the substrate placement region of the placement surface;
 detecting a thrust-up force of the first thrust-up pins while the first thrust-up pins are being elevated;
 ceasing the elevation of the first thrust-up pins such that the thrust-up force being detected does not exceed a limit load;
 after said ceasing the elevation, performing a second elevating operation after the thrust-up force being detected has fallen below a detection threshold, the second elevating operation including elevating the second thrust-up pins or both the first thrust-up pins and the second thrust-up pins;
 detecting whether release of the substrate is complete; and
 performing a third elevating operation if the release of the substrate is not complete, the third elevating operation including elevating the first thrust-up pins.

6. The method of claim 5, further comprising determining whether the thrust-up force before said elevating operation is too close to the limit load,
 wherein said second elevating operation includes elevating only the second thrust-up pins if the thrust-up force before said elevating operation is too close to the limit load, and
 wherein said second elevating operation includes elevating both the first thrust-up pins and the second thrust-up pins if the thrust-up force before said elevating operation is not too close to the limit load.

7. The method of claim 6, wherein said detecting whether the release of the substrate is complete is performed by determining whether the thrust-up force being detected corresponds to a weight of the substrate.

8. The method of claim 6, wherein said detecting whether the release of the substrate is complete is performed by determining whether the thrust-up force being detected is larger than a release threshold.

9. The method of claim 6, wherein said detecting whether the release of the substrate is complete is performed by determining whether a stroke of the first thrust-up pins and the second thrust-up pins has reached a specified stroke.

10. The method of claim 5, wherein said detecting whether the release of the substrate is complete is performed by determining whether the thrust-up force being detected corresponds to a weight of the substrate.

11. The method of claim 5, wherein said detecting whether the release of the substrate is complete is performed by determining whether the thrust-up force being detected is larger than a release threshold.

12. The method of claim 5, wherein said detecting whether the release of the substrate is complete is performed by determining whether a stroke of the first thrust-up pins and the second thrust-up pins has reached a specified stroke.

13. The method of claim 5, wherein the plurality of first thrust-up pins is disposed radially outwardly of the plurality of second thrust-up pins on the placement surface of the substrate holding device such that elevating the first thrust-up pins lifts a periphery of the substrate and elevating the second thrust-up pins lifts a portion of the substrate inward of the periphery.

14. The method of claim 13, wherein said detecting whether the release of the substrate is complete is performed by determining whether the thrust-up force being detected corresponds to a weight of the substrate.

15. The method of claim 13, wherein said detecting whether the release of the substrate is complete is performed by determining whether the thrust-up force being detected is larger than a release threshold.

16. The method of claim 13, wherein said detecting whether the release of the substrate is complete is performed by determining whether a stroke of the first thrust-up pins and the second thrust-up pins has reached a specified stroke.

\* \* \* \* \*